United States Patent
Onozawa et al.

(10) Patent No.: US 9,461,140 B2
(45) Date of Patent: Oct. 4, 2016

(54) SEMICONDUCTOR DEVICE MANUFACTURING METHOD INCLUDING A COUNTER LAYER FOR POWER CONVERSION

(71) Applicant: FUJI ELECTRIC CO., LTD., Kawasaki-shi (JP)

(72) Inventors: Yuichi Onozawa, Matsumoto (JP); Takashi Shiigi, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/736,532

(22) Filed: Jun. 11, 2015

(65) Prior Publication Data

US 2015/0333146 A1    Nov. 19, 2015

Related U.S. Application Data

(62) Division of application No. 13/703,797, filed as application No. PCT/JP2012/056775 on Mar. 15, 2012, now Pat. No. 9,082,812.

(30) Foreign Application Priority Data

Mar. 16, 2011 (JP) ................................. 2011-057456

(51) Int. Cl.
*H01L 21/332* (2006.01)
*H01L 29/66* (2006.01)
(Continued)

(52) U.S. Cl.
CPC ....... *H01L 29/66333* (2013.01); *H01L 21/266* (2013.01); *H01L 29/1095* (2013.01);
(Continued)

(58) Field of Classification Search
USPC .................................................. 438/133–138
See application file for complete search history.

(56) References Cited

U.S. PATENT DOCUMENTS

| 5,321,281 | A |   | 6/1994 | Yamaguchi et al. |
| 5,879,967 | A | * | 3/1999 | Kim ................. H01L 29/66333 |
|           |   |   |        | 257/E21.383 |

(Continued)

FOREIGN PATENT DOCUMENTS

| JP | 06-013620 A | 1/1994 |
| JP | 2001-135817 A | 5/2001 |

(Continued)

OTHER PUBLICATIONS

Non-Final Office Action issued in U.S. Appl. No. 13/703,797, dated Dec. 19, 2013.

(Continued)

*Primary Examiner* — Thanh T Nguyen
(74) *Attorney, Agent, or Firm* — Rossi, Kimms & McDowell LLP

(57) ABSTRACT

A p-type base layer is selectively formed on a surface of an n-type drift layer; an n-type source layer is selectively formed on a surface of the p-type base layer; and a p-type contact layer is formed to be in contact with the selectively-formed n-type source layer. A p-type counter layer is formed to be in contact with the n-type source layer, so as to overlap the p-type contact layer, so as to be separated from an interface where the p-type base layer and the gate oxide film are in contact with each other, and to be shallower than the p-type base layer. Accordingly, switching destruction caused by process defects in an insulated gate semiconductor device is reduced.

7 Claims, 31 Drawing Sheets

(51) Int. Cl.
*H01L 21/266* (2006.01)
*H01L 29/36* (2006.01)
*H01L 29/739* (2006.01)
*H01L 29/78* (2006.01)
*H01L 29/10* (2006.01)
*H01L 27/06* (2006.01)
*H01L 29/06* (2006.01)
*H01L 29/08* (2006.01)

(52) U.S. Cl.
CPC ......... *H01L29/36* (2013.01); *H01L 29/66712* (2013.01); *H01L 29/7395* (2013.01); *H01L 29/7397* (2013.01); *H01L 29/7802* (2013.01); *H01L 27/0664* (2013.01); *H01L 29/0696* (2013.01); *H01L 29/0847* (2013.01); *H01L 29/0869* (2013.01); *H01L 29/66325* (2013.01); *H01L 2924/13055* (2013.01)

(56) References Cited

U.S. PATENT DOCUMENTS

| | | | |
|---|---|---|---|
| 5,923,065 | A | 7/1999 | So et al. |
| 6,031,265 | A | 2/2000 | Hshieh |
| 2001/0054738 | A1 | 12/2001 | Momota et al. |
| 2002/0030224 | A1 | 3/2002 | Hshieh et al. |
| 2003/0096480 | A1 | 5/2003 | Hshieh et al. |
| 2007/0138550 | A1 | 6/2007 | Ninomiya et al. |
| 2007/0158686 | A1 | 7/2007 | Rahimo |
| 2009/0179260 | A1 | 7/2009 | Kobayashi |
| 2009/0179273 | A1 | 7/2009 | Komachi |

FOREIGN PATENT DOCUMENTS

| | | | |
|---|---|---|---|
| JP | 2001-308328 | A | 11/2001 |
| JP | 2005536868 | A | 12/2005 |
| JP | 2007-511913 | A | 5/2007 |
| JP | 2007-173379 | A | 7/2007 |
| JP | 2009-170598 | A | 7/2009 |
| JP | 2009170629 | A | 7/2009 |
| JP | 2009-277839 | A | 11/2009 |
| JP | 2010-050307 | A | 3/2010 |
| JP | 2010056432 | A | 3/2010 |

OTHER PUBLICATIONS

Final Office Action issued in U.S. Appl. No. 13/703,797, dated Sep. 25, 2014.

Notice of Allowance issued in U.S. Appl. No. 13/703,797, dated Mar. 5, 2015.

Japanese Office Action issued in counterpart application No. JP2014-216889, dated Dec. 8, 2015 English translation provided.

\* cited by examiner

| 1 | · · · | n-type DRIFT LAYER | 9 | · · · | INTERLAYER INSULATING FILM |
| 2 | · · · | n-type FIELD STOP LAYER | 10 | · · · | GATE OXIDE FILM |
| 3 | · · · | p-type COLLECTOR LAYER | 11 | · · · | POLYSILICON ELECTRODE |
| 4 | · · · | p-type BASE LAYER | 12 | · · · | EMITTER ELECTRODE |
| 5 | · · · | n-type SOURCE LAYER | 13 | · · · | COLLECTOR ELECTRODE |
| 6 | · · · | p-type CONTACT LAYER | | | |
| 7 | · · · | p-type COUNTER LAYER | | | |

FIG. 24 (A)
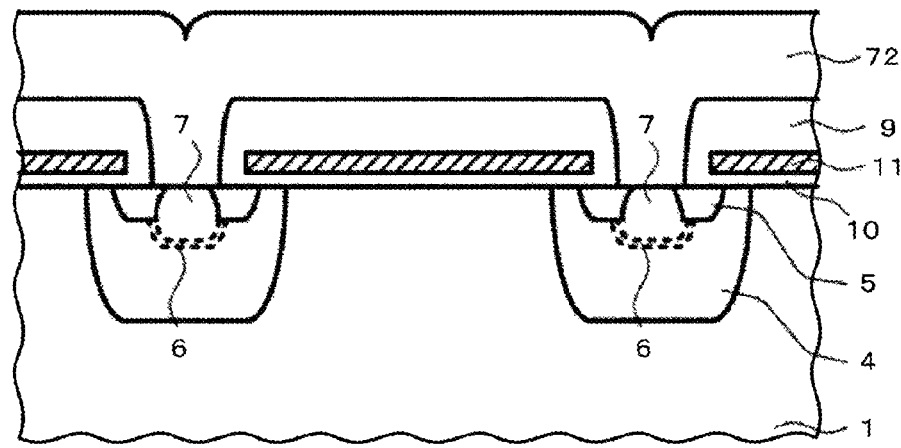
FIG. 24 (B)
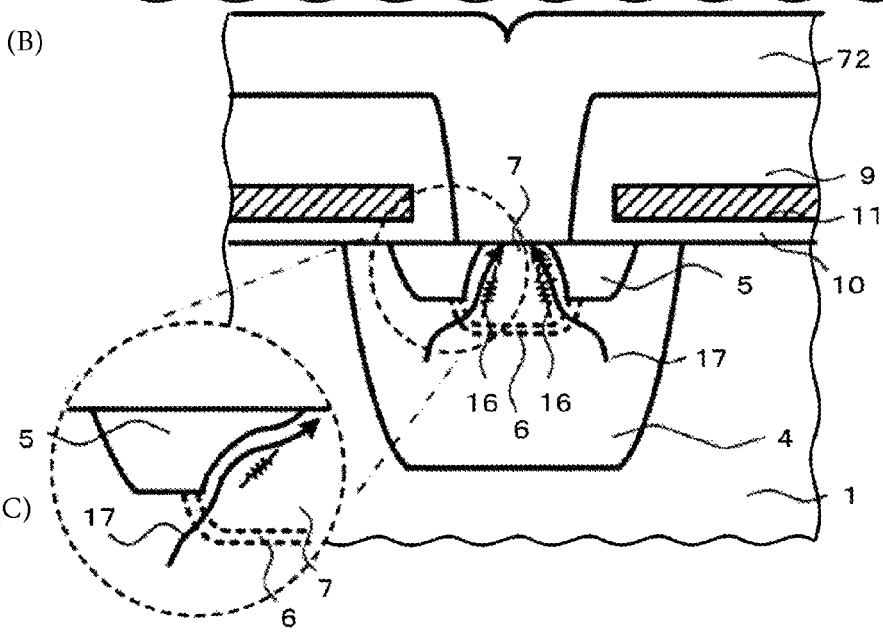
FIG. 24 (C)
FIG. 24 (D)
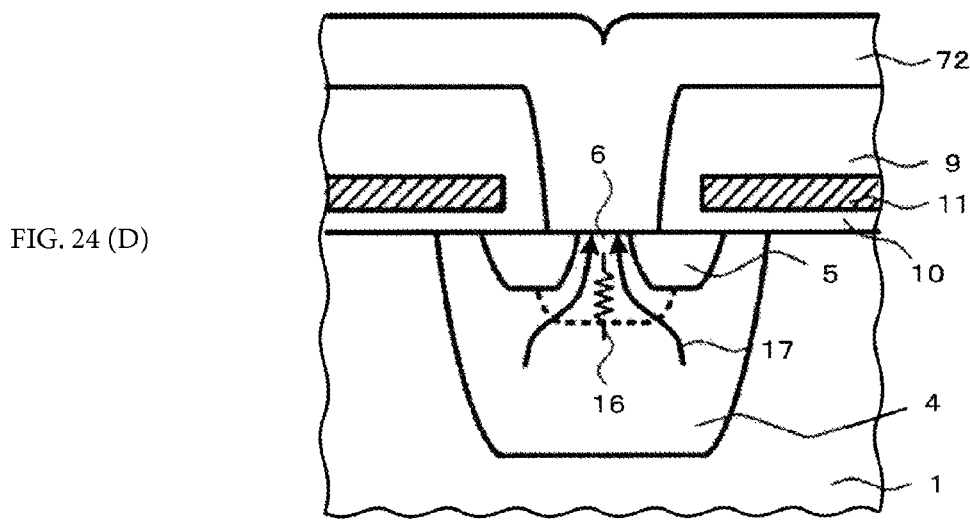

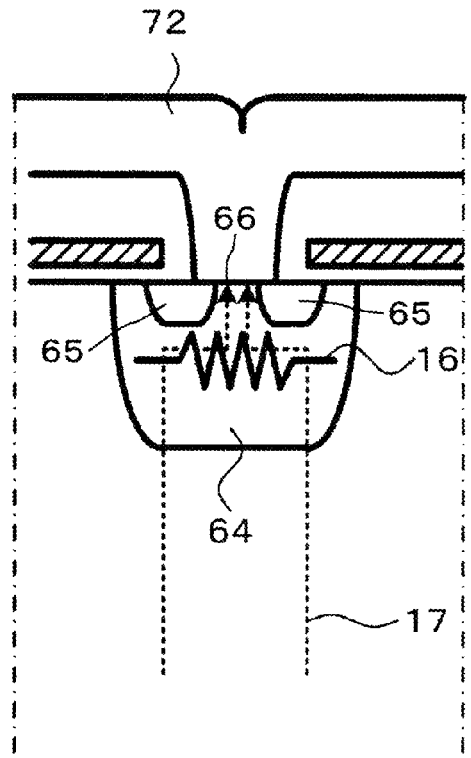 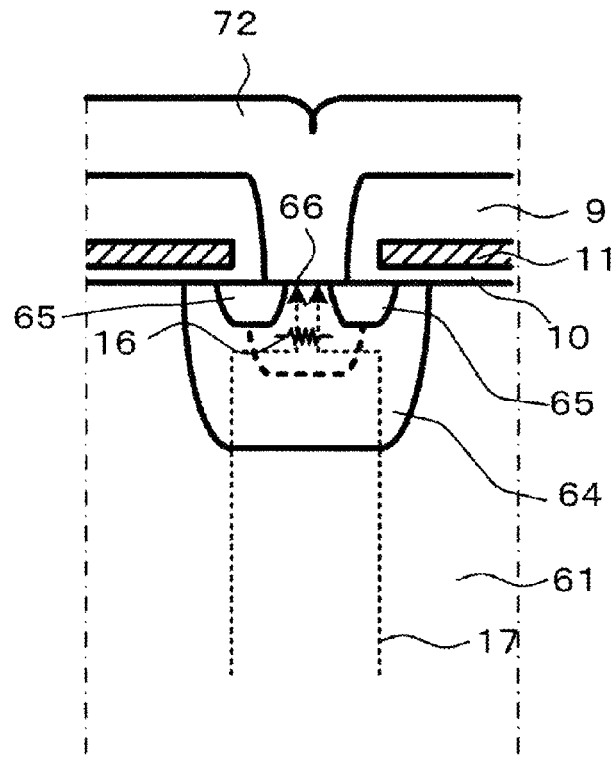
FIG. 26 (A)
Prior Art
FIG. 26 (B)
Prior Art

FIG. 28 (A) Prior Art
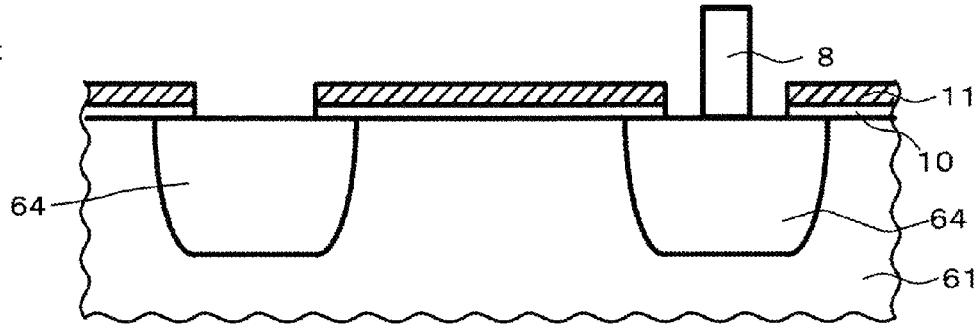
FIG. 28 (B) Prior Art
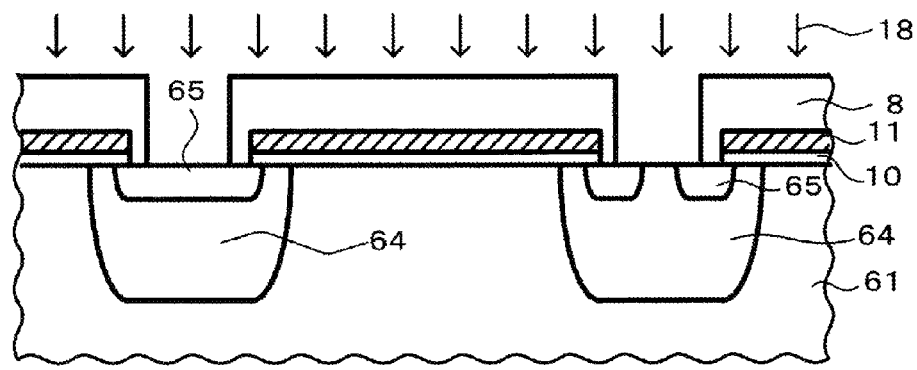
FIG. 28 (C) Prior Art
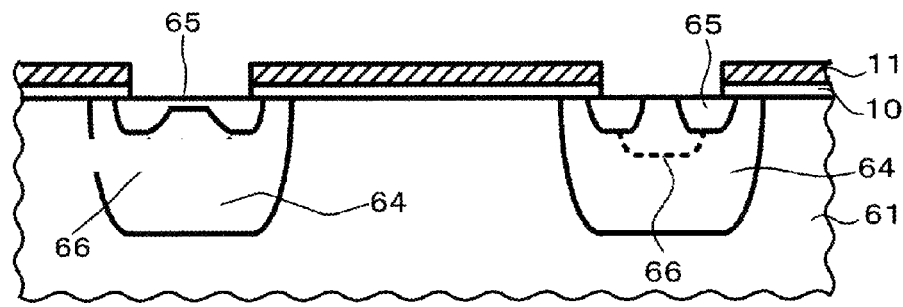

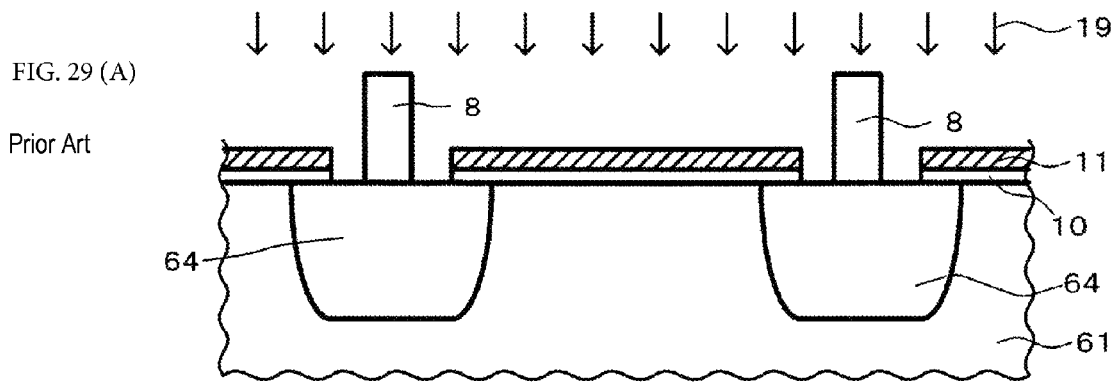
FIG. 29 (A) Prior Art
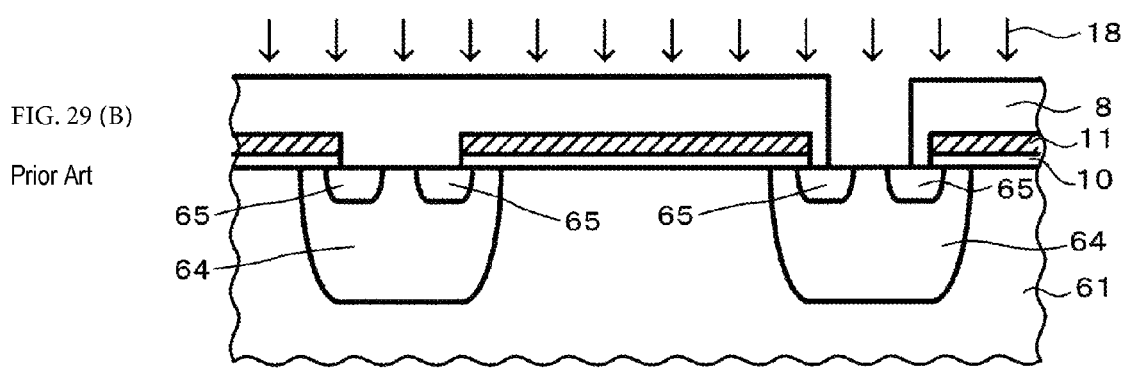
FIG. 29 (B) Prior Art
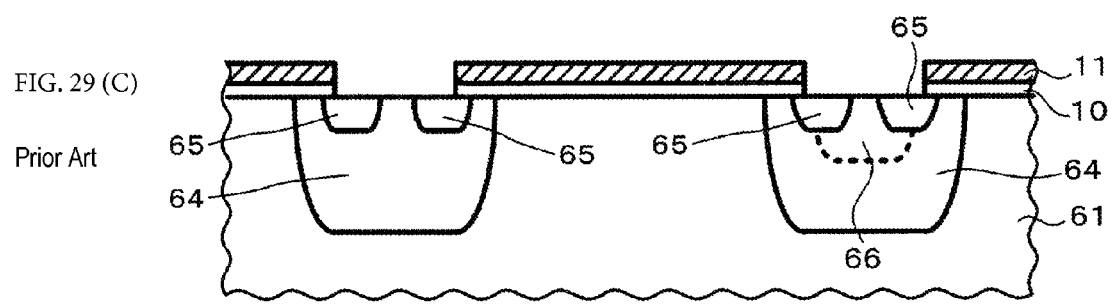
FIG. 29 (C) Prior Art

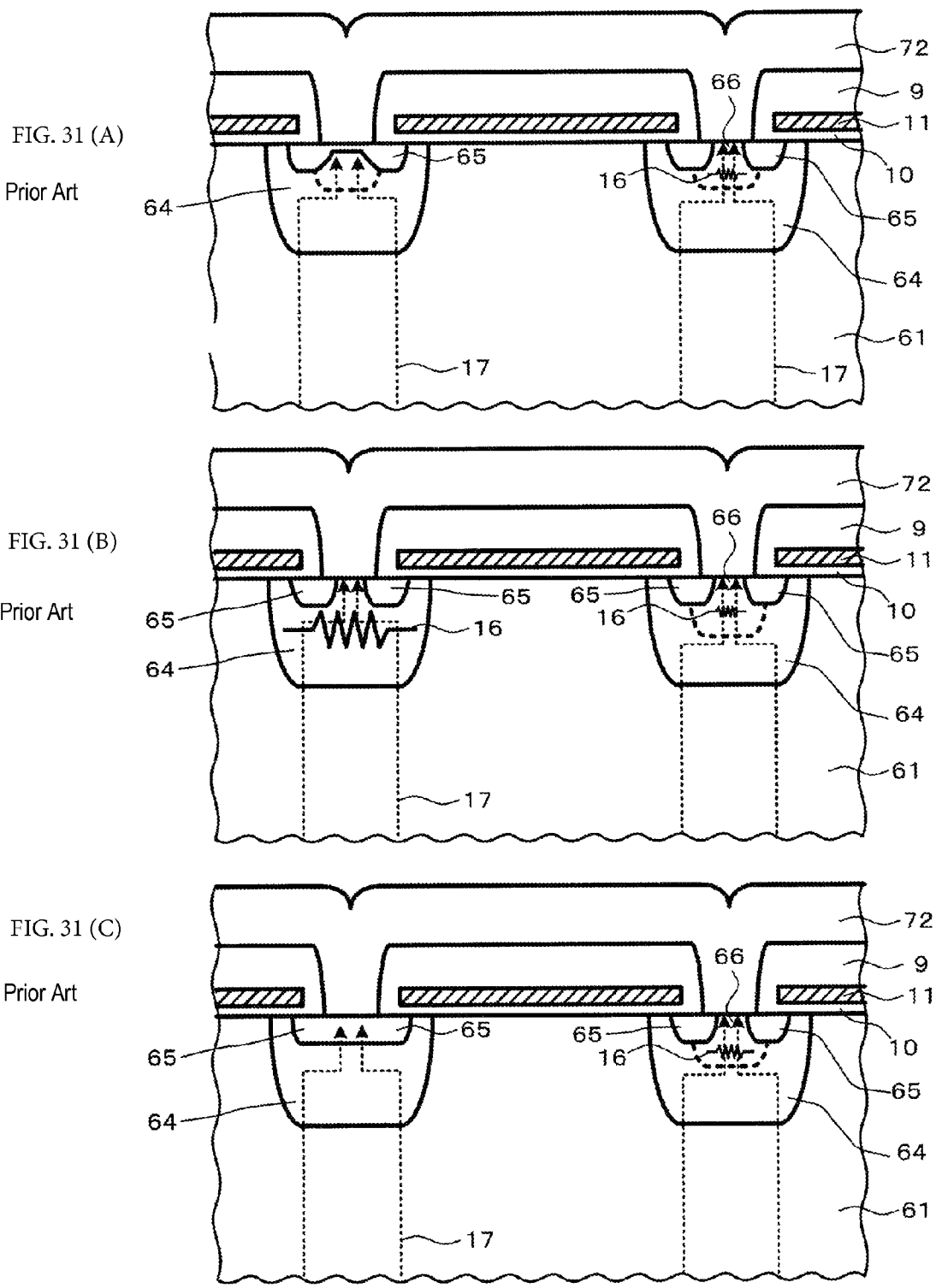

SEMICONDUCTOR DEVICE MANUFACTURING METHOD INCLUDING A COUNTER LAYER FOR POWER CONVERSION

TECHNICAL FIELD

The present invention relates to a semiconductor device and a method of manufacturing the same, and more particularly, to a semiconductor device such as an insulated gate semiconductor device used for a power conversion apparatus such as an inverter for driving a motor and a method of manufacturing the same.

BACKGROUND ART

In the proceeding of low power consumption of a power conversion apparatus, low power consumption of a power device performing an important function in the power conversion apparatus has been demanded. Particularly, since an insulated gate transistor (MOSFET) or an insulated gate bipolar transistor (IGBT) of which gate can be driven by a voltage can be easily treated, application fields have been greatly widened.

The MOSFET and the IGBT have a built-in parasitic structure. In other words, the MOSFET is a parasitic bipolar transistor (NPN structure), and the IGBT is a parasitic thyristor (PNPN structure). Particularly, in the case of the IGBT, since the IGBT includes a parasitic thyristor, if the parasitic thyristor operates, although electron injection from an inversion layer of the MOS gate is stopped by setting the gate voltage to a threshold value or less, the electrons continues to be injected through other paths from an n-type source layer into a p-type base layer. This phenomenon is called latch-up. When the gate is in a turned-on state or at a turned-off time, if the latch-up occurs, the controllability of the gate voltage is lost, and in the worst case, the device may be destructed.

As measures to suppress the destruction caused by the latch-up, there is a method of forming a p-type contact layer having a concentration higher than that of a p-type base layer in an inner portion of the p-type base layer constituting the MOS gate. FIG. 26 is a cross-sectional view for describing operations of a semiconductor device in the related art. FIG. 26 illustrates cross sections illustrating only the extracted portion of the gate structure of the IGBT or the MOSFET. FIG. 26(A) illustrates a cross section in the case where only the p-type base layer 64 is a p-type layer. FIG. 26(B) illustrates a cross section in the case where a p-type contact layer 66 having a concentration higher than that of a p-type base layer 64 is formed on a surface of the p-type base layer 64.

In FIG. 26(A), in a turned-on state or at a turned-off time, holes flowing into the p-type base layer 64 pass through a region between the n-type source layers 65 to an emitter electrode (not illustrated) as a hole flow 17. Although the hole flow 17 illustrated as a rectangular shape in FIG. 26(A) for the convenience of illustration, actual holes flow in a curve according to acceptor concentration distribution or electrostatic potential distribution.

In this manner, when the holes flow in an inner portion of the p-type base layer 64, large voltage drop occurs due to a resistance component 16 of the p-type base layer 64. If the voltage drop is larger than a built-in potential of pn junction between the n-type source layer 65 and the p-type base layer 64, a forward-biased voltage is generated at the pn junction, so that electrons are injected into the p-type base layer 64 through a path different from the MOS gate. As a result, electron injection at the MOS gate may not be controlled. In FIG. 26, an emitter electrode is denoted by reference numeral 72.

On the other hand, in FIG. 26(B), since the p-type contact layer 66 having a concentration higher than that of the p-type base layer 64 is formed in an inner portion of the p-type base layer 64, the magnitude of the resistance component 16 in the inner portion of the p-type base layer 64 is decreased due to the p-type contact layer 66. Therefore, even in the case where a larger current flows, the voltage drop due to the current can be suppressed to be equal to or lower than the built-in potential of the pn junction between the n-type source layer 65 and the p-type base layer 64.

As a result, it is possible to prevent a parasitic thyristor or a parasitic bipolar transistor from operating. In FIG. 26(B), an interlayer insulating film is denoted by reference numeral 9; a gate oxide film is denoted by reference numeral 10; a polysilicon electrode is denoted by reference numeral 11; and an n-type drift layer is denoted by reference numeral 61.

In addition, in the related art, there is a structure of forming a p-type high concentration layer in a lamination shape which is formed in an inner portion of the p-type base layer 64 to be in contact with the p-type contact layer 66 in order to prevent the parasitic thyristor or the parasitic bipolar transistor from operating (for example, refer to Patent Document 1 listed below). FIG. 25 is a cross-sectional view illustrating main components of a semiconductor device in the related art. FIG. 25 illustrates a cross section of a planar gate IGBT where the p-type high concentration layer is formed.

As illustrated in FIG. 25, in addition to the p-type contact layer 66, a p-type high concentration layer 28 is formed in an inner portion of the p-type base layer 64 in a lamination shape so as to be separated from the n-type source layer 65, so that resistance distribution according to carrier transport is alleviated. In addition, Patent Document 1 discloses a method of forming the p-type high concentration layer 28 by a high acceleration voltage ion implantation method and thermal treatment.

On the other hand, in the related art, there are a technique of a trench gate-type IGBT including a p-type high concentration layer 28 which is formed in an inner portion of a p-type base layer to be in contact with a p-type contact layer (for example, refer to FIG. 4 in Patent Document 2 listed below) and a technique of an IGBT including a deep p-type well layer 26 in an inner portion of a p-type base layer 64 (for example, refer to Patent Document 3 listed below). In FIGS. 25 and 27, an n-type field stop layer is denoted by reference numeral 2; a p-type collector layer is denoted by reference numeral 3; and a collector electrode is denoted by reference numeral 13.

FIG. 27 is a cross-sectional view illustrating main components of a semiconductor device in the related art. FIG. 27 illustrates a cross section of the aforementioned IGBT. A deep p-type well layer 26 is installed in an inner portion of the p-type base layer 64 including the p-type contact layer 66. In FIG. 27, the deep p-type well layer 26 also has the same function as the aforementioned p-type high concentration layer 28, so that the effect of reducing the resistance component of the path through which the holes flow can be obtained.

CITATION LIST

Patent Document

Patent Document 1: JP 2001-135817 A
Patent Document 2: JP 2001-308328 A
Patent Document 3: JP 2007-511913 A

DISCLOSURE OF THE INVENTION

Problem to be Solved by the Invention

In the manufacturing of the IGBT or the MOSFET, a large number of processes such as a photolithography process and an etching process are needed. Particularly, in the process of forming the p-type contact layer 66 or the n-type source layer 65, ion implantation is performed by using resist patterned by a photolithography process as a mask.

During the ion implantation, a localized pattern defect may occur in the resist which is used as the mask. In other words, due to particles such as micro-particles generated during the processes or contaminants, dust, or the like according to resist residue, a defect where the resist is omitted at an unexpected site or a defect where the resist remains may occur. If the ion implantation is performed by using the resist having the localized pattern defect as a mask, the formation defect of the p-type contact layer 66 or the n-type source layer 65 occurs at the defective site, and thus, the occurrence probability of the latch-up destruction is increased.

With respect to the cases of defects, specifically, there are the following three types of defects.

(1) Defect according to intrusion of an unnecessary n-type source layer at the site where a p-type contact layer is formed (hereinafter, referred to as a pattern defect (1)).

(2) Defect according to omission of a p-type contact layer at the site where an n-type source layer is not to be originally included (hereinafter, referred to as a pattern defect (2)).

(3) Defect according to the simultaneous occurrence of the pattern defects (1) and (2) (hereinafter, referred to as a pattern defect (3)).

Hereinafter, each pattern defect mentioned in pattern defects (1) to (3) will be described.

(Case of Pattern Defect (1))

FIG. 28 is a cross-sectional view illustrating a method of manufacturing a semiconductor device in the related art. FIG. 28 illustrates cross sections of a device in processes during the formation of the device. FIG. 28(A) illustrates a state where the gate oxide film 10, the polysilicon electrode 11, and the p-type base layer 64 for the gate control are formed on the surface of the n-type drift layer 61. In the state illustrated in FIG. 28(A), a screen thermal oxidation film (not illustrated) of which thickness is almost equal to that of the gate oxide film 10 may be formed on the surface of the p-type base layer 64.

In this state, as illustrated in FIG. 28(A), arsenic ion implantation (refer to the arrow 19 in FIG. 28(A)) is performed by using the polysilicon electrode 11 and the resist 8, which is patterned by a photolithography process, as a mask. At this time, it is assumed that the resist 8 is not formed in the p-type base layer 64 on the left side of the paper in FIG. 28(A) due to the particles or the like.

Next, after the resist of the previous process is removed, as illustrated in FIG. 28(B), the resist 8 is patterned again, and boron ion implantation (refer to the arrow 18 in FIG. 28(B)) is performed by using the resist 8 as a mask. Next, after the resist 8 is removed, thermal treatment is performed. Therefore, as illustrated in FIG. 28(C), the p-type contact layer 66 is formed.

However, as described above, in the upper portion of the left-side p-type base layer 64, the n-type source layer 65 is formed on the entire surface of the portion opened by the polysilicon electrode 11, and the p-type contact layer 66 is formed to be deeper than the n-type source layer 65. Therefore, as illustrated in FIG. 28(C), the n-type source layer 65 slightly remains in the upper portion of the p-type base layer 64. In this manner, if the n-type source layer 65 is formed at the site (portion) where the n-type source layer 65 is not to be originally formed, a defect occur in characteristics.

FIG. 31 is a cross-sectional view for describing operations of a semiconductor device in the related art. FIG. 31 illustrates the hole flow in the turned-on state or at the turned-off time and the resistance component of the p-type base layer in the semiconductor device of the related art. FIG. 31(A) illustrates operations of the semiconductor device in the case of the pattern defect (1) in the description. As illustrated on the right side of FIG. 31(A), in the case where the resist is patterned according to a pattern of a photomask, the p-type contact layer 66 is formed on the surface of the p-type base layer 64. In addition, the hole flow 17 in the turned-on state or at the turned-off time passes through the region where the resistance of the resistance component 16 is low.

However, as illustrated on the left side of FIG. 31(A), if the resist mask in the arsenic ion implantation period is omitted and the surface of the p-type base layer 64 is covered with the n-type source layer 65, the hole flow 17 is blocked by the n-type source layer 65, so that the holes may not flow out to the emitter electrode (not illustrated). If the holes may not flow out to the emitter electrode, the voltage of the pn junction between the p-type contact layer 66 and the n-type source layer 65 in the turned-on state or at the turned-off time exceeds a built-in potential (about 0.7 V), so that electrons are injected from the n-type source layer 65 through the p-type contact layer 66 into the p-type base layer 64 separately from the MOS gate. As a result, a parasitic thyristor or a parasitic bipolar transistor operates, and thus, the latch-up occurs, so that the current on/off control is not any more performed in the MOS gate.

(Case of Pattern Defect (2))

FIG. 29 is a cross-sectional view illustrating a method of manufacturing a semiconductor device in the related art. FIG. 29 illustrates cross sections of the device in the processes during the device formation. FIG. 29(A) illustrates a state where the gate oxide film 10, the polysilicon electrode 11, and the p-type base layer 64 for gate control are formed on the surface of the n-type drift layer 61.

In the state illustrated FIG. 29(A), the arsenic ion implantation (refer to the arrow 19 in FIG. 29(A)) is performed by using the polysilicon electrode 11 and the resist 8, which is patterned by a photolithography process, as a mask. Next, after the resist of the previous process is removed, as illustrated in FIG. 29(B), the resist 8 is patterned again, and the boron ion implantation (refer to the arrow 18 in FIG. 29(B)) is performed by using the resist 8 as a mask.

At this time, due to the particles or the like existing on the surface of the p-type base layer 64 on the left side of the paper in FIG. 29(B), the resist 8 is not exposed, and thus, after development, the resist 8 remains. Accordingly, boron is not introduced into the left-side p-type base layer 64, and the p-type contact layer 66 (before thermal treatment) is not formed.

Subsequently, in the state where the p-type contact layer 66 is not formed, after the resist 8 is removed, thermal treatment is performed. Therefore, the final p-type contact layer 66 is formed in the p-type base layer 64 illustrated on the right side of the paper in FIG. 29(C). On the other hand, the p-type contact layer 66 is not formed in the p-type base layer 64 illustrated on the left side of the paper in FIG. 29(C).

In this manner, in the case where the p-type contact layer 66 is not formed at the site where the p-type contact layer 66 is to be originally formed, the relation between the hole flow 17 and the resistance component 16 is illustrated in FIG. 31(B). FIG. 31(B) illustrates operations of the semiconductor device in the case of the pattern defect (2) of the description.

As illustrated on the left side of the paper in FIG. 31(B), if the p-type contact layer 66 which is to originally included is omitted, the magnitude of the resistance component 16 of the path of the hole flow 17 in the portion just below the n-type source layer 65 is increased in the turned-on state or at the turned-off time. Therefore, the voltage drop in the path from the portion just below the n-type source layer 65 to an emitter electrode (not illustrated) exceeds a built-in potential (about 0.7 V) of the pn junction between the p-type contact layer 66 and the n-type source layer 65.

Therefore, similarly to the pattern defect (1), electrons are injected from the n-type source layer 65 through the p-type contact layer 66 into the p-type base layer 64 separately from the MOS gate. Accordingly, the latch-up locally occurs only in the p-type base layer 64 where the electrons are injected, and a parasitic thyristor or a parasitic bipolar transistor operates, so that current on/off of the MOS gate may not be controlled.

(Case of Pattern Defect (3))

FIG. 30 is a cross-sectional view illustrating a method of manufacturing a semiconductor device in the related art. FIG. 30 illustrates cross sections of the device in the processes during the device formation. As illustrated in FIG. 30, in the case where the pattern defect (1) and the pattern defect (2) simultaneously occur, in the p-type base layer 64 on the left side of the paper in FIG. 30(A), the resist 8 is omitted, and an unnecessary n-type source layer 65 which is not to be originally formed is formed over the entire surface of the opening portion.

In addition, in the p-type base layer 64 on the left side of the paper in FIG. 30(B), the resist 8 remains, so that the p-type contact layer 66 which is to be originally introduced is omitted. In this manner, in the case where the pattern defect (1) and the pattern defect (2) simultaneously occur, the p-type contact layer 66 which is to be originally formed is not formed in the p-type base layer 64 (herein, the p-type base layer 64 on the left side of the paper), and the unnecessary n-type source layer 65 is introduced over the entire surface of the opening portion of the polysilicon electrode 11.

In the case where, due to the occurrence of the pattern defect (3), the p-type contact layer 66 which is to be originally formed is not formed and the unnecessary n-type source layer 65 is introduced over the entire surface of the opening portion of the polysilicon electrode 11, as illustrated in FIG. 31(C), similarly to the pattern defect (1), all the holes flow into the n-type source layer 65, so that the latch-up more easily occurs. Although the occurrence probability of the pattern defect (3) is low in comparison with the aforementioned pattern defects (1) and (2), the pattern defect (3) is a defect which may occur.

With respect to the three pattern defects described above, in the aforementioned structure of the related art illustrated in FIG. 25, although the p-type high concentration layer 28 is formed at such a deep position that the p-type high concentration layer 28 is in contact with the p-type contact layer 66, that the p-type high concentration layer 28 is not in contact with the n-type source layer 65 in the depth. Therefore, in the p-type high concentration layer 28, for example, if the defect in the case of the pattern defect (1) occurs, the n-type source layer may not be cancelled, and thus, there is a problem in that the effect of solving the defect is lowered.

In addition, in the aforementioned structure of the related art illustrated in FIG. 27, the diffusion depth of the p-type well layer 26 is formed to be larger than the p-type base layer 64. The transverse diffusion portion of the p-type well layer 26 in the depth needs to be configured not to reach the channel formation region so that the p-type well layer 26 does not influence the gate threshold value. In addition, the process of forming the p-type well layer 26 needs to be performed prior to the gate oxide film 10, the polysilicon electrode 11, or the p-type base layer 64 so that the diffusion depth becomes deep.

In order not to allow the transverse diffusion portion of the p-type well layer 26 to reach the channel formation region in the state where the p-type well layer 26 does not influence the gate threshold value, boron needs to be implanted in a region much narrower than the formation region of the p-type base layer 64 on the outer surface of the n-type drift layer 61, which is a difficult problem. Therefore, there is a problem in that it is difficult to secure a region capable of cancelling the n-type source layer in the p-type well layer 26 formed in such a narrow region with respect to the aforementioned pattern defect (1).

In addition, there is a problem in that the defects of the pattern defects (1) to (3) may not be detected in a so-called static characteristic such as a resistant voltage, a leakage current, ON resistance, or an ON voltage. Therefore, there is a problem in that, the device with defects is transferred to an assembly process, and destruction caused by the latch-up occurs during a final shipment test period. In this case, there is a problem in that packaging members or assembly and test processes also have defects, so that the loss is very big. Particularly, in the case of a large-capacity module using a plurality of chips, the problem is very serious.

Recently, miniaturization has proceeded in order to produce high-performance devices, and the gate structure thereof is changed from the planar structure of the related art to the trench structure. Therefore, a sensitivity of switching destruction with respect to the aforementioned defects is further increased. For example, with respect to a stripe-pattern trench IGBT, in the case where a stripe-shaped p-type contact layer is formed in parallel to the trench, it is observed from an experiment that, if a length of a non-formation region is equal to or larger than 5 v, the latch-up destruction occurs in the IGBT. Therefore, measures to cope with the aforementioned pattern defects are very urgent.

In view of the foregoing problems, the present invention is to provide a semiconductor device where switching destruction caused by process defects in an insulated gate semiconductor device such as an IGBT or a MOSFET is reduced and a method of manufacturing the same.

Means for Solving Problem

An aspect of the present invention for accomplishing the above-mentioned purpose by solving the problem is to provide a semiconductor device including: a drift layer which is constructed from a first conductivity type semiconductor substrate; a second conductivity type base layer which is selectively formed on a surface of a first principal plane of the semiconductor substrate; a first conductivity type source layer which is selectively formed on a surface of the base layer; a second conductivity type contact layer which is formed to be in contact with the source layer on the first principal plane side of the base layer and which has a concentration higher than that of the base layer; a gate electrode which is formed so as to face the drift layer, the base layer, and the source layer through an insulating film; an emitter electrode which is formed on the first principal plane so as to be electrically connected to the source layer; and an interlayer insulating film which is formed on the first principal plane of the semiconductor substrate to be interposed between the gate electrode and the emitter electrode so as to insulate the gate electrode and the emitter electrode, in which the semiconductor device further includes a second conductivity type counter layer which is formed to be in contact with the source layer and to overlap the contact layer and which is formed to be shallower than the base layer and to have a high concentration, and in which a total doping amount per unit area of the counter layer is larger than 10% of a total doping amount per unit area of the contact layer.

In addition, in the above aspect of the semiconductor device according to the present invention, the total doping amount per unit area of the counter layer may be larger than that of the contact layer.

In addition, in the above aspect of the semiconductor device according to the present invention, a sum of the total doping amount per unit area of the counter layer and the total doping amount per unit area of the contact layer may be larger than that of the source layer.

In addition, in the above aspect of the semiconductor device according to the present invention, the total doping amount per unit area of the counter layer may be larger than that of the source layer.

In addition, in the above aspect of the semiconductor device according to the present invention, the counter layer may be formed so as to be self-aligned with a position of an opening portion of the interlayer insulating film.

In addition, in the above aspect of the semiconductor device according to the present invention, a plurality of the counter layers may be installed.

In addition, in the above aspect of the semiconductor device according to the present invention, the semiconductor device may be an IGBT.

In addition, in the above aspect of the semiconductor device according to the present invention, the semiconductor device may be a trench gate-type IGBT.

In addition, in the above aspect of the semiconductor device according to the present invention, a shape of a cross section of pn junction between the counter layer and the source layer may have a portion which is convex to the inside of the source layer.

According to another aspect of the present invention, there is provided a method of manufacturing a semiconductor device including: a first process of implanting second conductivity type impurity ions in a first principal plane of a semiconductor substrate with such a range that the contact layer is shallower than a base layer included in the semiconductor device in order to form the contact layer included in the semiconductor device; a second process of implanting first conductivity type impurity ions in the first principal plane with such a range that the source layer is shallower than the contact layer in order to form the source layer included in the semiconductor device, after the first process; and a third process of implanting second conductivity type impurity ions in the first principal plane with such a range that a counter layer is deeper than the source layer and shallower than the base layer at a dose which is equal to or larger than 10% of a dose of the ion implantation of the first process in order to form the counter layer included in the semiconductor device, after the second process.

In addition, in the above aspect of the method of manufacturing the semiconductor device according to the present invention, the dose of ion implantation of the third process may be larger than that of the first process.

In addition, in the above aspect of the method of manufacturing the semiconductor device according to the present invention, a sum of the dose of ion implantation of the first process and the dose of ion implantation of the third process may be larger than that of the second process.

In addition, in the above aspect of the method of manufacturing the semiconductor device according to the present invention, the dose of ion implantation of the third process may be larger than that of the second process.

In addition, in the above aspect of the method of manufacturing the semiconductor device according to the present invention, the ion implantation of the third process may be performed by using the interlayer insulating film, where an opening portion is selectively formed, as a mask.

Effect of the Invention

In this manner, according to the present invention, with respect to an insulated gate semiconductor device such as an IGBT or a MOSFET, it is possible to provide a semiconductor device where switching destruction caused by process defects is reduced and a method of manufacturing the same.

BRIEF DESCRIPTION OF DRAWINGS

FIG. 24 (A)-FIG. 24 (D) are cross-sectional views for describing a semiconductor device according to an embodiment of the present invention and operations of the semiconductor device.

FIG. 26 (A)-FIG. 26 (B) are cross-sectional views for describing operations of a semiconductor device in the related art.

FIG. 28 (A)-FIG. 28 (C) are cross-sectional views illustrating a method of manufacturing a semiconductor device in the related art.

FIG. 29 (A)-FIG. 29 (C) are cross-sectional views illustrating a method of manufacturing a semiconductor device in the related art.

FIG. 31 (A)-FIG. 31 (C) are cross-sectional views for describing operations of a semiconductor device in the related art.

BEST MODE(S) FOR CARRYING OUT THE INVENTION

Hereinafter, semiconductor devices and methods of manufacturing the same according to embodiments of the present invention will be described in detail with reference to the drawings. In the description of the embodiments hereinafter, a first conductivity type denotes an n type, and a second conductivity type denotes a p type. In the present invention, the first conductivity type is not limited to the n type, and the second conductivity type is not limited to the p type. In the case where the n type and the p type can be switched so that the first and the second conductivity types are p type and n type, respectively, portions having the same operations may exist.

In addition, in the specification, as terms for a semiconductor device, a device, an element, a chip, and a semiconductor chip are used. However, all the terms indicate the same object, that is, the semiconductor device. In addition, in the specification, a surface of a silicon substrate may be expressed by an upper surface, and a rear surface thereof may be expressed by a lower surface. In addition, in the specification, in a semiconductor chip, a region where an emitter electrode is formed and a current can flow is referred to as an "active region".

In addition, in the specification, as a region from an end of the active region to an outer-circumference-side end of the chip, a structural portion for alleviating the electric field intensity on the surface of the chip generated due to application of a voltage to the element is referred to as a "terminated structure region". In addition, in the specification, in the description of concentration and the like, for example, the expression of $1.0E12/cm^2$ denotes $1.0 \times 10^{12}/cm^2$. In addition, a symbol+(−) described at the right of each region (p-type region and n-type region) illustrated in each figure denotes that an impurity concentration thereof is relatively higher (lower) than other regions. In addition, in the specification, with respect to a distribution of impurity doping concentration per unit area of donors or acceptors, an integrated concentration in a depth direction of a semiconductor substrate is referred to as a total doping amount per unit area or, simply, a total amount.

First Embodiment

In a first embodiment, a MOS gate semiconductor device where a p-type counter layer is newly formed in order to prevent latch-up by suppressing pattern defect of a p-type contact layer formed on a surface of a p-type base layer and a method of manufacturing the same will be described.

Figure 1:
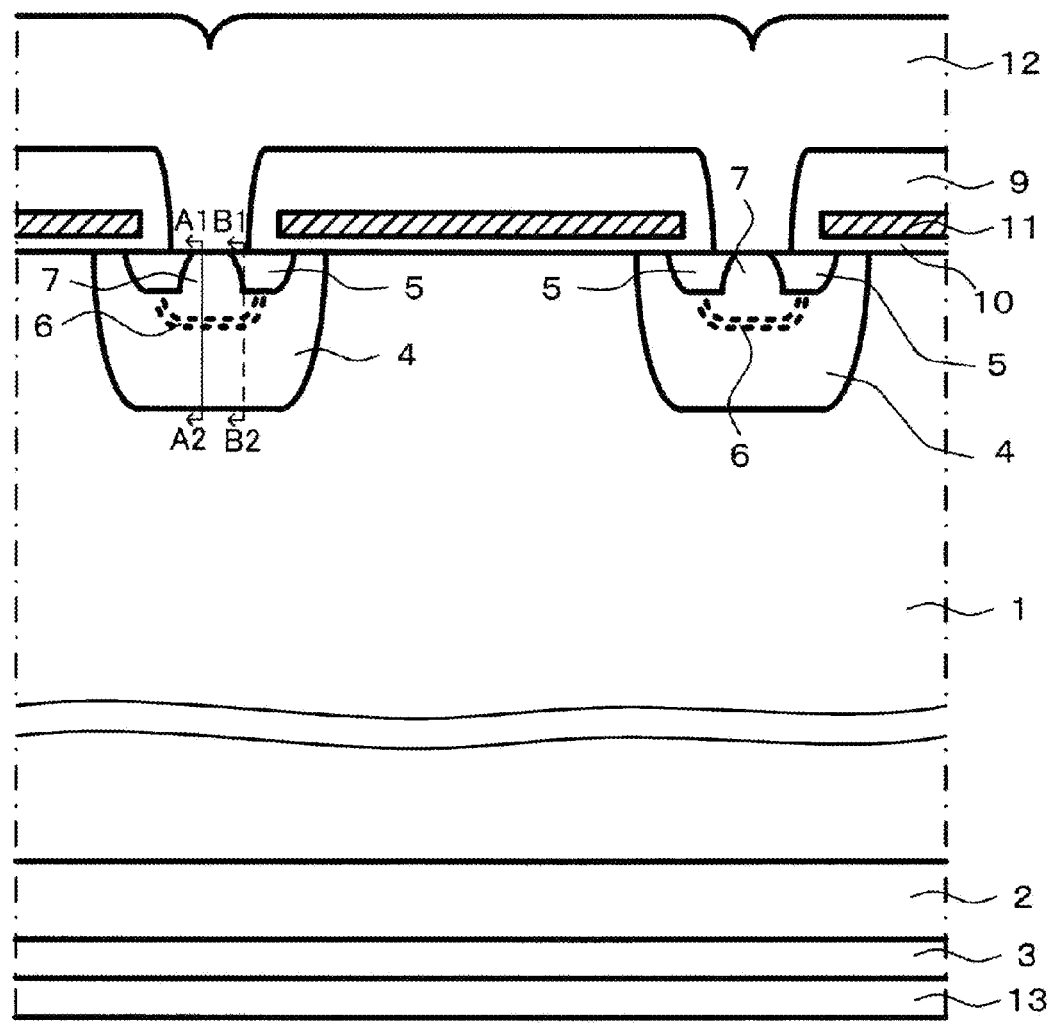
FIG. 1 is a cross-sectional view illustrating main components of a semiconductor device according to an embodiment of the present invention.

FIG. 1 is a cross-sectional view illustrating main components of a semiconductor device according to an embodiment of the present invention. FIG. 1 illustrates a cross-sectional view of an IGBT which is a semiconductor device according to the first embodiment. In FIG. 1, a p-type base layer 4 having a concentration higher than that of an n-type drift layer 1 is selectively formed on a surface of the semiconductor substrate including the n-type drift layer 1. An n-type source layer 5 having a concentration higher than that of the p-type base layer 4 is selectively formed on a surface of the p-type base layer 4. Moreover, a p-type contact layer 6 is formed in the p-type base layer 4 so as to be in contact with the selectively-formed n-type source layer 5.

In addition, a polysilicon electrode 11 for a gate electrode is selectively formed on the surface of the semiconductor substrate so as to face the surface of each layer of the n-type source layer 5, the p-type base layer 4, and the n-type drift layer 1 through a gate oxide film 10. The polysilicon electrodes 11 are condensed on the chip to be in contact with pads for gate electrodes (not illustrated) (portions of package connected to gate ports).

A p-type counter layer 7 having a concentration higher than that of the p-type base layer 4 is formed on the surface of the semiconductor substrate including the n-type drift layer 1. The p-type counter layer 7 is formed to be in contact with the n-type source layer 5, to overlap the p-type contact layer 6, not to exceed the end of the n-type source layer 5 on the side facing the polysilicon electrode 11, that is, to be separated from an interface where the p-type base layer 4 and the gate oxide film 10 are in contact with each other, and to be shallower than the p-type base layer 4. The p-type base layer 4 is connected to an emitter electrode 12. In this manner, a MOS gate structure is formed.

An interlayer insulating film 9 is formed to cover the polysilicon electrode 11. The interlayer insulating film 9 is opened so that the n-type source layer 5 and the p-type counter layer 7 on the upper surface of the p-type base layer 4 are exposed. The aforementioned emitter electrode 12 made of aluminum or the like is formed on a surface of the chip. The emitter electrode 12 is electrically connected through the above-described opening portions of the interlayer insulating film 9 to the n-type source layer 5 and the p-type counter layer 7. The emitter electrode 12 and the polysilicon electrode 11 which becomes the gate are insulated by the interlayer insulating film 9.

On the other hand, on a lower surface of the semiconductor substrate, an n-type field stop layer 2 is formed to be in contact with the n-type drift layer 1, and a p-type collector layer 3 is formed to be in contact with the n-type field stop layer 2 to be connected to a collector electrode 13 formed on the outer layer of the lower surface of the semiconductor substrate. FIG. 1 illustrates a finished structure in the case where aforementioned three types of pattern defect do not occur. The cases where the three types of pattern defect occur will be described later.

In the p-type counter layer 7, there are three relations with respect to the p-type contact layer 6, the n-type source layer 5, and the p-type base layer 4. In the first relation, the p-type counter layer 7 is necessarily formed to be in contact with the n-type source layer 5 and to be deeper than the n-type source layer 5. In this formation, a hole current flows through the p-type counter layer 7 to the emitter electrode 12, so that voltage drop of a portion just below the n-type source layer 5 can be decreased.

In the second relation, the p-type counter layer 7 is formed to overlap the p-type contact layer 6. The purpose of formation of the p-type counter layer 7 is that, even in the case where formation defect (omission) occurs in the p-type contact layer 6, the same effect of preventing the latch-up as that of the layer is allowed to be sustained. Therefore, by allowing the formation region of the p-type counter layer 7 (planar distribution of the surface of the chip and concentration distribution in the depth direction) to be the same as the p-type contact layer 6 or at least to overlap thereof, the resistance of the portion just below the n-type source layer 5 needs to be lowered.

In the third relation, the p-type counter layer 7 is necessarily formed to be separated from the interface where the p-type base layer 4 and the gate oxide film 10 are in contact with each other and to be shallower than the p-type base layer 4. The gate threshold value is determined by a concentration of the p-type base layer 4. Therefore, if the p-type counter layer 7 having a concentration higher than that of the p-type base layer 4 is formed in a portion of a channel (inversion layer) of electrons generated on the surface of the p-type base layer 4 when the MOS gate is turned on, the threshold value is changed.

Therefore, in order to satisfy the first and the second relations (conditions) and not to influence the channel region of the p-type base layer 4, the p-type counter layer 7 is formed to be separated from the interface where the p-type base layer 4 and the gate oxide film 10 are in contact with each other. In addition, if the p-type counter layer 7 is formed to be deeper than the p-type base layer 4, a depletion layer is widened from the p-type counter layer 7. In this case, the electric field intensity is greatly increased in an inner portion of the p-type counter layer 7 having a concentration higher than that of the p-type base layer 4, so that a resistant voltage is decreased. In order to prevent the decrease in resistant voltage, the p-type counter layer 7 may be formed to be shallower than the p-type base layer 4.

Figure 2:
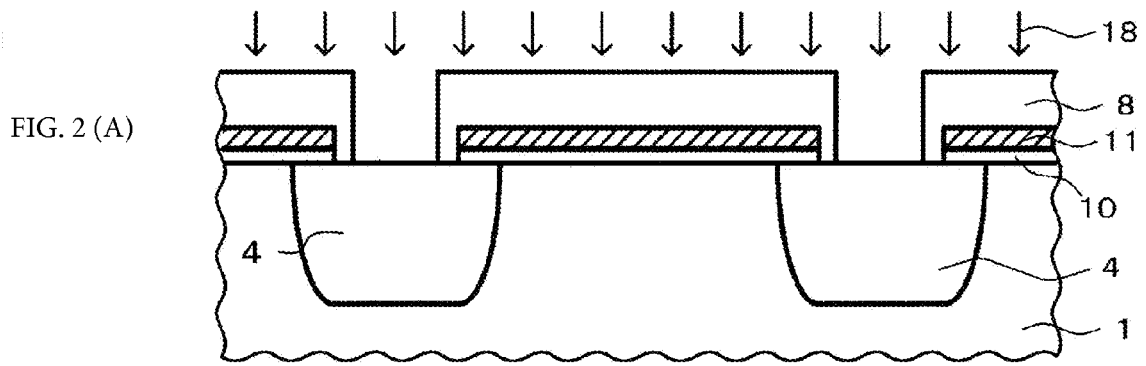
FIG. 2 (A)-FIG. 2 (D) are cross-sectional views illustrating a method of manufacturing a semiconductor device according to an embodiment of the present invention.
Figure 2:
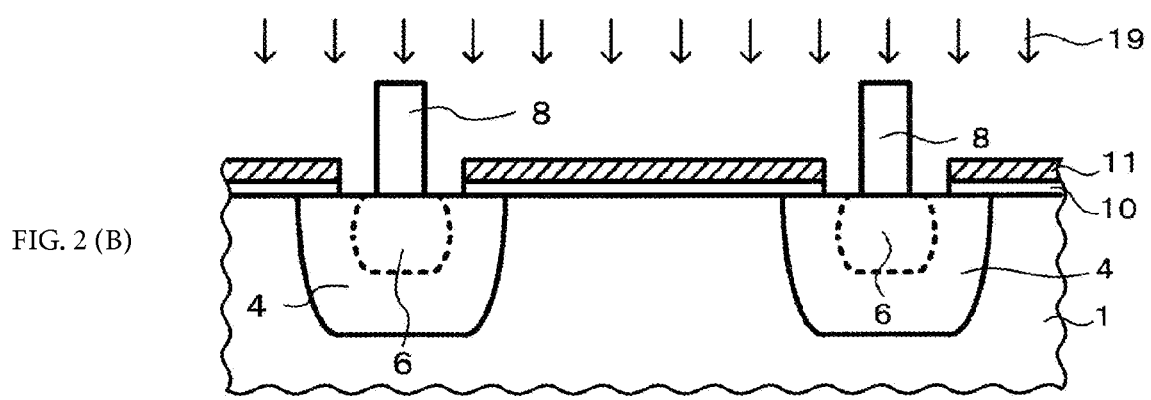
Figure 2:
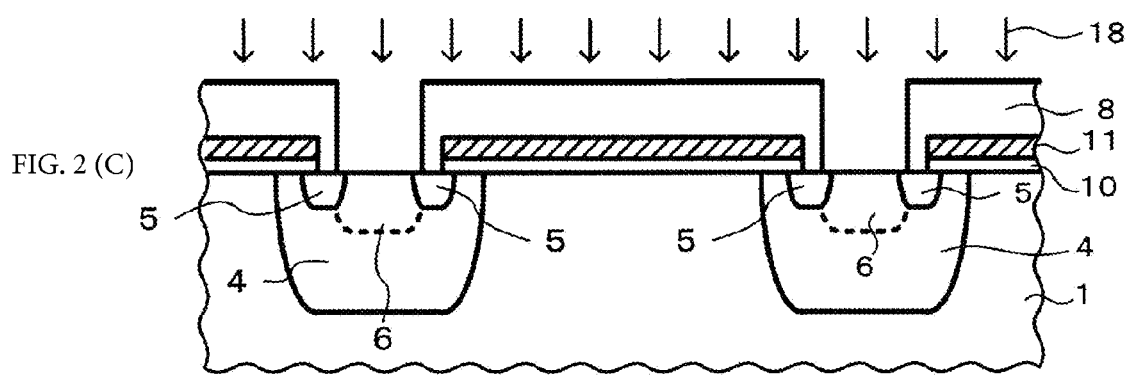
Figure 2:
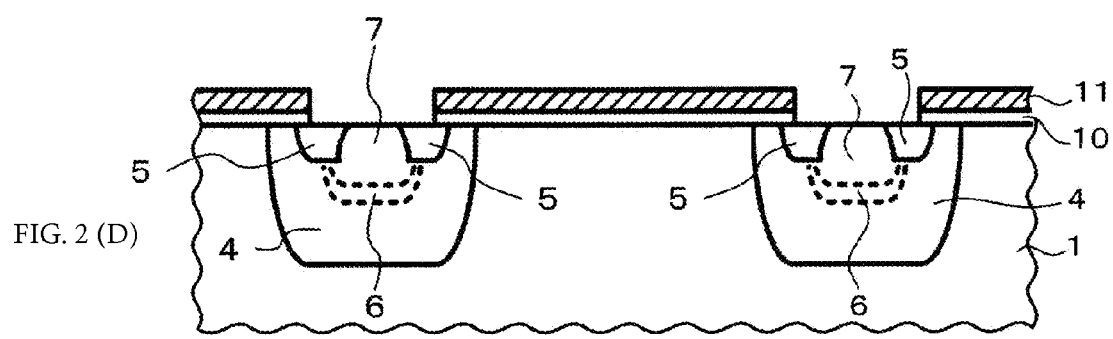

Next, a method of manufacturing the IGBT according to the first embodiment will be described. FIG. 2 is a cross-sectional view illustrating a method of manufacturing the semiconductor device according to the embodiment of the present invention. FIG. 2 illustrates only the flow of the processes relating to the formation of the p-type counter layer 7 in the processes of manufacturing the IGBT according to the first embodiment. First, standard processes of manufacturing the IGBT or MOSFET are performed just before FIG. 2(A).

As an example, an initial oxide film having a thickness of 8000 Å by the thermal oxidation is formed on a surface of an FZ (float-zone) type semiconductor substrate having an n conductivity type and about 60 Ωcm. Subsequently, the initial oxide film is patterned by a photolithography method; boron ion implantation is performed; and thermal diffusion is performed, so that a terminated structure region for alleviating the electric field of the depletion layer which is widened during the turned-off period, for example, a well-known guard ring structure and the like is formed (not illustrated). Subsequently, the initial oxide film is removed from the active region by a photolithography method; the gate oxide film 10 is formed by thermal oxidation; a poly-silicon film is formed by a deposition method; and then the polysilicon film is patterned by a photolithography method, so that the polysilicon electrode 11 is formed.

Next, boron ion implantation is performed, and thermal treatment is performed, so that the p-type base layer 4 is formed. With respect to the p-type base layer 4, for example, the dose of the boron ion implantation 18 is set to 2E14/cm², and the acceleration energy is set to 150 keV. In addition, a temperature and a temperature sustaining time of thermal treatment are set to 1150° C. and 60 minutes. The portion illustrated in the cross section of FIG. 2(a) is formed by the processes hereinbefore.

Next, as illustrated in FIG. 2(A), resist 8 is patterned by a photolithography method, and baking (a process of stabilizing the resist by thermal treatment at a temperature of about 150° C.) is performed, so that a mask of the resist 8 where a portion of the upper surface of the p-type base layer 4 is opened is formed. Subsequently, the boron ion implantation 18 is performed by using the patterned resist 8 as a mask. At this time, the dose is set to, for example, 1E15/cm², and the acceleration energy is set to, for example, 60 key. As a result, a range (Rp) of the boron ion is about 0.20 µm.

In this manner, boron is introduced into the region which is to be the p-type contact layer 6. In addition, in this figure, although an oxide film is not formed on the surface of the p-type base layer 4, an oxide film which is so thin that it does not influence the range of the ion implantation may be formed as described hereinafter. For example, the gate oxide film described above may be allowed to remain. Alternatively, before the resist 8 is applied, the gate oxide film may be removed by using the polysilicon electrode 11 as a mask, and a screening film having a thickness of about 300 Å may be formed by separate thermal oxidation.

Subsequently, as illustrated in FIG. 2(B), the resist 8 is applied, and the patterning and baking of the resist 8 are performed in a portion of the opening of the surface of the p-type base layer 4 so that the resist 8 is not in contact with the polysilicon electrode 11. Next, arsenic ion implantation 19 (phosphorus is available) where the arsenic ions are to be donors is performed by using the resist 8 as a mask, and thermal treatment is performed. The dose of the arsenic ion implantation 19 is set to, for example, $4E15/cm^2$, and acceleration energy is set to, for example, 120 keV. At this time, the range of the arsenic ions is about 0.08 μm. In the case of the same acceleration energy, the range of arsenic is shallower than that of boron. In this step, the n-type source layer 5 is formed. The thermal treatment of this case may not be provided.

Moreover, as illustrated in FIG. 2(C), the resist 8 is applied, and patterning and baking are performed so that a portion of the surface of the p-type base layer 4 is opened. Next, the boron ion implantation 18 is performed by using the resist 8 as a mask, and after the resist 8 is removed, thermal treatment is performed. The dose of the boron ion implantation is set to, for example, $5E15/cm^2$, and the acceleration energy is set to, for example, 50 keV. At this time, the range of the boron ions is 0.17 μm. In addition, a temperature and a temperature sustaining time of the thermal treatment are, for example, 950° C. and 30 minutes, respectively. In this manner, as illustrated in FIG. 2(D), the p-type counter layer 7 is formed.

Herein, there are three conditions of the manufacturing method corresponding to the three relations (conditions) in the formation of the p-type counter layer 7. As the first condition, in the patterning of the resist 8 of FIG. 2(C), at least a portion of the opening portion where the boron ion implantation is to be performed is configured to overlap the region where the n-type source layer 5 is formed, that is, the opening portion of the resist of the time when the arsenic ion implantation is performed. In addition, patterning is performed so that the end portion of the opening portion of the resist 8 for the p-type counter layer 7 does not exceed the position where the end portion thereof is separated from the interface where the p-type base layer 4 and the gate oxide film 10 are in contact with each other or the position where the n-type source layer 5 and the p-type base layer 4 are in contact with each other (so that the end portion is located inside thereof). In this condition, layout of photomask and reticle may be adjusted.

As the second condition, in the formation of the p-type counter layer 7, the range of the boron ions is configured to be deeper than the n-type source layer 5. In addition, a portion of the p-type counter layer 7 is configured to overlap a portion of the p-type contact layer 6, and the range is configured to be shallower than the p-type base layer 4. In other words, if the range of the boron ion implantation in the formation of the p-type counter layer 7 is denoted by Rp7 and the range of the arsenic ion implantation in the formation of the n-type source layer 5 is denoted by Rp5, the acceleration energy of each ion implantation may be adjusted so that Rp7>Rp5.

In addition, it is preferable that the acceleration energy of the boron ion implantation for the p-type counter layer 7 be equal to or lower than the acceleration energy of the ion implantation for the p-type contact layer 6. For example, in the first embodiment, as described above, the acceleration energy of the boron ion implantation 18 for the p-type contact layer 6 is set to 60 key (the range is set to 0.20 μm); the acceleration energy of the arsenic ion implantation 19 for the n-type source layer 5 is 120 keV (the range is set to 0.08 μm); and the acceleration energy of the boron ion implantation 18 for the p-type counter layer 7 is set to 50 keV (the range is set to 0.17 μm).

Next, how the semiconductor device and the method of manufacturing the same according to the present invention prevent the aforementioned three pattern defects under the specific formation conditions will be described as the first embodiment of the present invention.

(Effect of Pattern Defect (1))

Figure 3:
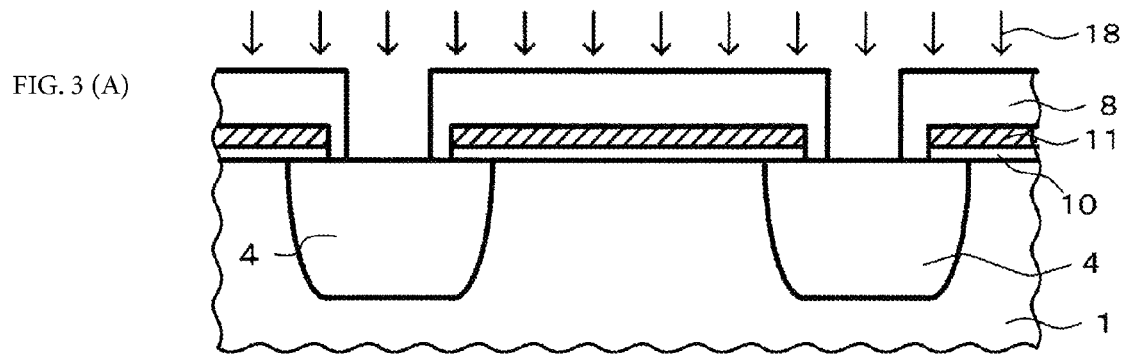
FIG. 3 (A)-FIG. 3 (D) are cross-sectional views illustrating a method of manufacturing a semiconductor device according to an embodiment of the present invention.
Figure 3:
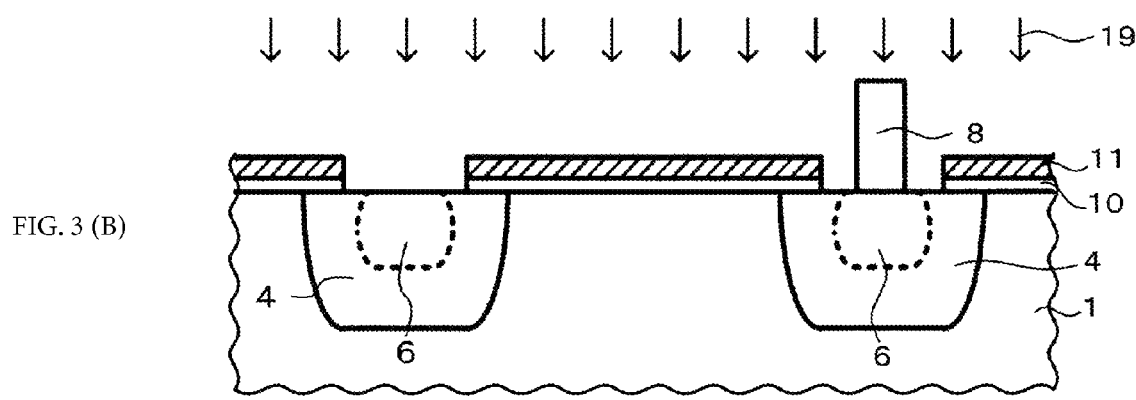
Figure 3:
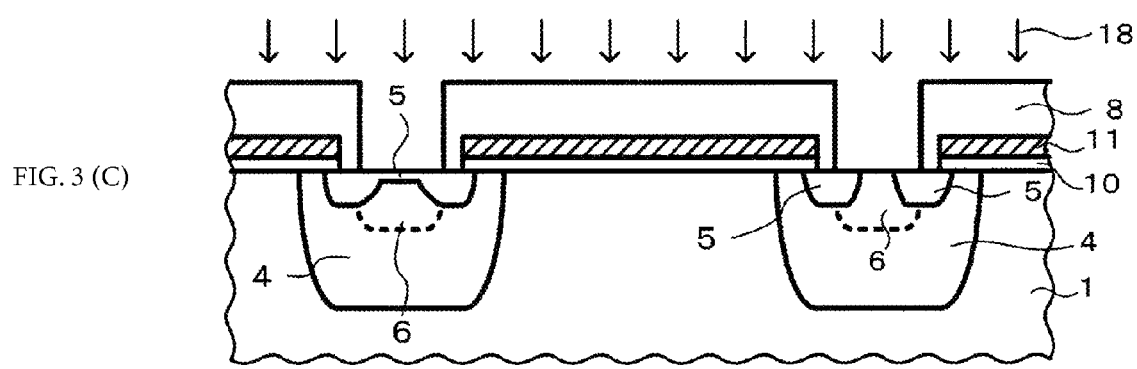
Figure 3:
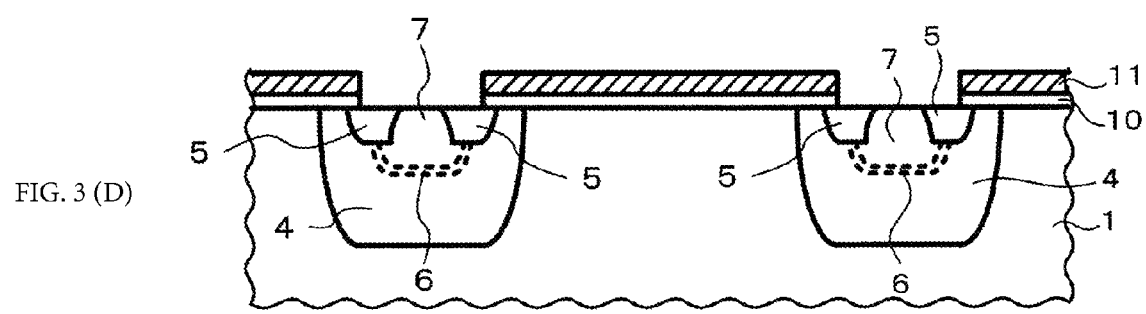

First, the aforementioned pattern defect (2), that is, the case where the p-type contact layer 6 is formed or the unnecessary n-type source layer 5 is formed at a site where the p-type contact layer 6 has been formed is described with reference to FIG. 3. FIG. 3 is a cross-sectional view illustrating a method of manufacturing a semiconductor device according to an embodiment of the present invention. FIGS. 3(A) to 3(D) are cross-sectional views illustrating a sequence of processes in the case where the pattern defect (2) occurs in the manufacturing method according to the first embodiment. Herein, FIG. 3(A) to FIG. 3(D) of the sequence (flow) of the processes are the same as those of FIG. 2, and thus, the description is concentrated on the different points.

As illustrated in FIG. 3(A), after the p-type base layer 4 is formed, in order to form the p-type contact layer 6, the resist 8 is patterned, and the boron ion implantation 18 is performed by using the resist 8 as a mask. Subsequently, as illustrated in FIG. 3(B), the arsenic ion implantation 19 is performed by using the resist 8 as a mask. At this time, it is assumed that, the resist 8 is exposed, so that the resist 8 which is to remain is not left on the p-type base layer 4 on the left side of the figure.

As an example of the reason of the excessive exposure, there is a case where an omission portion exists in a light blocking layer made of chromium or the like on a mask. Otherwise, there is also a case where extrinsic materials (particles, waste, or the like) are located on an upper portion of the resist 8 of the p-type base layer 4 during the application of the resist, so that the resist 8 does not remain on the semiconductor substrate. Therefore, arsenic ions are introduced over the entire opening portion of the polysilicon electrode 11 in the left-side p-type base layer 4. Since the arsenic is larger than the boron in mass and is shorter (shallower) in the range, after the thermal treatment, the n-type source layer 5 is formed on the entire outer surface thereof (refer to FIG. 3(C)).

Subsequently, as illustrated in FIG. 3(C), the resist 8 is patterned, and the boron ion implantation 18 is performed in a predetermined region of the aforementioned p-type base layer 4. The n-type source layer 5 formed on the entire opening portion of the polysilicon electrode 11 of the left-side p-type base layer 4 is cancelled by the implanted boron, and as illustrated in FIG. 3(D), similarly to the right-side p-type base layer 4, the p-type counter layer 7 is formed. In this manner, the p-type counter layer is newly introduced, so that even in the case where the p-type contact layer 6 is formed or unnecessary donors (arsenic or the like) are induced at a site where the p-type contact layer 6 has been formed, the n-type source layer 5 can be cancelled by the p-type counter layer 7.

Figure 6:
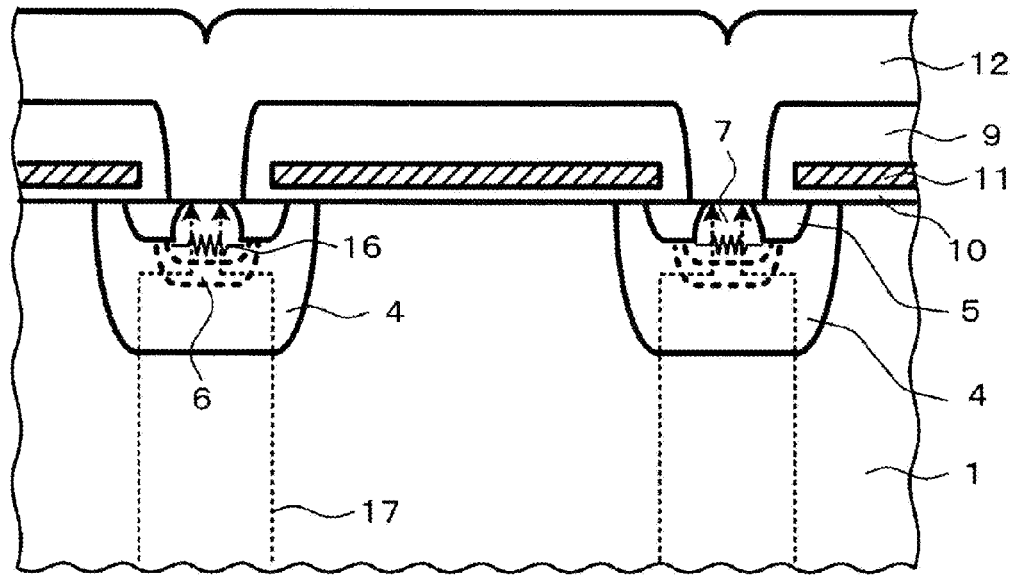
FIG. 6 (A)-FIG. 6 (B) are cross-sectional views illustrating a method of manufacturing a semiconductor device and an operational principle thereof according to an embodiment of the present invention.
Figure 6:
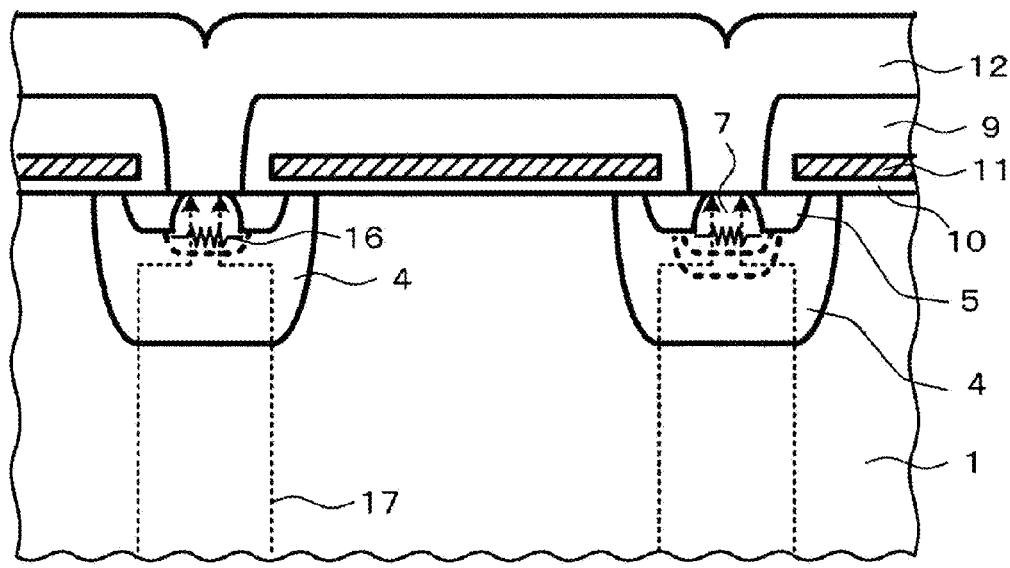

How the resistance of the path of the hole current is lowered by allowing the unnecessary n-type source layer to be cancelled by the p-type counter layer will be described with reference to FIG. 6. FIG. 6 is a cross-sectional view illustrating a method of manufacturing a semiconductor device according to an embodiment of the present invention and an operational principle thereof. FIG. 6 illustrates the hole flows and the resistance components of the p-type base layer in the tuned-on and turned-off states of the IGBT according to the first embodiment of the present invention.

FIG. 6(A) illustrates the case where the p-type counter layer is introduced into the pattern defect (1). As described above in FIG. 31(A), in the case of the related art where the p-type counter layer 7 is not introduced, the unnecessarily-formed n-type source layer 5 remains slightly in the opening portion of the polysilicon electrode 11 of the surface of the p-type base layer 4. However, in FIG. 6(A), as illustrated in FIGS. 2(C) and 2(D), the p-type counter layer 7 is also formed in the left-side p-type base layer 4. Therefore, the necessarily-introduced n-type source layer 5 is cancelled to be removed, so that the p-type high concentration layer can be further formed.

Accordingly, since the hole flow 17 passes through the p-type counter layer 7, the resistance component 16 when flowing from the portion just below the n-type source layer 5 to the emitter electrode 12 is lowered. Therefore, the voltage drop of the portion just below the n-type source layer 5 involved in the hole flow 17 is decreased, so that it is possible to prevent the occurrence of the latch-up. The p-type base layer 4 on the left side of FIG. 6(A) may be configured in the same structure as that of the normal p-type base layer 4 (on the right side of FIG. 6(A)) where the unnecessary n-type source layer 5 is not introduced.

Herein, the condition that when the p-type counter layer 7 is introduced, the unnecessary n-type source layer 5 is cancelled by the p-type counter layer 7 in the p-type base layer 4 on the left sides of FIGS. 3(C) and 3(D) is as follows. Namely, a sum of the total doping amount per unit area of the p-type contact layer 6 and the total doping amount per unit area of the p-type counter layer 7 may be larger than the total doping amount per unit area of the n-type source layer 5. More preferably, the sum may be twice or larger.

(Effect of Pattern Defect (2))

Figure 4:
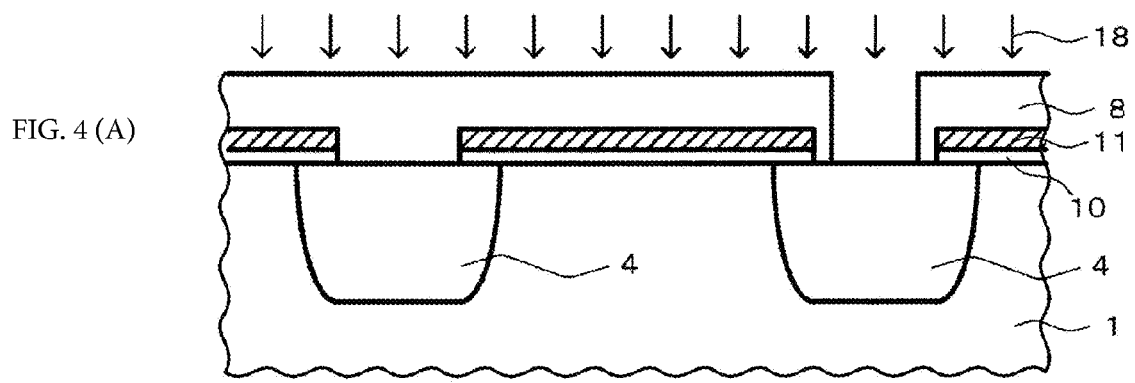
FIG. 4 (A)-FIG. 4 (D) are cross-sectional views illustrating a method of manufacturing a semiconductor device according to an embodiment of the present invention.
Figure 4:
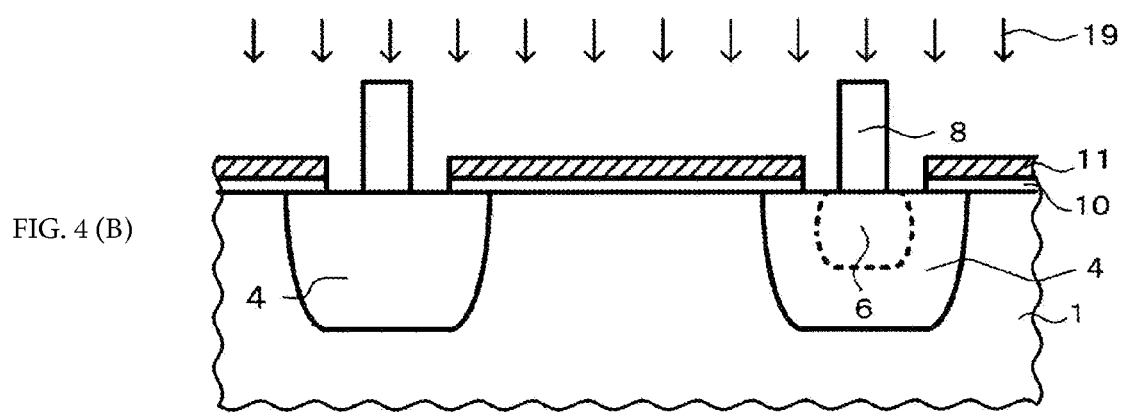
Figure 4:
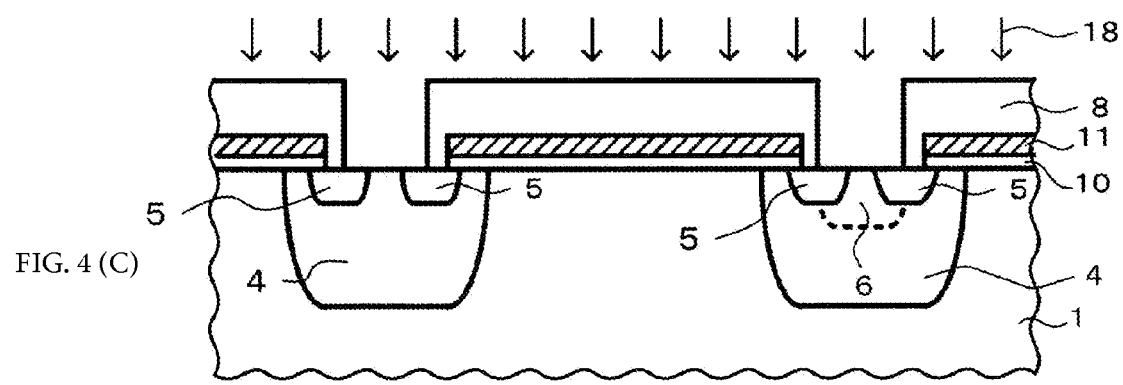
Figure 4:
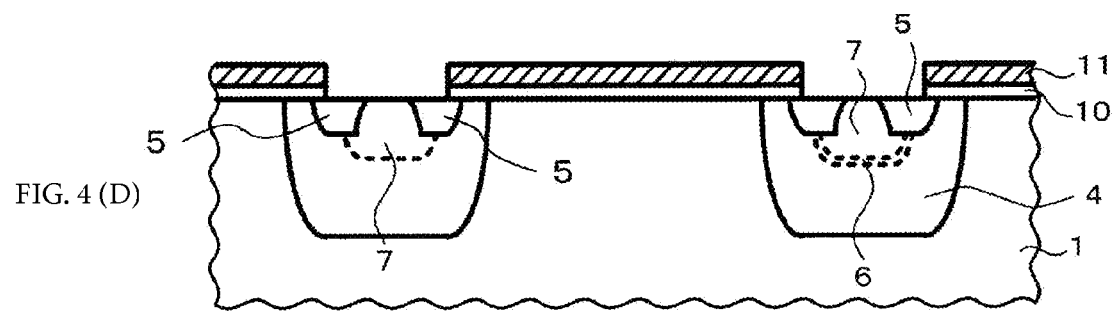

Next, the aforementioned pattern defect (2), that is, the case where the p-type contact layer 6 is omitted at the site where the n-type source layer is not to be originally introduced will be described with reference to FIG. 4. FIG. 4 is a cross-sectional view illustrating a method of manufacturing a semiconductor device according to an embodiment of the present invention. FIG. 4(A) to FIG. 4(D) illustrate a sequence of processes in the case where the pattern defect (2) occurs in the manufacturing method according to the first embodiment.

As illustrated in FIG. 4(A), after the p-type base layer 4 is formed, in order to form the p-type contact layer 6, the resist 8 is applied, and patterning is performed. At this time, it is assumed that the resist 8 is not exposed to and removed from the p-type base layer 4 on the left side of the figure. As an example of the reason of non-exposure, there is a case where omission exists in a light blocking layer made of chromium or the like on a mask or extrinsic materials (particles, waste, or the like) are located on an upper portion of the resist 8 of the p-type base layer 4 during the exposure, so that light is blocked.

In this state, the boron ion implantation 18 is performed by using the resist 8, which is obtained after the baking, as a mask. Therefore, as illustrated in FIG. 4(B), boron is introduced only into the p-type base layer 4 on the right side of FIG. 4(B), so that the p-type contact layer 6 is formed; and the p-type contact layer 6 is not formed in the p-type base layer 4 on the left side of FIG. 4(B).

Subsequently, the arsenic ion implantation 19 is performed by using the resist 8 as a mask. In this step, a p-type layer having a concentration higher than that of the left-side p-type base layer is not formed in the left-side p-type base layer. Herein, as illustrated in FIG. 4(C), the resist 8 is applied and patterned; the boron ion implantation 18 is performed by using the resist 8 as a mask; and after the resist is removed, thermal treatment is performed, so that the p-type counter layer 7 is formed in each of the left-side and right-side p-type base layers 4 as illustrated in FIG. 4(D). In other words, in the step of FIG. 4(A), although the boron of the p-type contact layer 6 is not introduced into the left-side p-type base layer 4, since the boron is introduced in this process, the p-type counter layer 7 may be formed to have a concentration higher than that of the p-type base layer 4 in the left-side p-type base layer 4 of FIG. 4.

How the latch-up can be prevented by newly introducing the p-type counter layer 7 into a site where the p-type contact layer 6 is not formed at the site where the p-type contact layer 6 is to be originally formed will be described with reference to FIG. 6 described above. The case where the p-type counter layer 7 is introduced into the pattern defect (2) corresponds to FIG. 6(B).

As described in FIG. 31(B), in the semiconductor device of the related art, in the case where the p-type contact layer 6 is omitted, since the acceptors in the path of the hole flow 17 are generated at the concentration corresponding to only the p-type base layer 4, the resistance component 16 is greatly increased. On the other hand, in the case of the first embodiment of the present invention, as illustrated in FIGS. 4(C) and 4(D), the boron is introduced through the ion implantation at the site where the p-type contact layer 6 is omitted (the surface of the left-side p-type base layer 4), so that the p-type counter layer 7 is formed. Therefore, as illustrated in FIG. 6(B), the resistance component 16 of the path of the hole flow 17 is decreased, so that the latch-up can be prevented.

Herein, the condition necessary for allowing the concentration of the p-type counter layer 7 to be equal to or higher than that of the p-type contact layer 6, and achieving the effect of latch-up prevention when introducing the p-type counter layer 7 will be described.

First, the sheet resistance per unit area of the p-type contact layer 6 needs to be sufficiently low when the hole current flows. During the turned-on or turned-off, the hole current of, for example, about 1000 A/cm$^2$ flows just below the n-type source layer 5. At this time, for example, the length (the length in the horizontal direction of the paper) of the n-type source layer 5 is set to 1 μm; the width thereof (the length in the vertical direction of the paper) is set to 300 μm; and the area of the region where the MOS gate operates is set to 0.01 cm$^2$.

If the voltage drop due to the hole current two-dimensionally conducting the portion just below the n-type source layer 5 needs to be 0.7 V or less, the sheet resistance of the conductive region needs to be lower than at least 0.7 (V)/(0.5E-4 (cm)/300E-4 (cm))×1000 (A/cm$^2$)×0.01 (cm$^2$)= 42 (Ω/). If the sheet resistance is changed to the acceptor concentration per unit area, the sheet resistance needs to be 4.596E15/42≅1.1E14/cm$^2$ or more. In other words, the concentration per unit area (total amount) of the p-type counter layer needs be at least the value (1.1E14/cm$^2$) or more.

In general, since the total amount per unit area of the p-type contact layer 6 is set to have margin so as to be larger than the calculated value, the total amount per unit area is set to for example, $1.0E15/cm^2$ or more corresponding to 10 times the value. Since the introduction of the p-type counter layer 7 is also measures to cope with the omission of the p-type contact layer 6 (pattern defect (2)), the total amount needs to be at least 10% (1/10) of the total amount of the p-type contact layer 6, that is, to be larger than $1.1E14/cm^2$ described above. More preferably, the total amount of the p-type counter layer 7 is $1.0E15/cm^2$ or more, that is, it is larger than the total amount of the p-type contact layer 6.

Figure 7:
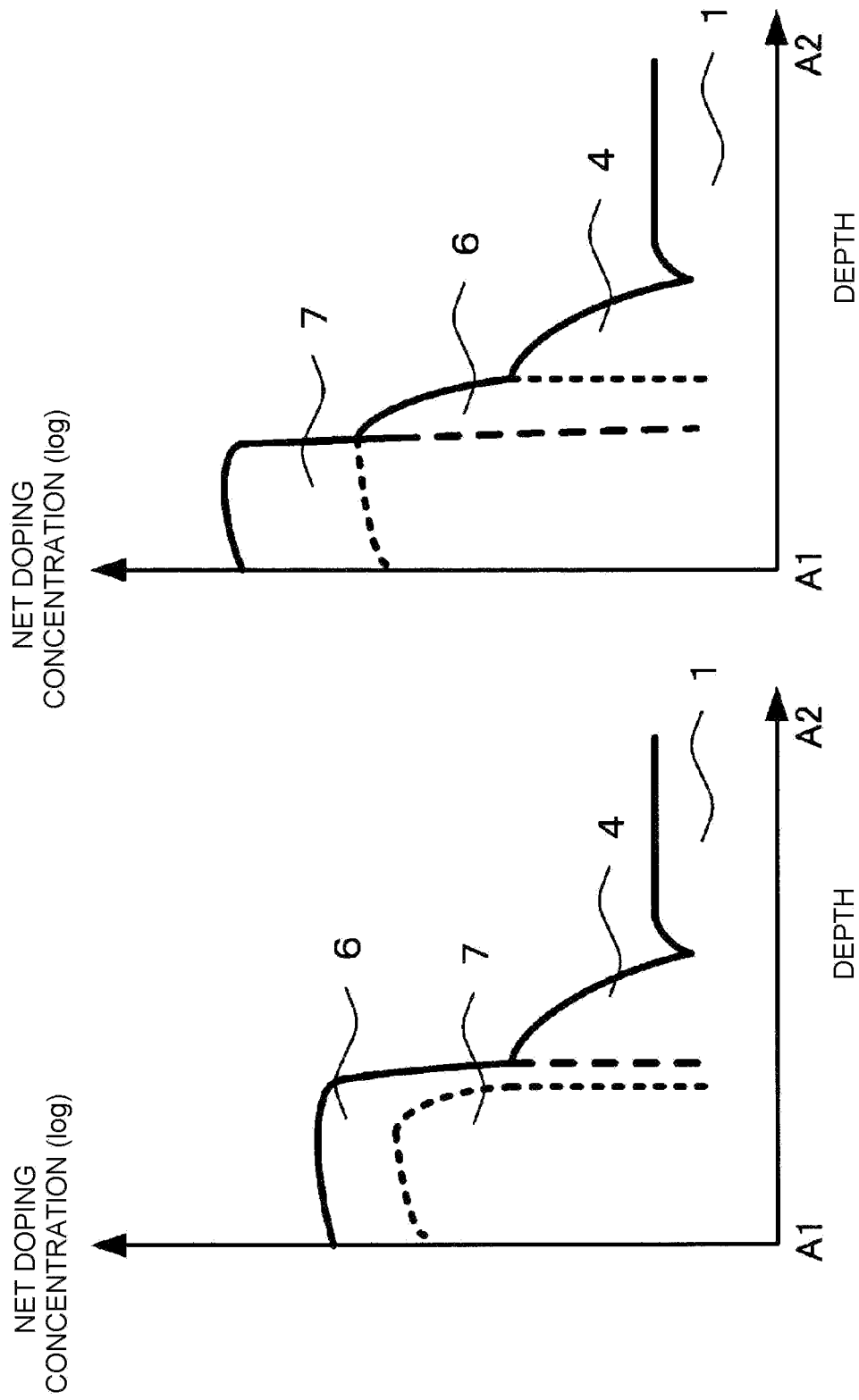
FIG. 7 (A)-FIG. 7 (B) are concentration distribution diagrams illustrating a net doping concentration of a semiconductor device according to an embodiment of the present invention.

Schematic diagrams of the net doping concentration in the conditions described hereinbefore are illustrated in FIG. 7. FIG. 7 is a concentration distribution diagram illustrating a net doping concentration of a semiconductor device according to an embodiment of the present invention. FIG. 7 illustrates the net doping concentration distribution on the cross section taken along cutting line A1-A2 illustrated in FIG. 1. In FIG. 7, the net doping concentration on the vertical axis is scaled in logarithm.

For example, in the case where the total amount of the p-type counter layer 7 is 0.1 (10%) of the total amount of the p-type contact layer 6, as illustrated in FIG. 7(A), the p-type counter layer 7 is shallower than the p-type contact layer, and the maximum concentration thereof is lowered. Therefore, in the depth direction, the entire portion of the p-type counter layer 7 is included in the p-type contact layer 6.

It is preferable that the concentration of the p-type counter layer 7 be equal to or larger than at least the concentration in the concentration distribution. More preferably, the total amount of the p-type counter layer 7 may be equal to or larger than the total amount of the p-type contact layer 6. Although not shown, at this time, the concentration distribution of the p-type counter layer 7 is almost equal to that of the p-type contact layer 6, and the distribution is slightly shallower in shape. More preferably, the total amount of the p-type counter layer 7 may be equal to or larger than twice the total amount of the p-type contact layer 6.

Accordingly, for example, as illustrated in FIG. 7(B), the net doping concentration distribution of the p-type counter layer 7 is shallower and higher than the concentration distribution of the p-type contact layer 6. In addition, in the case where the total amount of the p-type counter layer 7 is larger than the total amount of the p-type contact layer 6, the depth may also be slightly increased. In summary, if the site where the p-type contact layer 6 is omitted is compensated or the concentration of the unnecessary n-type source layer 5 is cancelled, the object of the present invention can be achieved.

In addition, the manufacturing method for actually implementing the total amount of the p-type counter layer 7 involved in the relation to the p-type contact layer 6 may be configured as follows. At the finishing time of the manufacturing, the total amount of each p-type layer is almost equal to the dose of the boron ion implantation. Therefore, the dose of the boron ion implantation 18 in the formation of the p-type counter layer 7 in FIG. 4(C) may be larger than 0.1 times the dose of the boron ion implantation 18 in the formation of the p-type contact layer 6 in FIG. 4(A).

Preferably, the dose of the boron ion implantation (refer to the arrow 18 in FIG. 4(C)) in the formation of the p-type counter layer 7 in FIG. 4(C) may be larger than the dose of the boron ion implantation (refer to the arrow 18 in FIG. 4(A)) in the formation of the p-type contact layer 6. More preferably, the dose of the boron ion implantation (refer to the arrow 18 in FIG. 4(C)) in the formation of the p-type counter layer 7 in FIG. 4(C) may be larger than twice the dose of the boron ion implantation (refer to the arrow 18 in FIG. 4(A)) in the formation of the p-type contact layer 6.

In this manner, although the site where the p-type contact layer 6 is omitted is formed as described above, the acceptors can be secured with a sufficient concentration at the site, and thus, the resistance of the portion just below the n-type source layer 5 is decreased, so that it is possible to obtain the effect of preventing the latch-up.

(Effect of Pattern Defect (3))

Figure 5:
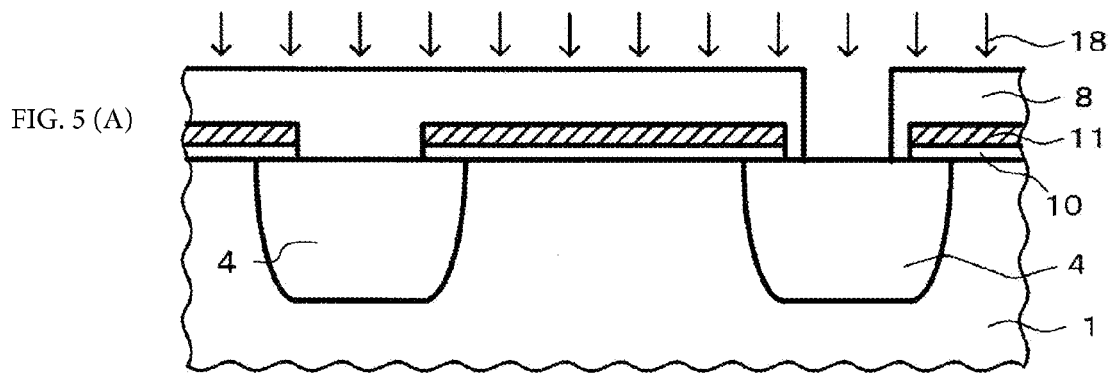
FIG. 5 (A)-FIG. 5 (D) are cross-sectional views illustrating a method of manufacturing a semiconductor device according to an embodiment of the present invention.
Figure 5:
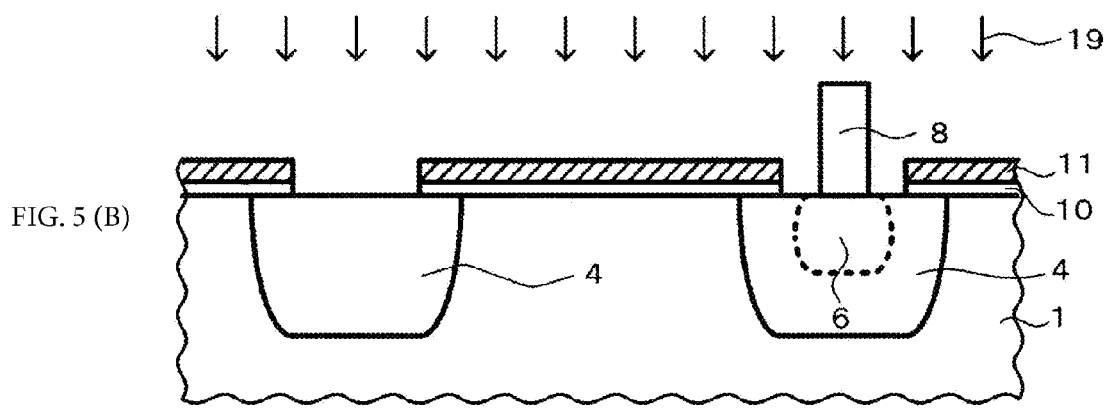
Figure 5:
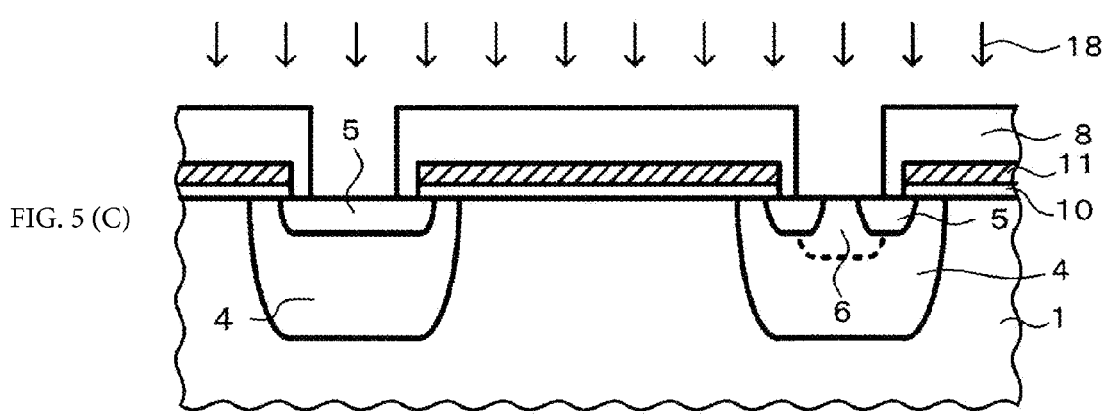
Figure 5:
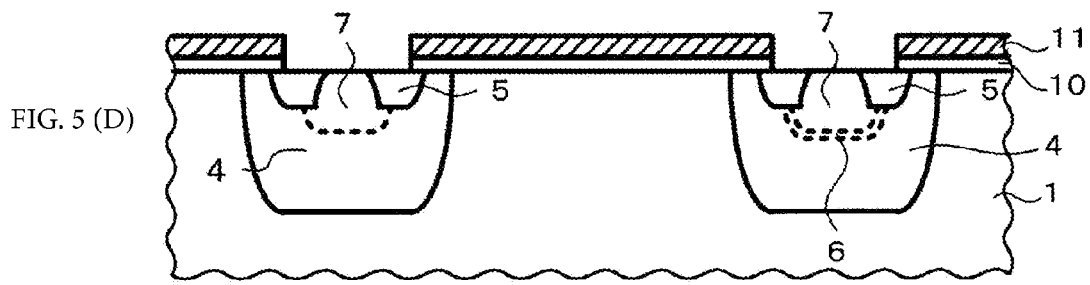

Next, the aforementioned pattern defect (3), that is, the case where the pattern defects (1) and (2) simultaneously occur locally will be described with reference to FIG. 5. FIG. 5 is a cross-sectional view illustrating a method of manufacturing a semiconductor device according to an embodiment of the present invention. Although the occurrence frequency of the pattern defect (3) is much lower than those of the pattern defects (1) and (2), the pattern defect (3) may occur sufficiently frequently. FIGS. 5(A) to 5(D) are cross-sectional views illustrating a sequence of processes in the case where the pattern defect (3) occurs in the manufacturing method according to the first embodiment.

As illustrated in FIG. 5(A), after the p-type base layer 4 is formed, in order to form the p-type contact layer 6, the resist 8 is applied, and patterning is performed. At this time, it is assumed that the resist 8 on the p-type base layer 4 on the left side of FIG. 5(A) is not exposed, and the resist 8 is not removed. The reason of non-exposure is the same as described above.

Subsequently, as illustrated in FIG. 5(B), the arsenic ion implantation 19 is performed by using the resist 8 as a mask. At this time, it is assumed that, to the p-type base layer 4 on the left side of FIG. 5(B), the resist 8 is exposed, and the resist 8 which is to remain does not remain. The reason of the excessive exposure is the same as described above. Therefore, arsenic ions are introduced into the entire opening portion of the polysilicon electrode 11 in the left-side p-type base layer 4. After the thermal treatment, as illustrated in FIG. 5(C), the n-type source layer is formed on the entire outer surface thereof. In addition, in this step, a p-type layer having a concentration higher than that of the left-side p-type base layer 4 is not formed in the left-side p-type base layer 4 of FIG. 5(C).

Herein, as described above, the resist 8 is applied and patterned; the boron ion implantation (refer to the arrow 18 in FIG. 5(C)) is performed by using the resist 8 as a mask; and thermal treatment is performed, so that the p-type counter layer 7 is formed in each of the left-side and right-side p-type base layers 4. In other words, in the step of FIG. 5(A), although the boron of the p-type contact layer 6 is not introduced into the left-side p-type base layer 4, the boron is introduced in this process, so that the p-type counter layer 7 having a concentration higher than that of the p-type base layer 4 is formed.

In this manner, the pattern defect (3) can be prevented by newly introducing the p-type counter layer 7. In addition, how the resistance component 16 in the path of the hole flow 17 is decreased by the p-type counter layer 7 is the same as that of the case of the aforementioned pattern defect (2), and thus, the description thereof is not repeated. In this manner, as a result of the formation of the p-type counter layer 7, it is possible to prevent the occurrence of latch-up in the pattern defect (3).

In addition, as a preferred condition in the first embodiment of the present invention, the total amount of the p-type counter layer 7 may be larger than the total amount of the n-type source layer 5. In the case of the aforementioned pattern defect (3), in order to compensate for the concentration of the n-type source layer 5 to be cancelled by the p-type counter layer, the concentration of the p-type counter layer is maintained to be higher than that of the n-type source layer 5 in the outermost layer of the p-type base layer 4. In addition, the n-type source layer 5 needs to be cancelled in the depth direction as well as the outermost layer in the same region.

Therefore, for this reason, the total amount of the p-type counter layer 7 may be larger than the total amount of the n-type source layer 5. In this case, on the surface of the p-type base layer 4, the region where the p-type counter layer 7 is to be formed may be configured to be narrow so as to overlap not the entire portion but a portion of the region where the n-type source layer 5 is to be formed. The reason is that, if the p-type counter layer 7 of which the total amount is larger than the total amount of the n-type source layer 5 is formed in the region where the n-type source layer 5 is to be originally formed, the n-type source layer 5 disappears.

Figure 8:
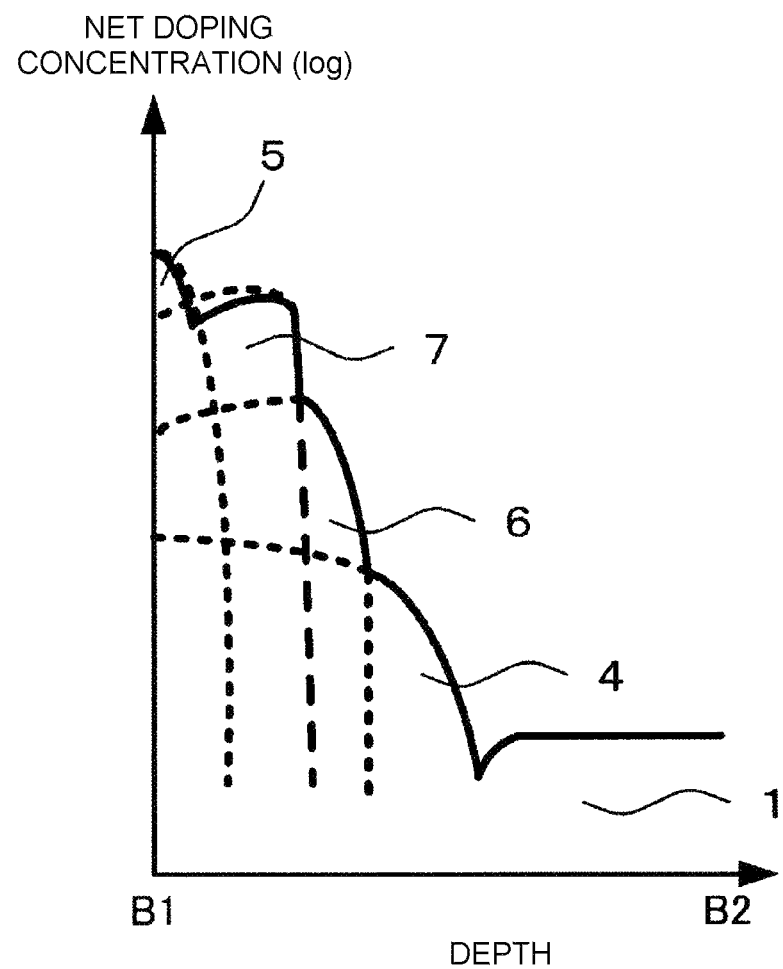
FIG. 8 is a concentration distribution diagram illustrating a net doping concentration of a semiconductor device according to an embodiment of the present invention.

In addition, another method for allowing the n-type source layer 5 not to disappear will be described with reference to FIG. 8. FIG. 8 is a concentration distribution diagram illustrating a net doping concentration of a semiconductor device according to an embodiment of the present invention. FIG. 8 illustrates a schematic diagram of the net doping concentration distribution on the cross section taken along cutting line B1-B2 illustrated in FIG. 1 in the IGBT as a semiconductor device according to the first embodiment.

As illustrated in FIG. 8, preferably, at the position of the cutting line B1-B2, that is, the region where the n-type source layer 5 is to be originally formed, the surface of the n-type source layer 5 may not be cancelled by the p-type counter layer 7. For example, preferably, the p-type counter layer 7 in the region is not an ion implantation region but a transverse diffusion portion slightly protruding from the implantation region.

Alternatively, with respect to the range Rp of the boron ion implantation 18 for the formation of the p-type counter layer 7, the depth obtained by subtracting a standard deviation ΔRp from the Rp may be preferably configured to be larger than the range Rp of the arsenic in the n-type source layer 5. The range Rp of the p-type counter layer 7 and the range of the n-type source layer 5 are configured using the above relation, so that it is possible to suppress the cancellation of the net doping concentration of the n-type source layer 5 by the boron of the p-type counter layer 7.

Figure 25:
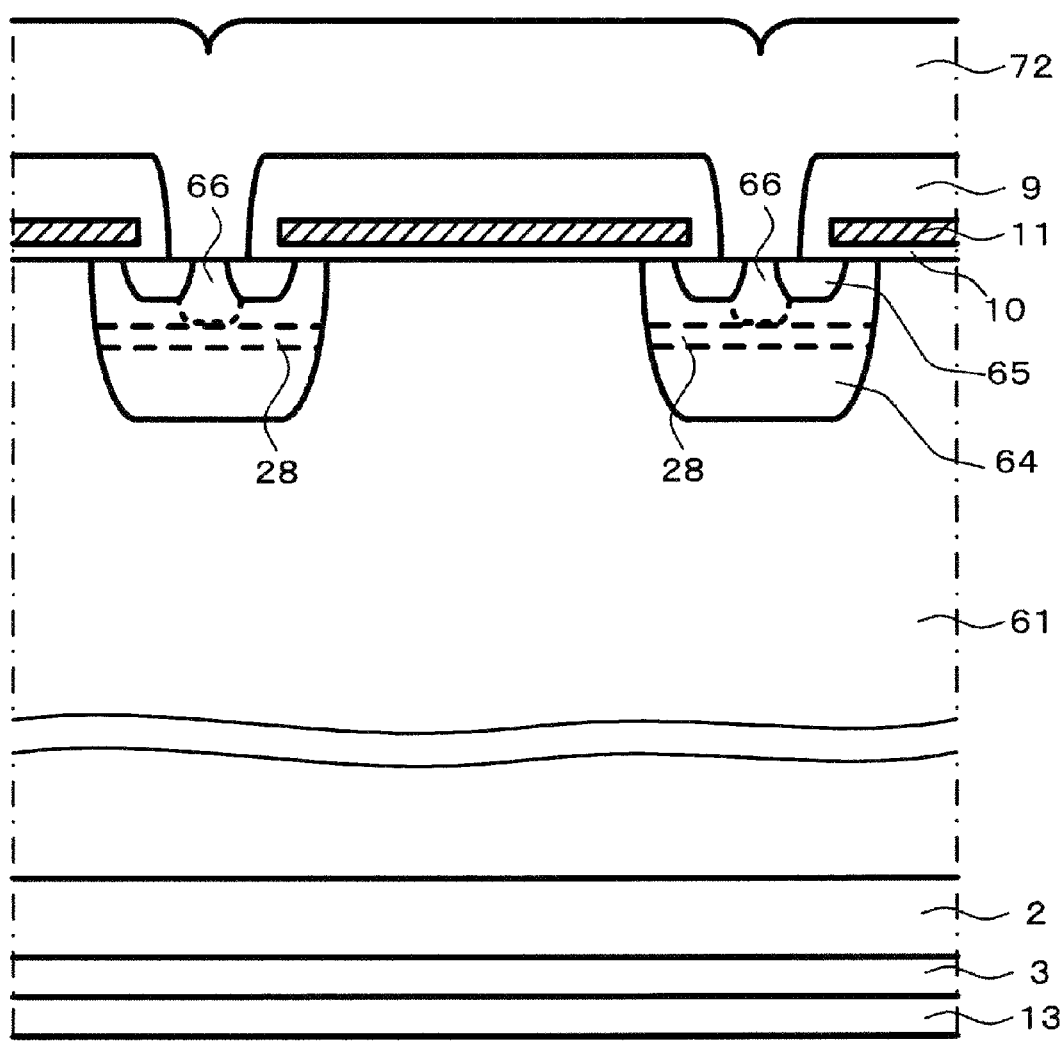
FIG. 25 is a cross-sectional view illustrating main components of a semiconductor device in the related art.

In addition, in comparison with the structure illustrated in FIG. 25, the p-type counter layer according to the present invention is formed so as to be in contact with the n-type source layer 5 and so as for a portion thereof to overlap the p-type contact layer. Therefore, in the case where the p-type contact layer 6 is omitted and the unnecessary n-type source layer 5 is formed, such a preventing effect can be obtained.

Figure 27:
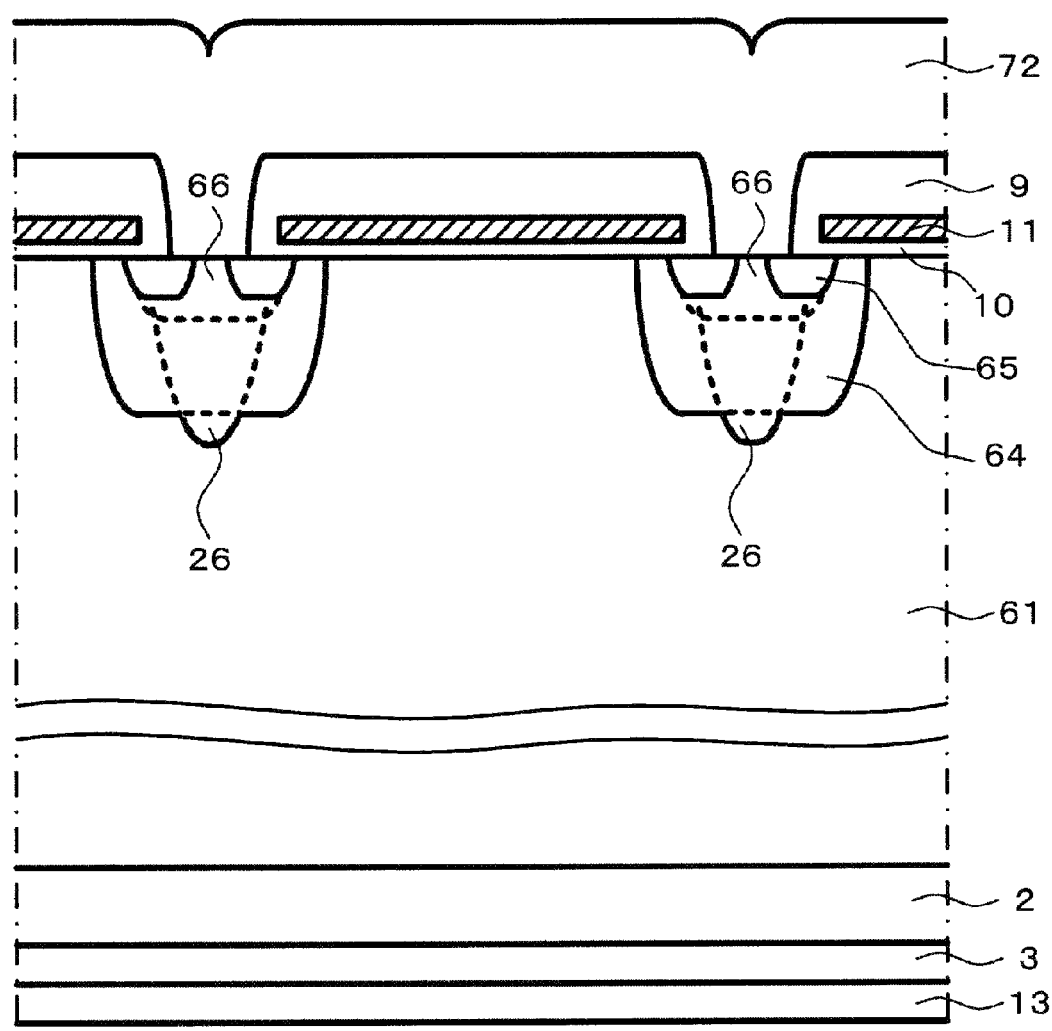
FIG. 27 is a cross-sectional view illustrating main components of a semiconductor device in the related art.
Figure 30:
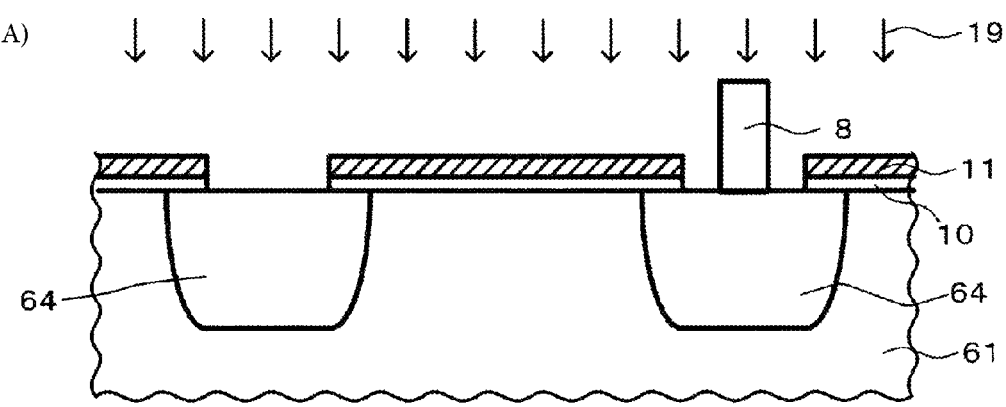
FIG. 30 (A)-FIG. 30 (C) are cross-sectional views illustrating a method of manufacturing a semiconductor device in the related art.
Figure 30:
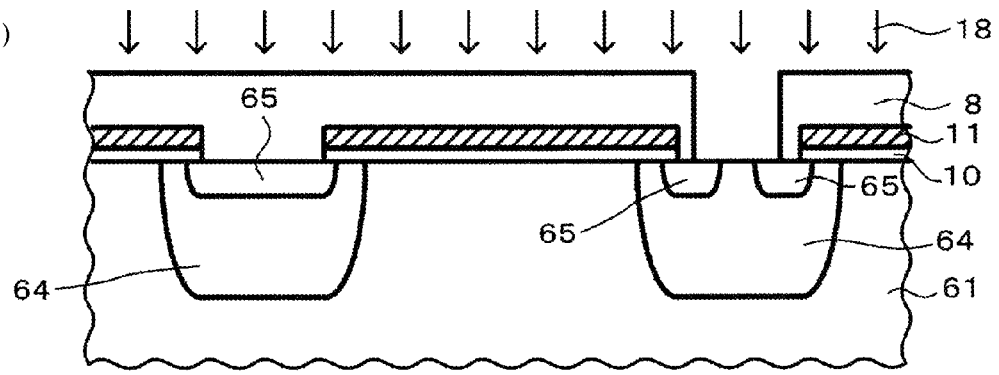
Figure 30:
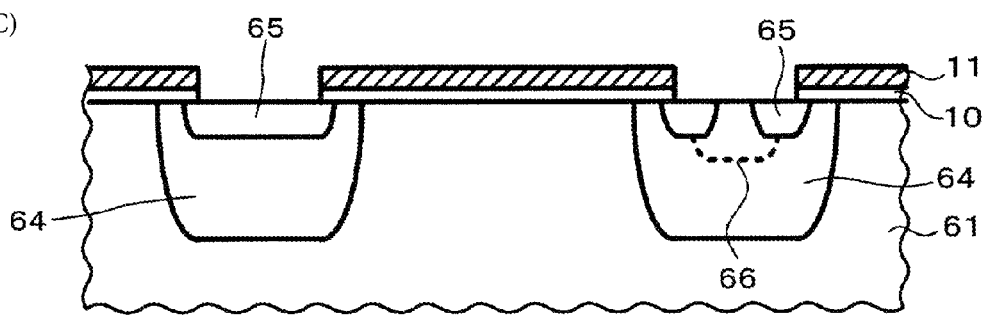

In addition, in comparison with the structure illustrated in FIG. 27, the p-type counter layer 7 is formed to be shallower than the p-type base layer 4, so that the region having sufficiently low sheet resistance can be formed in the portion just below the n-type source layer 5 as described above. In addition, as described above, in the process of deeply diffusing the p-type high concentration layer, the dimension of the MOS gate is reduced, and thus, the diffusion layer such as the p-type base layer becomes shallow, which comes to be against the purpose of miniaturization. Therefore, boron needs to be implanted in the region which is much narrower than the formation region of the p-type base layer 64, and thus, the effect of preventing the latch-up may not be expected.

Second Embodiment

Figure 9:
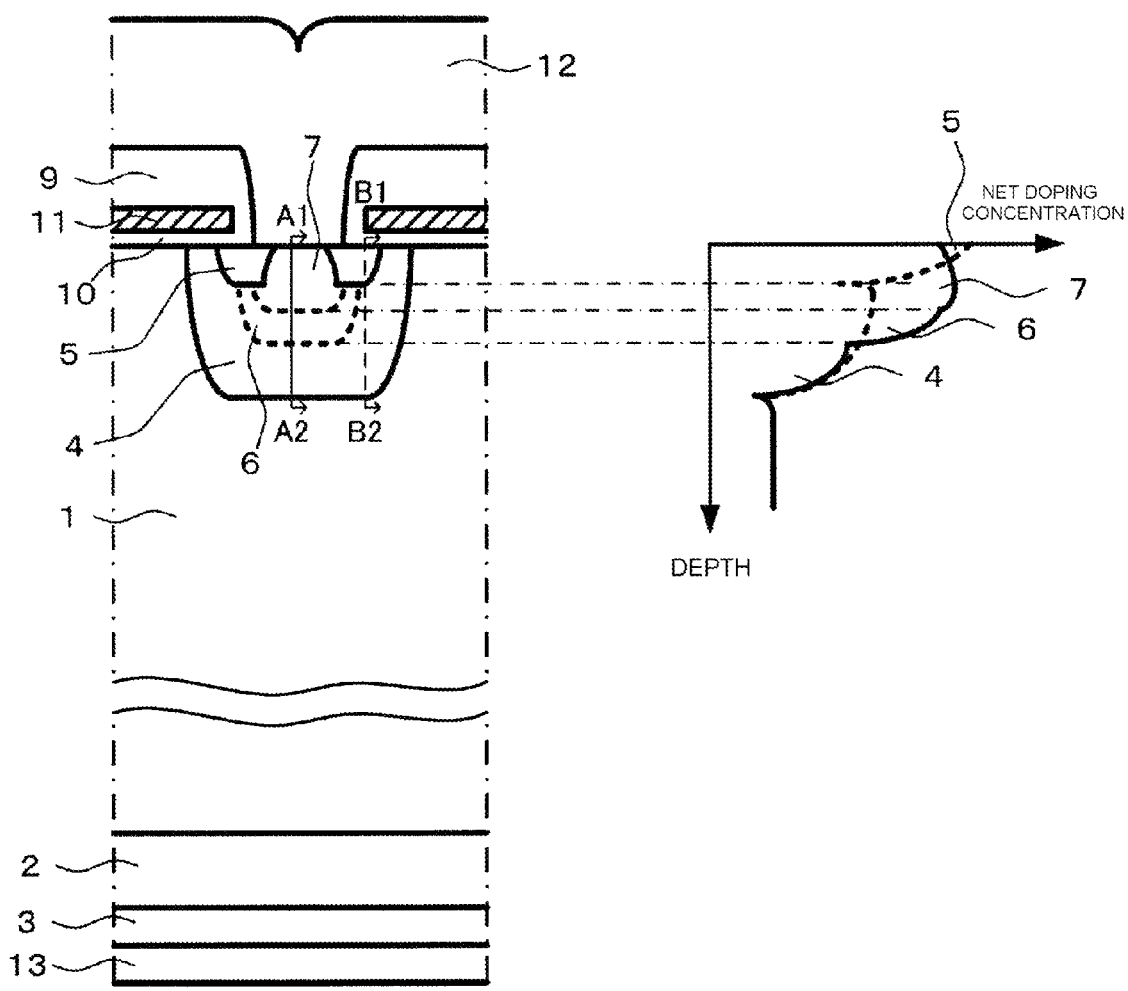
FIG. 9 (A)-FIG. 9 (B) are cross-sectional views illustrating main components of a semiconductor device according to an embodiment of the present invention and a concentration distribution diagram illustrating a net doping concentration of the semiconductor device.

Next, a second embodiment of the present invention will be described with reference to FIG. 9. FIG. 9 is a cross-sectional view illustrating main components of a semiconductor device according to an embodiment of the present invention and a concentration distribution diagram illustrating a net doping concentration of the semiconductor device. FIG. 9(A) illustrates a cross-sectional view of an IGBT as a semiconductor device according to the second embodiment of the present invention, and FIG. 9(B) illustrates net doping concentration distribution along cutting lines A1-A2 and B1-B2 illustrated in FIG. 9(A). In FIG. 9(B), the solid line indicates concentration distribution along the cutting line A1-A2, and the broken line indicates concentration distribution along the cutting line B1-B2.

The feature of the second embodiment is that the p-type counter layer 7 is formed so that the width thereof in the horizontal direction of the paper is almost equal to that of the p-type contact layer 6 and the p-type counter layer 7 is shallower. In the first method of manufacturing the IGBT according to the second embodiment, the photomask for a resist pattern of the boron ion implantation in the formation of the p-type contact layer 6 is the same as the photomask in the p-type counter layer 7.

In the second method of manufacturing the IGBT according to the second embodiment, the acceleration voltage of the boron ion implantation in the p-type counter layer 7 is configured to be low. Alternatively, the acceleration voltage may be configured to be equal, and during the boron ion implantation of the p-type contact layer 6 and the boron ion implantation of the p-type counter layer 7, thermal treatment (for example, maintaining at 1000° C. for 30 minutes) may be inserted.

By forming the p-type counter layer 7 so as to be shallower than the p-type contact layer 6 intentionally, the effect of preventing the pattern defects (1), (2), and (3) can be obtained. Particularly, in the case of the pattern defects (1) and (3), the effect of cancelling the unnecessary n-type source layer 5 formed on the outer surface of the p-type base layer can be improved. Therefore, the omission of the p-type contact layer 6 or the formation of the unnecessary n-type source layer 5 is prevented, so that it is possible to prevent the occurrence of the latch-up.

Third Embodiment

Figure 10:
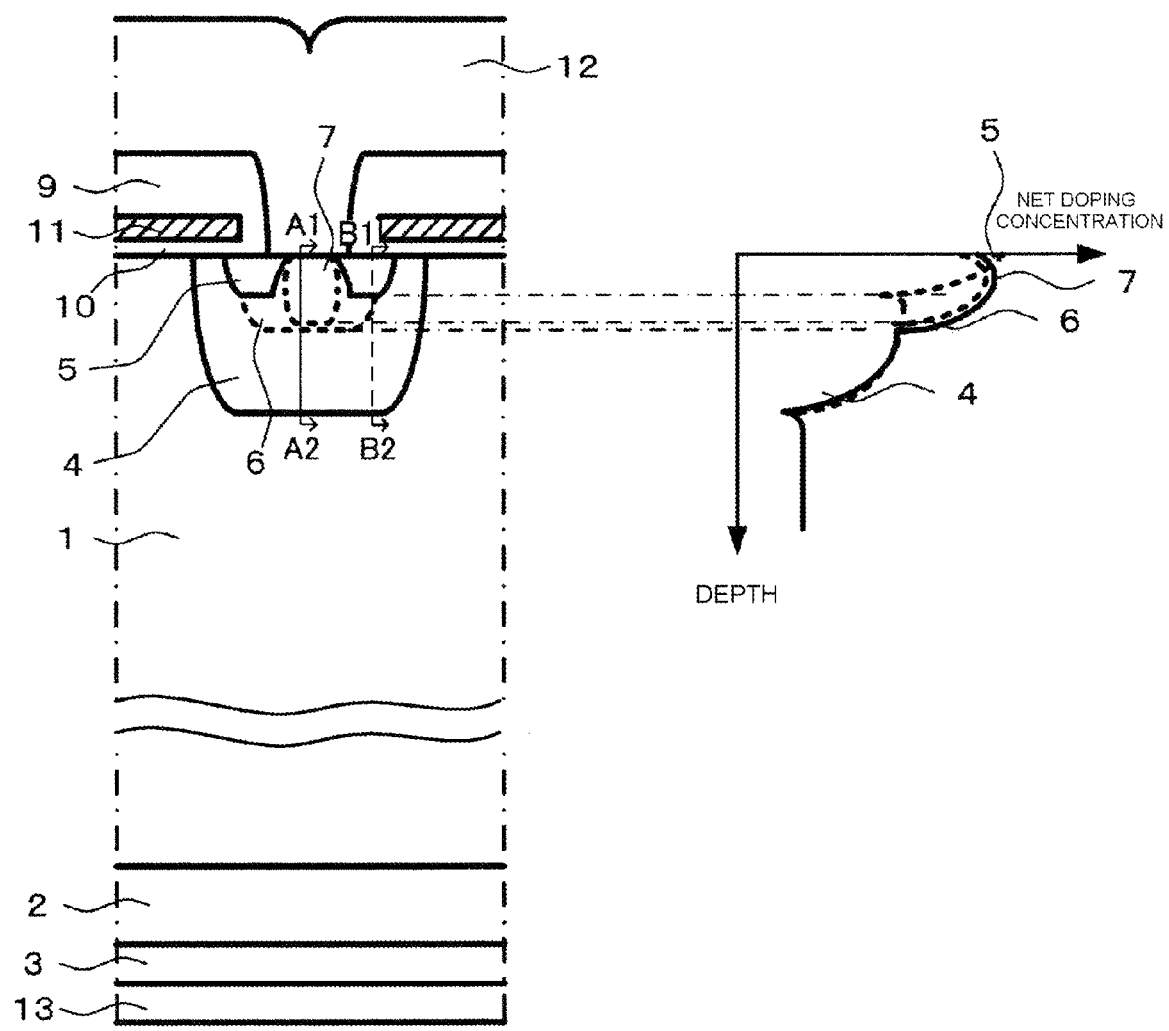
FIG. 10 (A)-FIG. 10 (B) are cross-sectional views illustrating main components of a semiconductor device according to an embodiment of the present invention and a concentration distribution diagram illustrating a net doping concentration of the semiconductor device.

Next, a third embodiment of the present invention will be described with reference to FIG. 10. FIG. 10 is a cross-sectional view illustrating main components of a semiconductor device according to an embodiment of the present invention and a concentration distribution diagram illustrating a net doping concentration of the semiconductor device. FIG. 10(A) illustrates a cross-sectional view of an IGBT according to the third embodiment of the present invention, and FIG. 10(B) illustrates net doping concentration distribution along cutting lines A1-A2 and B1-B2 illustrated in FIG. 10(A). In FIG. 10(B), the solid line indicates concentration distribution along the cutting line A1-A2, and in FIG. 10(B), the broken line indicates concentration distribution along the cutting line B1-B2.

The third embodiment has two features. The first feature of the third embodiment is that the p-type counter layer 7 is formed so that the width thereof in the horizontal direction of the paper is narrower than that of the p-type contact layer 6 and the p-type counter layer 7 and the p-type contact layer 6 are almost equal in depth. The second feature of the third embodiment is that, in the planar distribution of the upper surface of the device, the p-type contact layer 6 and the p-type counter layer 7 are different from each other in the shape of the pattern of the resist mask for ion implantation.

Figure 11:
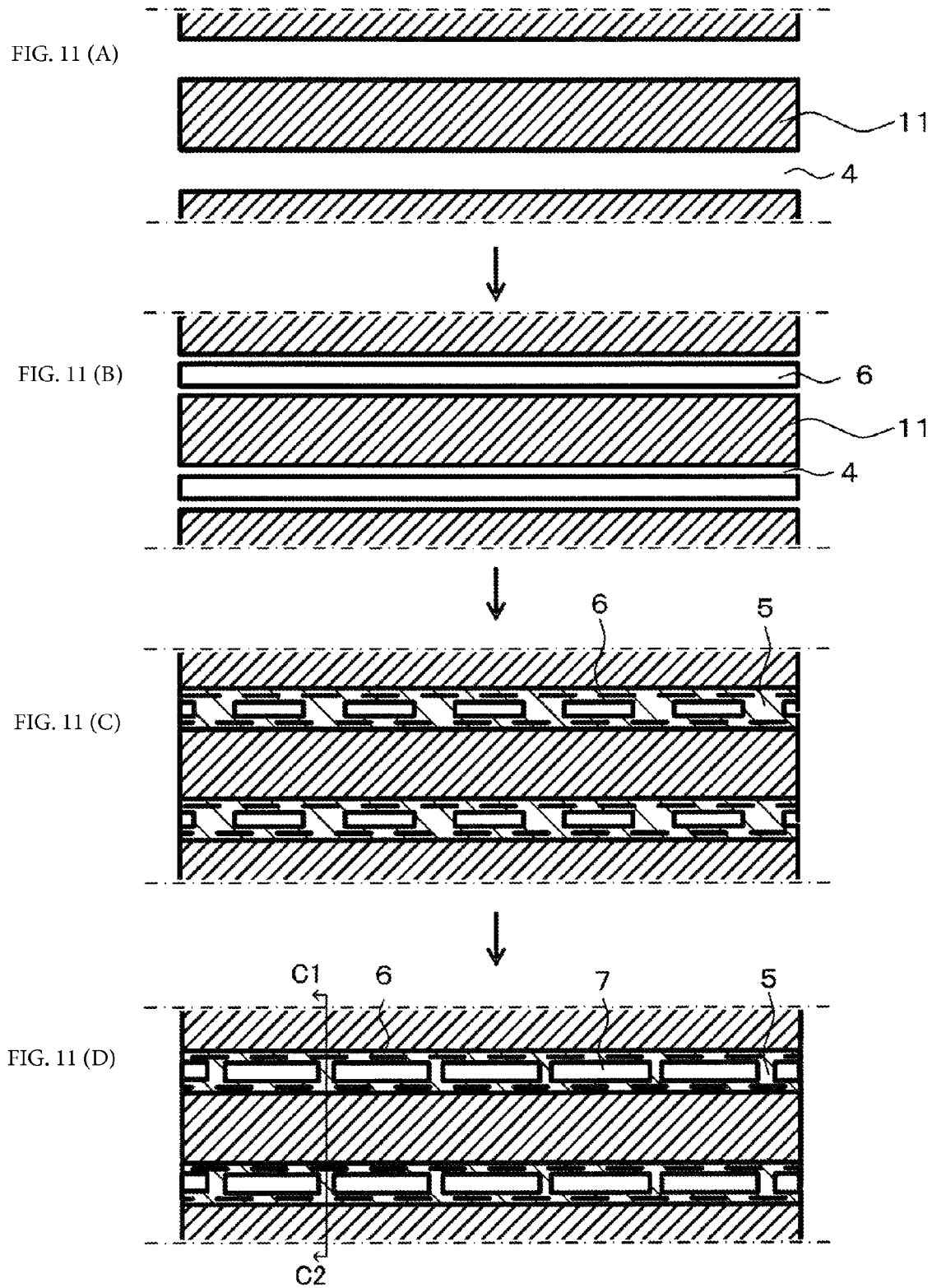
FIG. 11 (A)-FIG. 11 (D) are plan views illustrating a method of manufacturing a semiconductor device according to an embodiment of the present invention.

The method of manufacturing the IGBT according to the third embodiment will be described with reference to FIG. 11. FIG. 11 is a plan view illustrating a method of manufacturing a semiconductor device according to an embodiment of the present invention. FIG. 11 illustrates a plan view illustrating a flow of the processes of manufacturing the IGBT according to the third embodiment, in which a portion of the active region is illustrated to be enlarged. Since the processes performed in (A) to (D) of the flow diagram illustrated in FIG. 11 are almost the same as those of (A) to (D) in FIG. 2 described above, the description is concentrated on the different points of the surface.

First, in the state of FIG. 11(A), with respect to the polysilicon electrode 11 for the gate and the p-type base layer 4, boron ion implantation is performed by using a resist mask, and the p-type contact layer 6 is formed as illustrated in FIG. 11(B). At this time, the opening portion of the resist mask is configured to be separated from the end of the polysilicon electrode 11 in the longitudinal direction.

Subsequently, arsenic ion implantation is performed by using a resist mask, so that the n-type source layer 5 is formed as illustrated in FIG. 11(C). At this time, arsenic is introduced into the aforementioned separated portion. Herein, the n-type source layers 5 are also formed in the transverse direction of (the vertical direction of the paper) of the polysilicon electrodes 11 so as to connect the n-type source layers 5 which are in contact with the polysilicon electrodes 11 adjacent to each other. In this manner, by allowing the n-type source layers 5 to be patterned in a shape of a ladder, the region where the emitter electrode and the n-type source layer 5 after the finishing are securely in contact with each other is increased, so that the effect of reducing contact resistance can be obtained.

Subsequently, boron ion implantation is performed by using a resist mask newly, so that the p-type counter layer 7 is formed as illustrated in FIG. 11(D). At this time, in order that the n-type source layers 5 in a shape of a ladder does not disappear by the compensation of the p-type counter layers 7, a resist mask for the p-type counter layers 7 is also formed in a shape of a ladder, so that boron may not be introduced into the ladder portion of the n-type source layers 5. In addition, at this time, the opening portion of the resist mask is configured to be slightly wider than the opening portion of the n-type source layer 5.

In this manner, on the surface, the shapes of the patterns of the resist masks for ion implantation in the p-type contact layer 6 and the p-type counter layer 7 are changed, so that the sites are provided where the n-type source layer 5 does not disappear due to the p-type counter layer 7. As a result, the n-type source layer 5 having a high concentration can be additionally formed, so that the contact resistance of the n-type source layer 5 and the emitter electrode which is to be formed later can be reduced.

Fourth Embodiment

Figure 12:
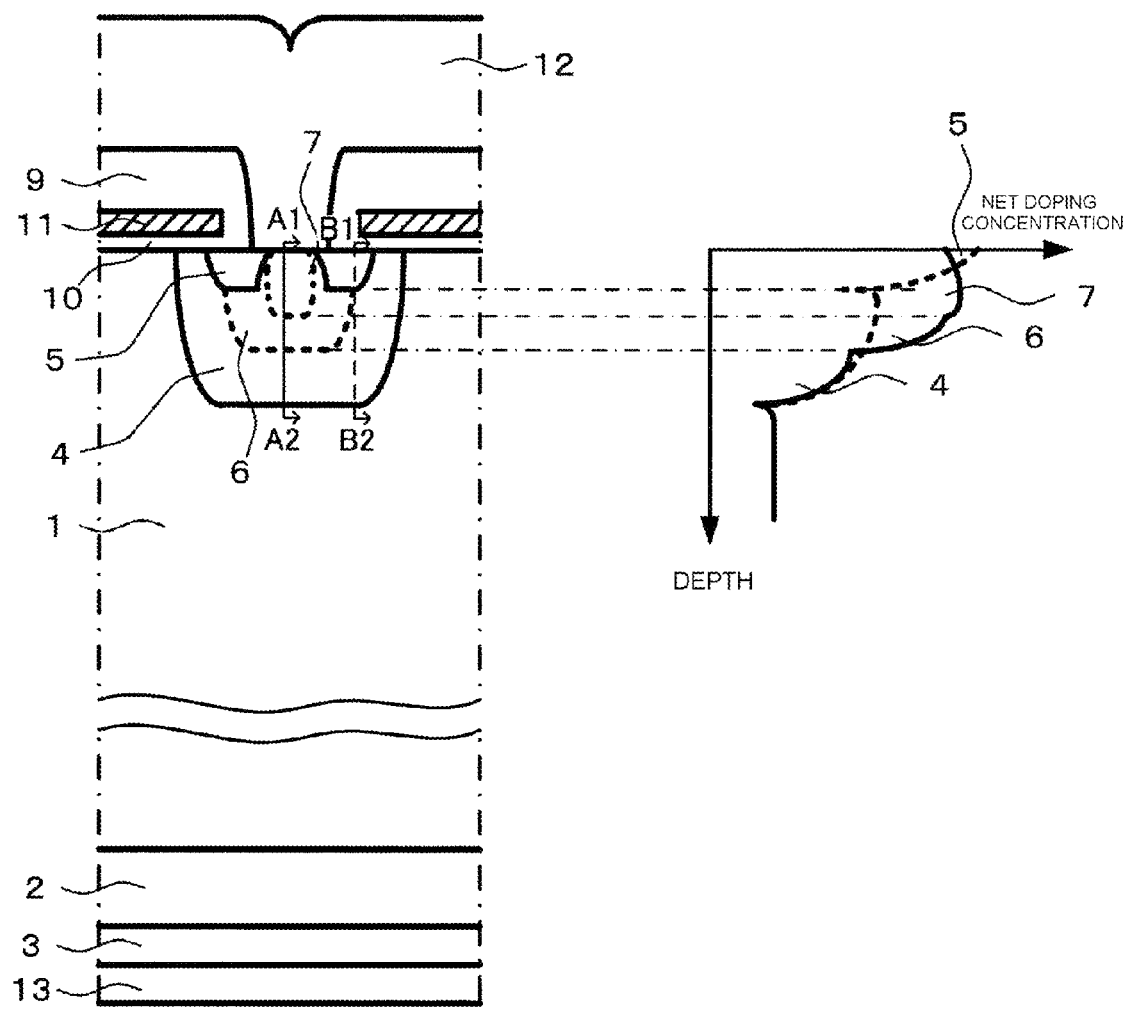
FIG. 12 (A)-FIG. 12 (B) are cross-sectional views illustrating main components of a semiconductor device according to an embodiment of the present invention and a concentration distribution diagram illustrating a net doping concentration of the semiconductor device.

Next, a fourth embodiment of the present invention will be described with reference to FIG. 12. FIG. 12 is a cross-sectional view illustrating main components of a semiconductor device according to an embodiment of the present invention and a concentration distribution diagram illustrating a net doping concentration of the semiconductor device. FIG. 12(A) illustrates a cross-sectional view of an IGBT according to the fourth embodiment of the present invention, and FIG. 12(B) illustrates net doping concentration distribution along cutting lines A1-A2 and B1-B2 illustrated in FIG. 12(A). In FIG. 12(B), the solid line indicates concentration distribution along the cutting line A1-A2, and in FIG. 12(B), the broken line indicates concentration distribution along the cutting line B1-B2.

The feature of the fourth embodiment is that the depths of the p-type contact layer 6 and the p-type counter layer 7 are also different with respect to the third embodiment. In the fourth embodiment, the p-type contact layer 6 is formed to be deep. By doing so, as described hereinafter, a new function is added to the p-type contact layer 6, so that the effect of preventing the latch-up is advantageously improved.

In the state where a power supply voltage is applied to the IGBT when the gate is turned off, the depletion layers are widened in the two layers by the pn junction between the n-type drift layer 1 and the p-type base layer 4. The depletion layer of the p-type base layer 4 needs not to reach the n-type source layer 5. The reason is that, if the depletion layer reaches the n-type source layer 5, electrons flow from the n-type source layer 5 into the depletion layer, so that a current flows irrespective of the gate. Although the concentration of the p-type base layer 4 may be configured to be so high that the depletion layer does not reach the n-type source layer 5, since the concentration distribution of the p-type base layer 4 determines the gate threshold value, the concentration thereof may not be excessively increased.

As a method in the related art, there is a method of forming a deep p-type contact layer 6 having a concentration higher than that of the p-type base layer 4 so as not to reach an inversion layer channel formed in the portion just below the gate oxide film 10 carefully. Due to the p-type contact layer 6, the depletion layer is stopped from being widened into the p-type base layer 4.

On the other hand, in the case where the p-type counter layer 7 does not exist like the IGBT in the related art, the p-type contact layer 6 needs to have a function as a high concentration layer for preventing the latch-up. Therefore, the concentration of the p-type contact layer 6 in the portion just below the n-type source layer 5 needs to be secured so as to be approximately the aforementioned concentration (or sheet resistance).

As a result, the p-type contact layer 6 needs to be formed to be shallower than 1 μm in depth from the bottom of the n-type source layer 5, and the end portion of the depletion layer (depletion layer end) is stopped at a position closest to the n-type source layer 5. Since the distance (herein, less than 1 μm) of the charge neutralization region between the depletion layer end and the n-type source layer 5 is determined by implantation efficiency of electrons injected from the n-type source layer 5, the distance is desired to be secured as long as possible.

Therefore, the p-type counter layer 7 is introduced according to the present invention, and the p-type counter layer 7 is formed so that the concentration of acceptors at the depth from the bottom of the n-type source layer 5, which is shallower than 1 μm, is increased and the p-type counter layer 7 is in contact with the n-type source layer 5. On the other hand, the p-type contact layer 6 is formed to the depth where the p-type contact layer 6 is slightly deeper than the p-type counter layer 7 (for example, 1 μm to 2 μm from the surface of the chip) to be widened to the degree that the p-type contact layer 6 is not engaged with the inversion layer channel in the transverse direction.

By doing so, in addition to the aforementioned pattern defects (1) to (3), the distance (herein, less than 1 μm) of the charge neutralization region between the depletion layer end and the n-type source layer 5 is secured, so that the effect of improving the function of preventing the latch-up can also be newly obtained.

Fifth Embodiment

Figure 13:
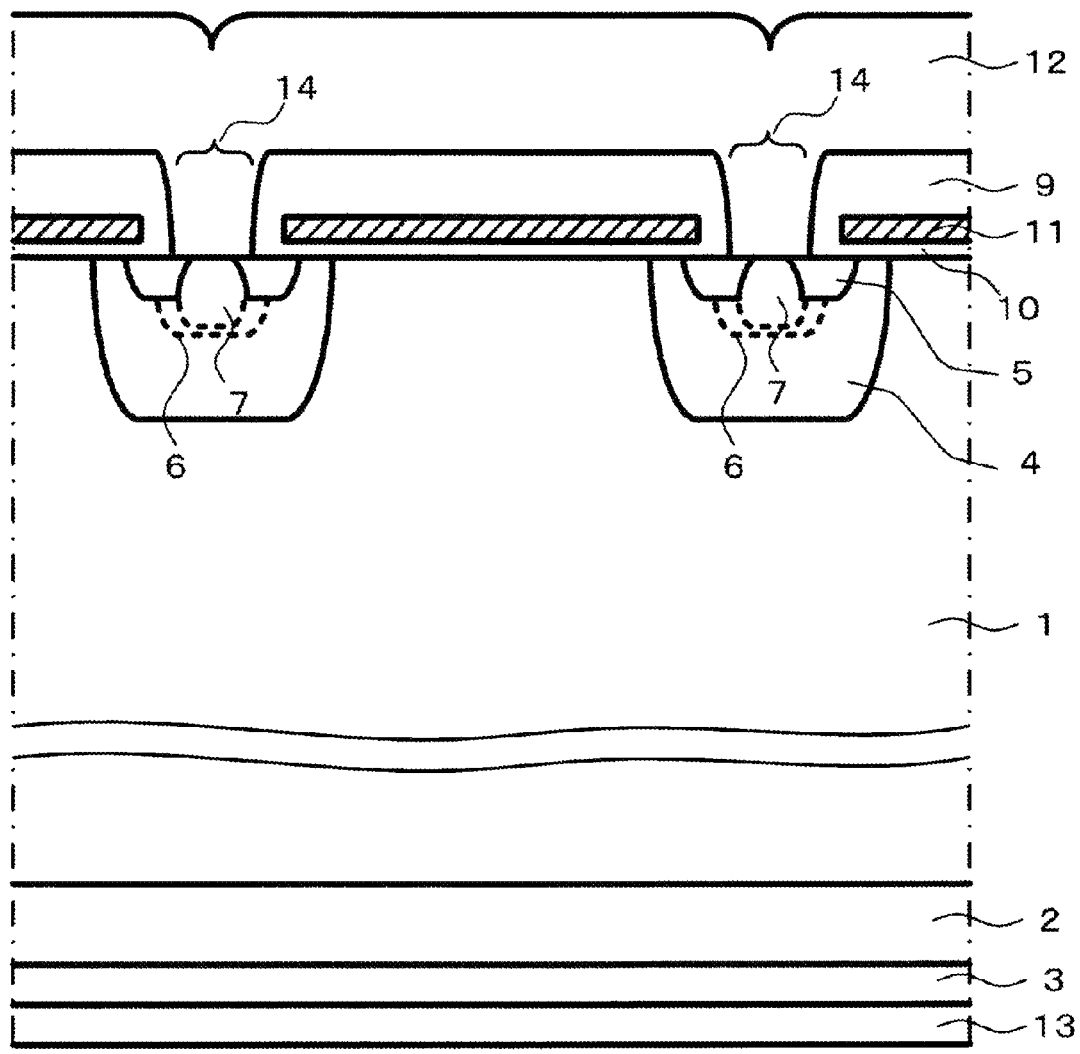
FIG. 13 is a cross-sectional view illustrating main components of a semiconductor device according to an embodiment of the present invention.

Next, a structure of an IGBT according to a fifth embodiment of the present invention will be described with reference to FIG. 13. FIG. 13 is a cross-sectional view illustrating main components of a semiconductor device according to an embodiment of the present invention. FIG. 13 illustrates a cross-sectional view of an IGBT according to the fifth embodiment of the present invention. The feature of the fifth embodiment is, as a different point from the first embodiment, that the p-type counter layer 7 is formed so as to be self-aligned with the contact opening portion 14 of the interlayer insulating film 9.

Figure 14:
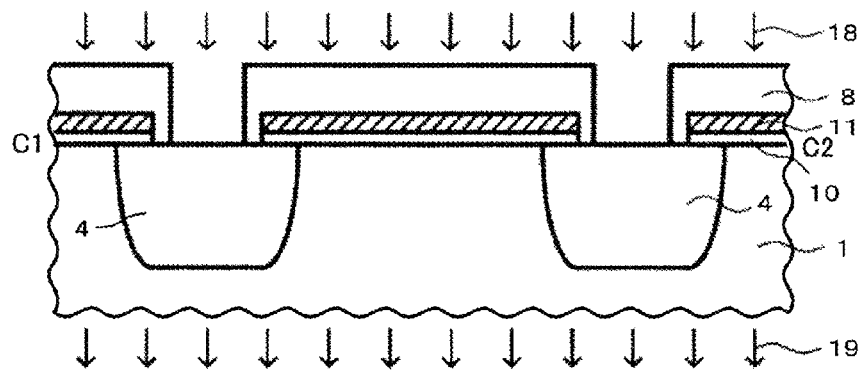
FIG. 14 (A)-FIG. 14 (E) are cross-sectional views illustrating a method of manufacturing a semiconductor device according to an embodiment of the present invention.
Figure 14:
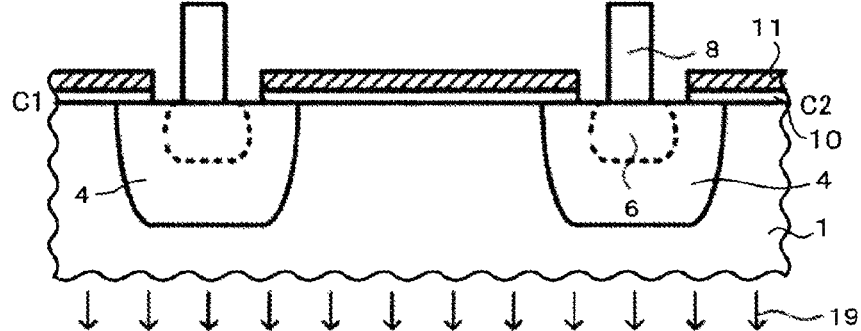
Figure 14:
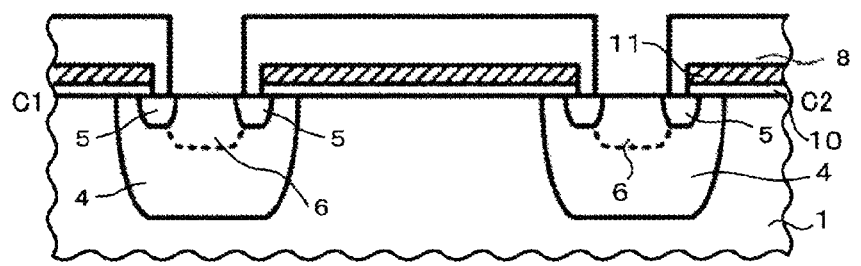
Figure 14:
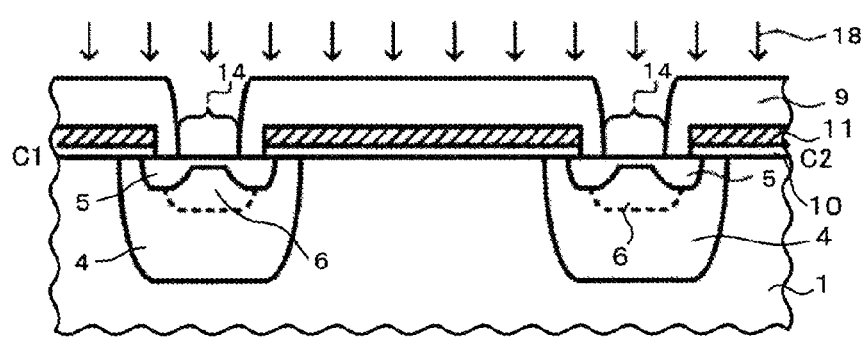
Figure 14:
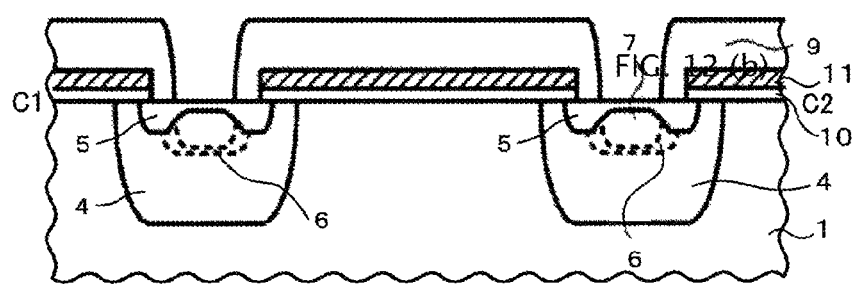

Hereinafter, a method of manufacturing the IGBT according to the fifth embodiment of the present invention will be described with reference to FIG. 14. FIG. 14 is a cross-sectional view illustrating a method of manufacturing a semiconductor device according to an embodiment of the present invention. FIG. 14 illustrates cross-sectional views illustrating a sequence of processes of manufacturing the IGBT according to the fifth embodiment of the present invention, in which a portion of an active region is illustrated to be enlarged. In addition, due to the reason described later, FIG. 14 is illustrated as cross-sectional views taken along the cutting line of the portion (the ladder portion of the n-type source layers 5) corresponding to the line C1-C2 illustrated in FIG. 11(D). The processes performed in (A) to (D) of the flow diagram illustrated in FIG. 14 are similar to those of (A) to (D) of FIG. 2 described above except for the different point in that the patterned interlayer insulating film not a resist mask are used as a mask of the boron ion implantation (refer to the arrow 18 in FIG. 14(D)) for the p-type counter layer 7.

First, in the state of FIG. 14(A), with respect to the polysilicon electrode 11 for the gate and the p-type base layer 4, the boron ion implantation (refer to the arrow 18 in FIG. 14(A)) is performed by using the resist 8 as a mask, so that the p-type contact layer 6 is formed. After the resist after the boron ion implantation is removed, thermal treatment may be performed.

Subsequently, as illustrated in FIG. 14(B), the arsenic ion implantation 19 is performed by using the resist 8 and the polysilicon electrode 11 as a mask. Subsequently, as illustrated in FIG. 14(C), a mask of the resist 8 is formed again, and the arsenic ion implantation 19 is performed. At this time, the region where arsenic ions are implanted is limited to only the ladder portion of the n-type source layer 5 in FIG. 11(D) described in the third embodiment. The process is an important feature of the fifth embodiment. The reason will be described in the stage where other processes are finished. Next, the resist 8 is removed, and thermal treatment is performed, so that the n-type source layer 5 is formed.

Next, as illustrated in FIG. 14(D), the interlayer insulating film 9 is formed by performing an LP-CVD method on an oxide film such as PSG or BPSG, and a contact opening portion 14 is formed on the interlayer insulating film 9 by dry etching or the like using a photolithography method. The opening portion becomes a connection region between the emitter electrode (not illustrated) which is to be formed later and the n-type source layer 5 and the p-type counter layer 7.

Subsequently, as illustrated in FIG. 14(D), the boron ion implantation (refer to the arrow 18 in FIG. 14(D)) is performed by using the previously-formed interlayer insulating film 9 as a mask without newly performing a photolithography method. Therefore, boron ions are implanted only in the contact opening portion 14 of the interlayer insulating film 9. Subsequently, as illustrated in FIG. 14(E), thermal treatment (for example, maintaining at 950° C. for one hour) is performed, so that the p-type counter layer 7 is formed to be self-aligned with the contact opening portion 14 of the interlayer insulating film 9.

The feature of the fifth embodiment is that the n-type source layer 5 formed in the contact opening portion 14 of the interlayer insulating film 9 is configured not to disappear entirely by the compensation of the p-type counter layer 7. In the case of the fifth embodiment, the boron ion implantation (refer to the arrow 18 in FIG. 14(D)) of the p-type counter layer 7 is performed by using the interlayer insulating film 9 as a mask. Therefore, if the p-type counter layer 7 is formed so as to prevent the pattern defects (1) to (3), in some cases, concentration compensation occurs due to the p-type layer, and thus, the n-type source layer 5 formed in the contact opening portion 14 of the interlayer insulating film 9 disappears, so that the n-type source layer 5 and the emitter electrode may not be in contact (electrical connection) with each other.

Therefore, the emitter electrode and the n-type source layer 5 are allowed to be in contact with each other in the aforementioned ladder portion of the n-type source layer 5. The concentration (total amount) of donors only in the n-type source layer 5 of the aforementioned ladder portion is configured to be larger than a sum of the total amount of the p-type counter layer 7 and the total amount of the p-type contact layer 6 so that the n-type source layer 5 is not cancelled even in the case where the boron ion implantation (refer to the arrow 18 in FIG. 14(D)) for the p-type counter layer 7 is performed. Therefore, as described above, arsenic ions are preferably implanted only in the ladder portion.

As described, although a photolithography process for the arsenic ion implantation is newly added, in the fifth embodiment, the p-type counter layer 7 may be formed so as to be self-aligned with the contact opening portion 14 of the interlayer insulating film 9. As a result, in the opening portion, the p-type counter layer 7 is securely in contact with the emitter electrode, and the n-type source layer 5 exposed in the opening portion disappears except for the ladder portion, so that the n-type source layer 5 communicating with the inversion layer channel is formed only in the lower portion of the interlayer insulating film. Therefore, the width of the n-type source layer 5 (the width of the polysilicon electrode in the transverse direction) can be further decreased, and the resistance component of the vicinity thereof can be reduced, so that it is possible to further improve the effect of suppressing the latch-up.

Sixth Embodiment

Figure 15:
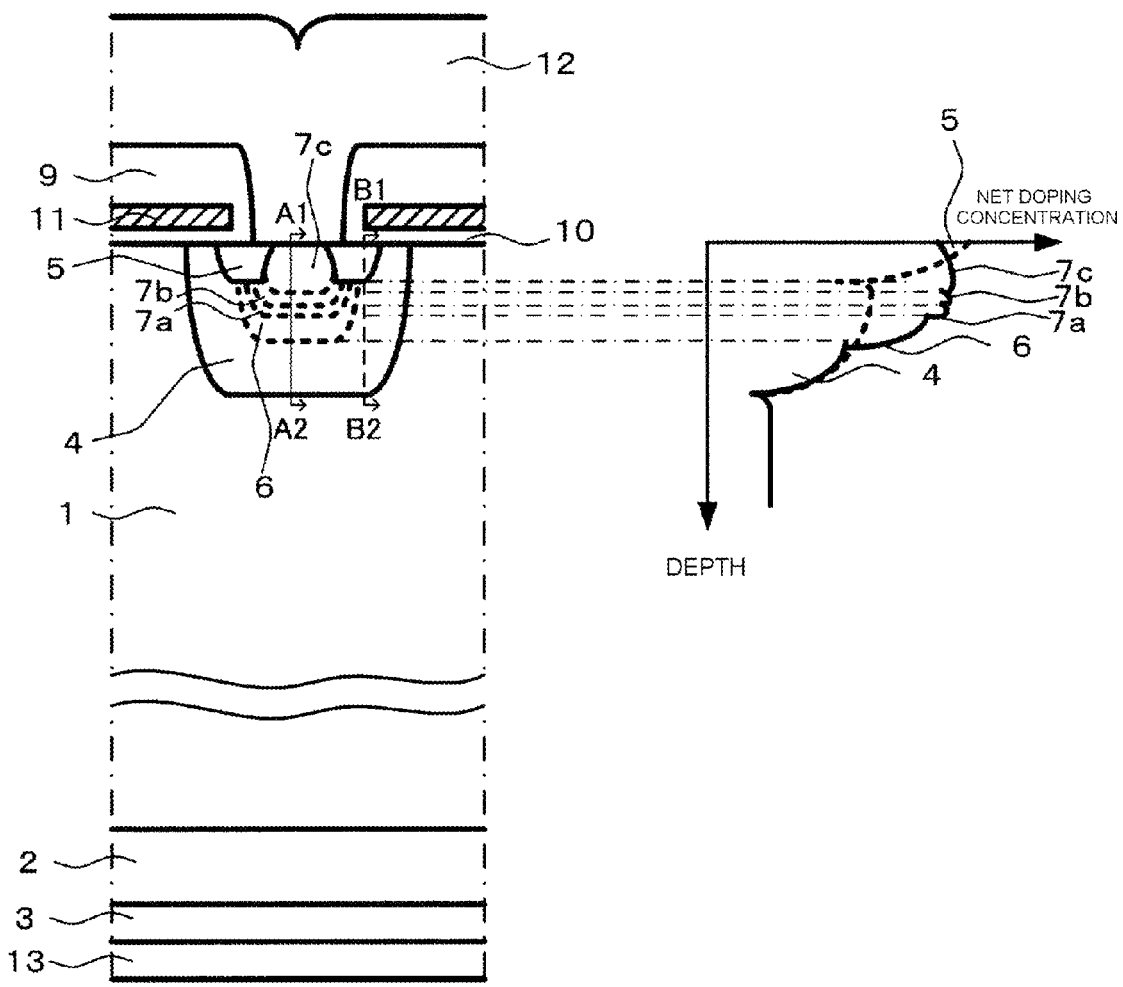
FIG. 15 (A)-FIG. 15 (B) are cross-sectional views illustrating main components of a semiconductor device according to an embodiment of the present invention and a concentration distribution diagram illustrating a net doping concentration of the semiconductor device.

Next, a structure of an IGBT according to a sixth embodiment of the present invention will be described with reference to FIG. 15. FIG. 15 is a cross-sectional view illustrating main components of a semiconductor device according to an embodiment of the present invention and a concentration distribution diagram illustrating a net doping concentration of the semiconductor device. FIG. 15(A) illustrates a cross-sectional view of an IGBT according to the sixth embodiment of the present invention, and FIG. 15(B) illustrates net doping concentration distribution along cutting lines A1-A2 and B1-B2 illustrated in FIG. 15(A). In FIG. 15(B), the solid line indicates concentration distribution along the cutting line A1-A2, and in FIG. 15(B), the broken line indicates concentration distribution along the cutting line B1-B2.

The feature of the sixth embodiment is, as a different point from the first embodiment, that a plurality of p-type counter layers are formed. For example, in the case of FIG. 15, three p-type counter layers 7a, 7b, and 7c are formed. The p-type contact layer 6 is formed so as to be deep in the fourth embodiment. However, in the sixth embodiment, a plurality of p-type counter layers 7 are formed in order to prevent the occurrence of the latch-up by preventing the aforementioned pattern defects (1) to (3).

The total amounts of the plurality of p-type counter layers 7a, 7b, and 7c may be equal to each other or different from each other. Similarly, the formation depths (Rp in ion implantation) of the layers may be equal to each other or different from each other. In addition, preferably, the sum of the total amounts (doses) of the p-type counter layers 7a, 7b, and 7c and the depth (Rp) thereof satisfy the aforementioned conditions described in the first embodiment. In this manner, by forming a plurality of p-type counter layers, the occurrence of the latch-up caused by the pattern defects can be sufficiently suppressed.

Seventh Embodiment

Figure 16:
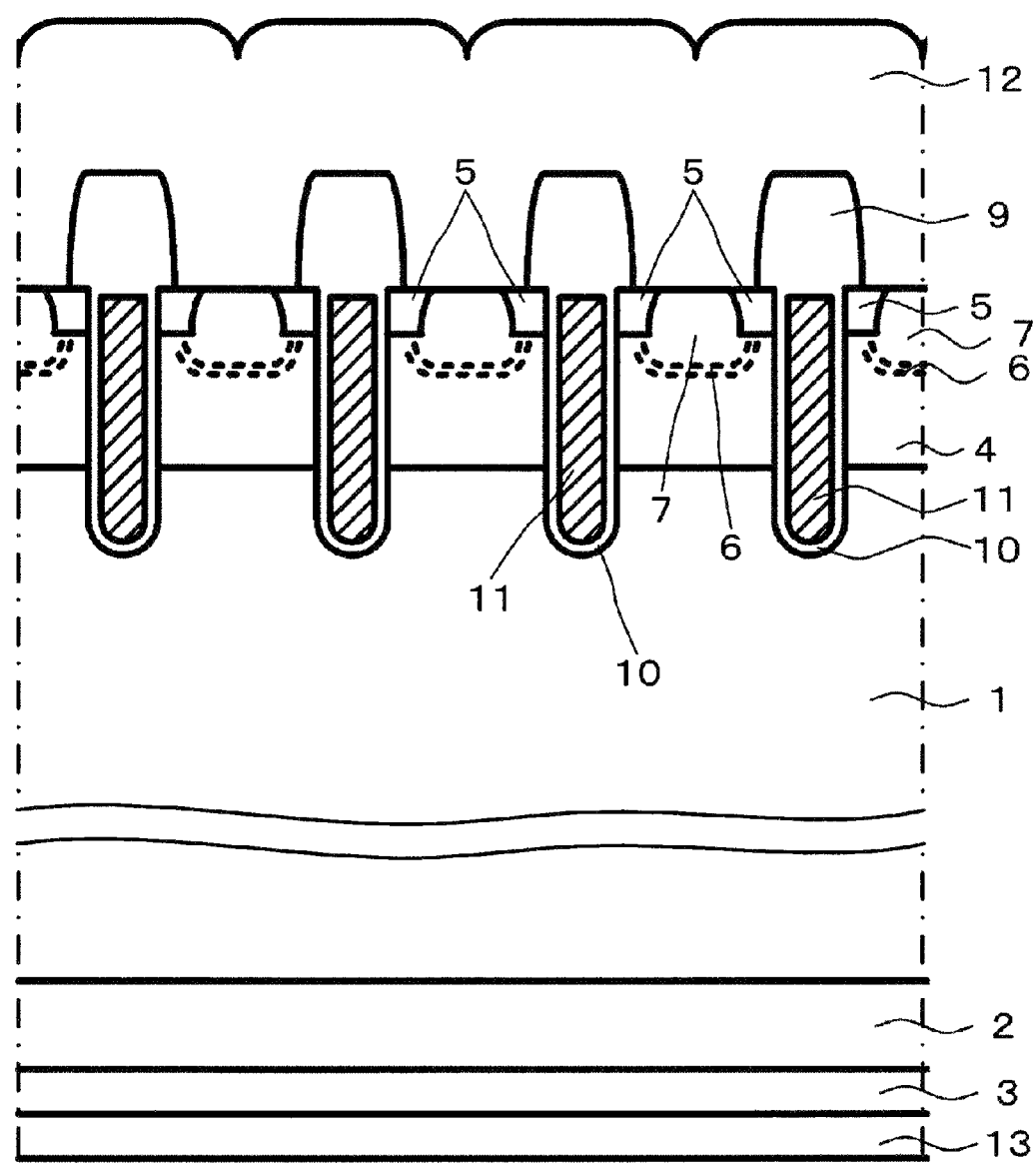
FIG. 16 is a cross-sectional view illustrating main components of a semiconductor device according to an embodiment of the present invention.

Next, a structure of an IGBT according to a seventh embodiment of the present invention will be described with reference to FIG. 16. FIG. 16 is a cross-sectional view illustrating main components of a semiconductor device according to an embodiment of the present invention. FIG. 16 illustrates a cross-sectional view of an IGBT according to the seventh embodiment of the present invention.

The feature of the seventh embodiment is, as a different point from the first embodiment, that the MOS gate structure is changed from a planar gate type to a trench gate type. The p-type base layer 4 having a concentration higher than that of the n-type drift layer 1 is formed on the surface of the semiconductor substrate including the n-type drift layer 1. The n-type source layer 5 having a concentration higher than that of the p-type base layer 4 is selectively formed on the surface of the p-type base layer 4. Moreover, the p-type contact layer 6 is formed on the p-type base layer 4 so as to be in contact with the selectively-formed n-type source layer 5.

On the other hand, grooves (trenches) are regularly formed on the surface of the semiconductor substrate, and a gate oxide film 10 is formed on an inner wall of the trench. In addition, the polysilicon electrode 11 is buried so as to face the surface of each layer of the n-type source layer 5, the p-type base layer 4, and the n-type drift layer 1 through the gate oxide film 10. The polysilicon electrodes 11 are integrated onto a chip (not illustrated) to be in contact with the gate electrodes.

In this manner, the trench gate-type MOS gate structure is formed. Next, the p-type counter layer 7 having a concentration higher than that of the p-type base layer 4 is formed to be in contact with the n-type source layer 5, to mostly overlap the p-type contact layer 6, and to be included in the p-type base layer 4 in such a range that the p-type counter layer 7 does not exceed the end of the n-type source layer 5 on the side facing the gate electrode. The p-type base layer 4 is connected to the emitter electrode 12.

Moreover, the interlayer insulating film 9 is formed to cover the upper portion of the polysilicon electrode 11, and the interlayer insulating film 9 is opened so that the n-type source layer 5 and the p-type counter layer 7 are exposed on the upper surface of the p-type base layer 4. The aforementioned emitter electrode 12 made of aluminum or the like is formed on the surface of the chip to be electrically connected to the n-type source layer 5 and the p-type counter layer 7 through the opening portion of the interlayer insulating film 9 described above.

On the other hand, the n-type field stop layer 2 is formed on the lower surface of the semiconductor substrate to be in contact with the n-type drift layer 1, and the p-type collector layer 3 is further formed to be in contact with the n-type field stop layer 2, so that the p-type collector layer 3 is connected to the collector electrode 13 formed on the outer surface of the lower surface of the semiconductor substrate.

Figure 17:
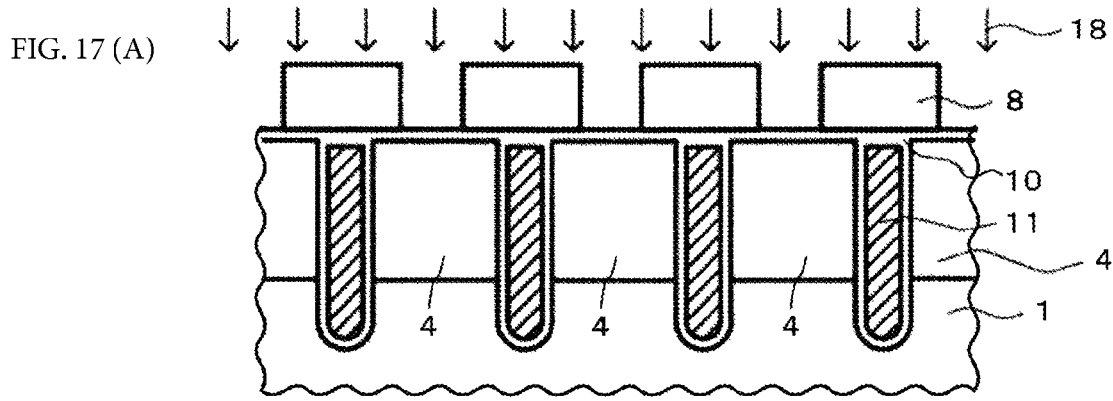
FIG. 17 (A)-FIG. 17 (D) are cross-sectional views illustrating a method of manufacturing a semiconductor device according to an embodiment of the present invention.
Figure 17:
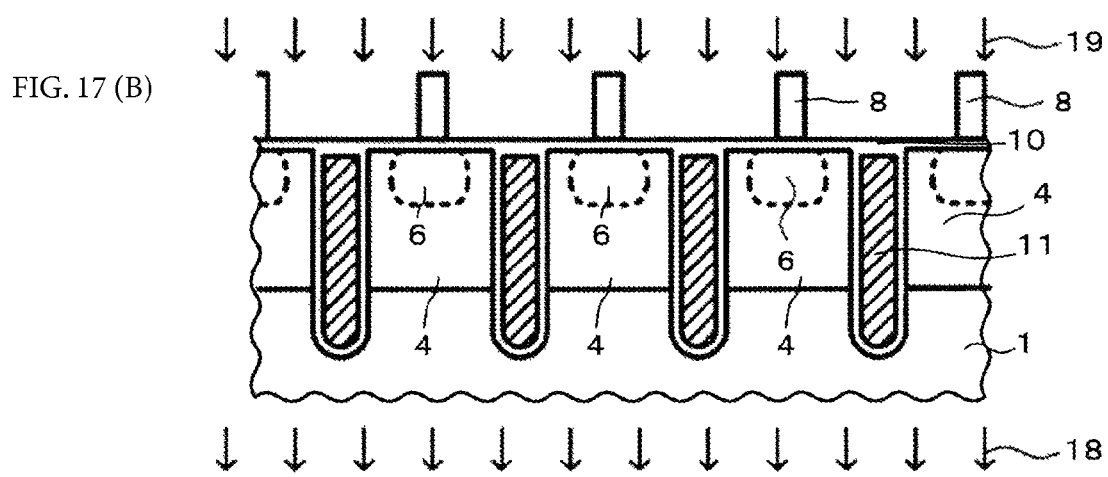
Figure 17:
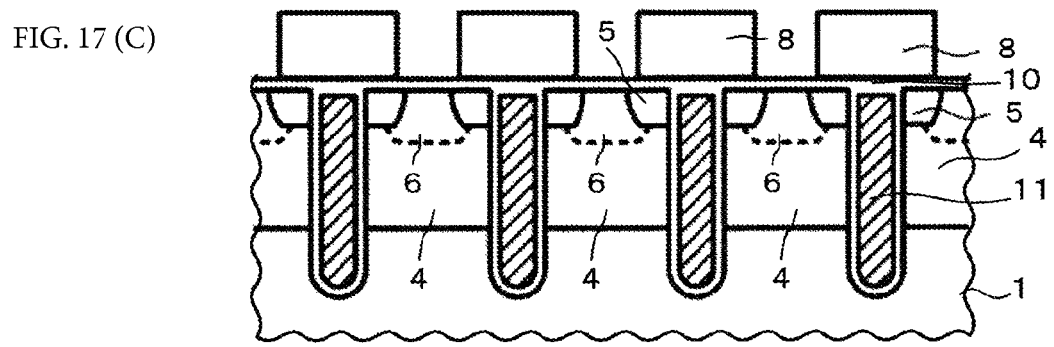
Figure 17:
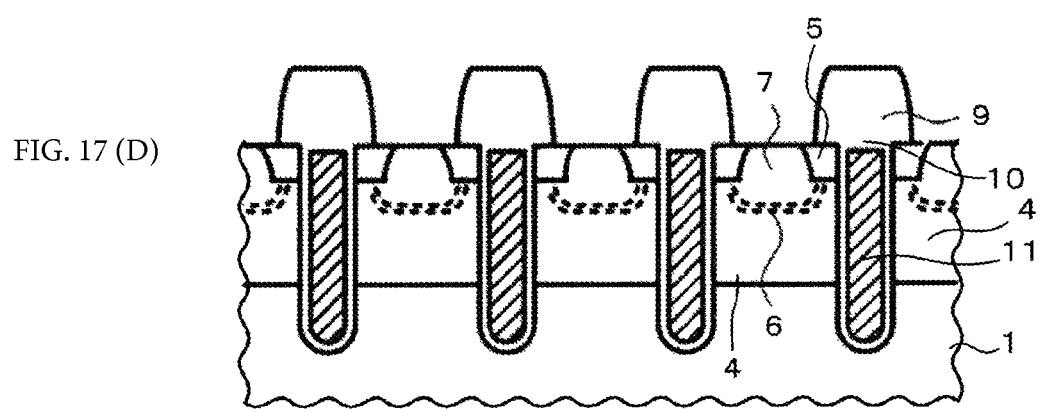

Hereinafter, a method of manufacturing the IGBT according to the fifth embodiment of the present invention will be described with reference to FIG. 17. FIG. 17 is a cross-sectional view illustrating a method of manufacturing a semiconductor device according to an embodiment of the present invention. FIG. 17 illustrates cross-sectional views illustrating a sequence of processes of manufacturing the IGBT according to the seventh embodiment of the present invention, in which a portion of an active region is illustrated to be enlarged. Since the processes performed in (A) to (D) of the flow diagram illustrated in FIG. 17 are similar to those of (A) to (D) of FIG. 2 described above, the description of the redundant portions is partially omitted.

First, in the state of FIG. 17(A), with respect to the polysilicon electrode 11 for the gate and the p-type base layer 4, the boron ion implantation (refer to the arrow 18 in FIG. 17(A)) is performed by using the resist 8 as a mask, so that the p-type contact layer 6 is formed. At this time, the p-type contact layer 6 is disposed so as to be separated from the trench. After the resist after the boron ion implantation (refer to the arrow 18 in FIG. 17(A)) is removed, thermal treatment may be performed.

Subsequently, as illustrated in FIG. 17(B), the arsenic ion implantation 19 is performed by using the resist 8 and the polysilicon electrode 11 as a mask. Next, the resist 8 is removed, and thermal treatment is performed, so that the n-type source layer 5 is formed. Subsequently, as illustrated in FIG. 17(C), a mask of the resist 8 is newly formed, and the boron ion implantation (refer to the arrow 18 in FIG. 17(C)) is performed, so that the p-type counter layer 7 is performed. After that, as illustrated in FIG. 17(D), the interlayer insulating film 9 is deposited, and selective etching is performed by a photolithography method, so that the surface of the p-type base layer 4 where the n-type source layer 5 and the p-type counter layer 7 are formed is opened.

As in the seventh embodiment, if the surface pattern is miniaturized like the trench gate IGBT, the dimension thereof is relatively smaller that impurities such as particles or waste, so that the influence thereof to the pattern is increased. In other words, in the characteristics of the IGBT chip, likelihood with respect to the impurities is decreased. Therefore, the occurrence frequency of the aforementioned pattern defects (1) to (3) is also remarkably increased. As described in "Means for Solving Problem", the large current capacity IGBT module is formed by implementing the IGBT chips from a wafer and by connecting a plurality of IGBT chips (multi-chips) in parallel. Therefore, the latch-up caused by the aforementioned pattern defects and the occurrence rate of the switching defect are increased by the amount corresponding to the number of the IGBT chips in use.

Therefore, if the p-type counter layer according to the present invention is applied to the trench gate-type IGBT, the probability of the occurrence of the pattern defects per chip is remarkably decreased, so that the defect can be reduced at least down to one of several parts. As a result, similarly, the switching defect in the aforementioned large current capacity IGBT module of the multi-chips is also decreased. In other words, the effect of the p-type counter layer 7 is increased as the MOS gate structure on the chip surface is miniaturized.

Eighth Embodiment

Figure 18:
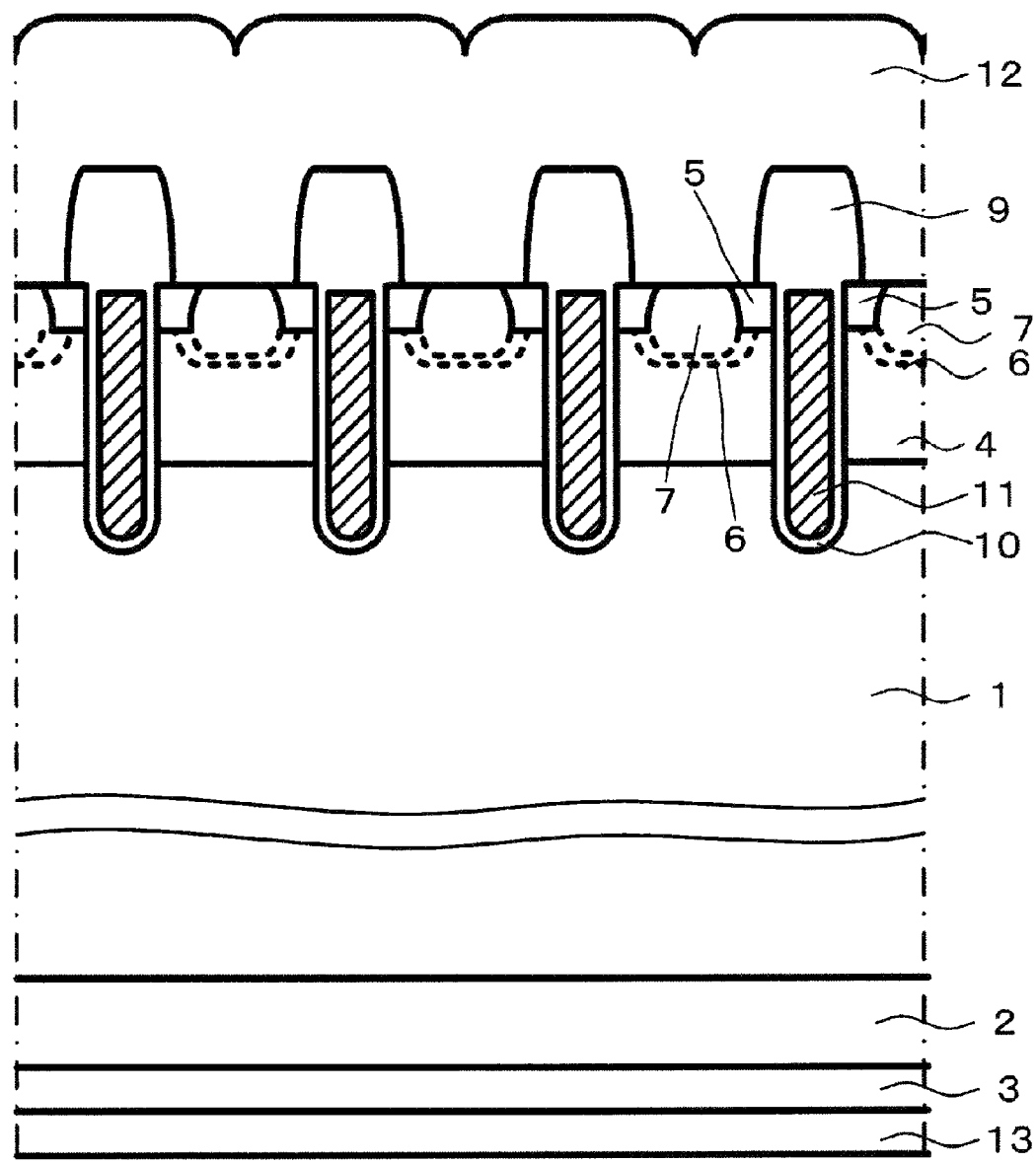
FIG. 18 is a cross-sectional view illustrating main components of a semiconductor device according to an embodiment of the present invention.

Next, a structure of an IGBT according to an eighth embodiment of the present invention will be described with reference to FIG. 18. FIG. 18 is a cross-sectional view illustrating main components of a semiconductor device according to an embodiment of the present invention. FIG. 18 illustrates a cross-sectional view of an IGBT according to the eighth embodiment of the present invention.

The feature of the eighth embodiment is, as a different point from the seventh embodiment, that the p-type counter layer 7 is formed to be narrower than the p-type contact layer 6 by using a resist mask different from the p-type contact layer 6. The eighth embodiment corresponds to the case where the third embodiment of the planar gate-type IGBT is applied to a trench gate-type.

Figure 19:
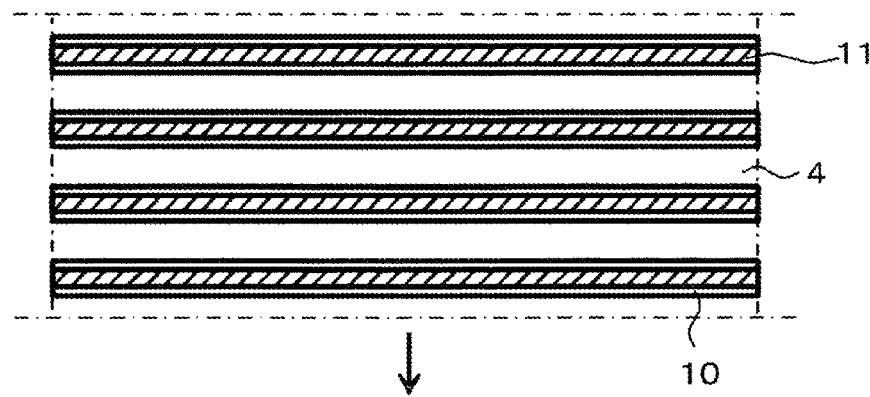
FIG. 19 (A)-FIG. 19 (D) are plan views illustrating a method of manufacturing a semiconductor device according to an embodiment of the present invention.
Figure 19:
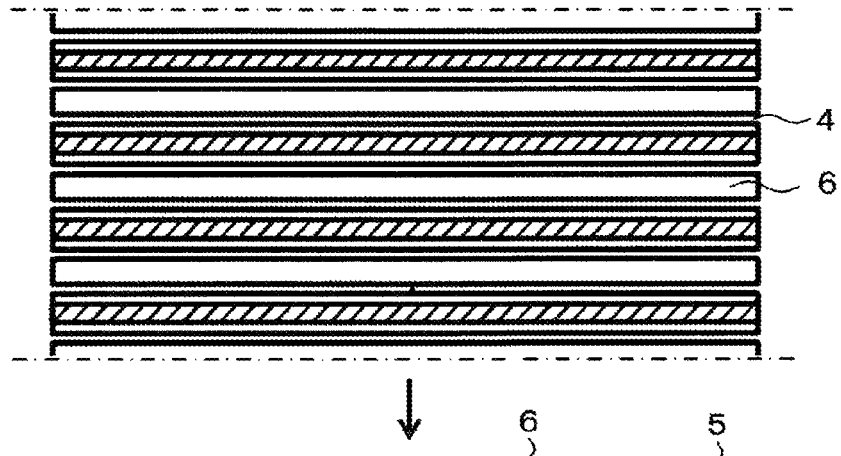
Figure 19:
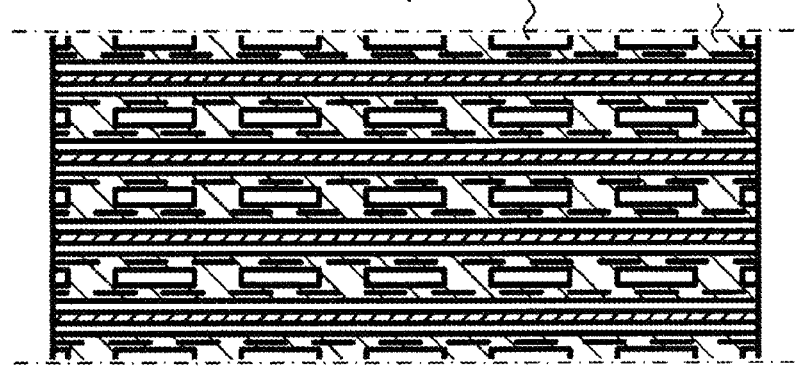
Figure 19:
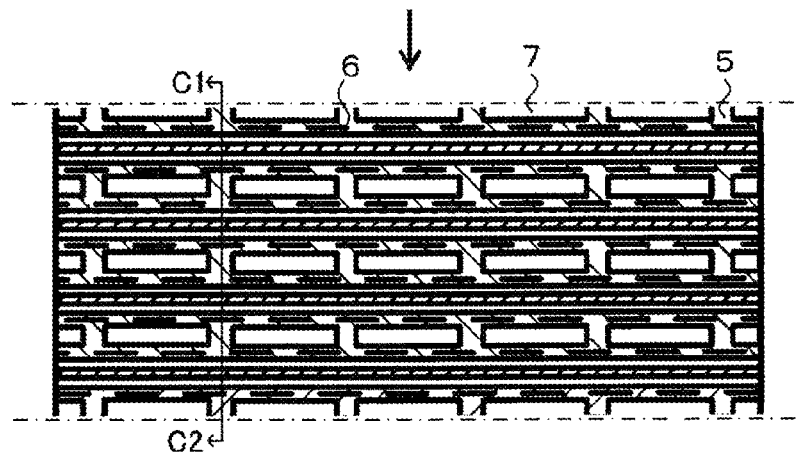

Next, a method of manufacturing the IGBT according to the eighth embodiment of the present invention will be described with reference to FIG. 19. FIG. 19 is a plan view illustrating a method of manufacturing a semiconductor device according to an embodiment of the present invention. FIG. 19 illustrates plan views illustrating a sequence of processes of manufacturing the IGBT according to the third embodiment, in which a portion of an active region is illustrated to be enlarged. The processes performed in (A) to (D) of the flow diagram illustrated in FIG. 19 are almost the same as (A) to (D) of FIG. 11 described above.

First, in the state of FIG. 19(A), boron ion implantation is performed by using a resist mask, so that the p-type contact layer 6 is formed as illustrated in FIG. 19(B). At this time, the opening portion of the resist mask is configured to be separated from the long-side direction end of the trench including the polysilicon electrode 11 and the gate oxide film 10. Subsequently, arsenic ion implantation is performed by using a resist mask, so that the n-type source layer 5 is formed as illustrated in FIG. 19(C). At this time, arsenic is introduced into the aforementioned separated portion.

Herein, the n-type source layers 5 are also formed in the short-side direction (the up-down direction of the paper) of the polysilicon electrodes 11 so as to connect the n-type source layers 5 which are in contact with the polysilicon electrodes 11 adjacent to each other. In this manner, by allowing the n-type source layers 5 to be patterned on a ladder, the region where the emitter electrode and the n-type source layer 5 after the finishing are securely in contact with each other is increased, so that the effect of reducing contact resistance is obtained.

Subsequently, as illustrated in FIG. 19(D), boron ion implantation is performed by using a resist mask newly, so that the p-type counter layer 7 is formed. At this time, in order that the n-type source layers 5 in a shape of a ladder does not disappear by the compensation of the p-type counter layers 7, a resist mask for the p-type counter layers 7 is also formed in a shape of a ladder, so that boron may not be introduced into the ladder portion of the n-type source layers 5. In addition, at this time, the opening portion of the resist mask is configured to be slightly wider than the opening portion of the n-type source layer 5.

In this manner, on the surface, the shapes of the patterns of the resist masks for ion implantation in the p-type contact layer 6 and the p-type counter layer 7 are changed, so that the sites are provided where the n-type source layer 5 does not disappear due to the p-type counter layer 7. As a result, the n-type source layer 5 having a high concentration can be additionally formed, so that for example, the contact resistance of the n-type source layer 5 and the emitter electrode which is to be formed later can be reduced.

Ninth Embodiment

Figure 20:
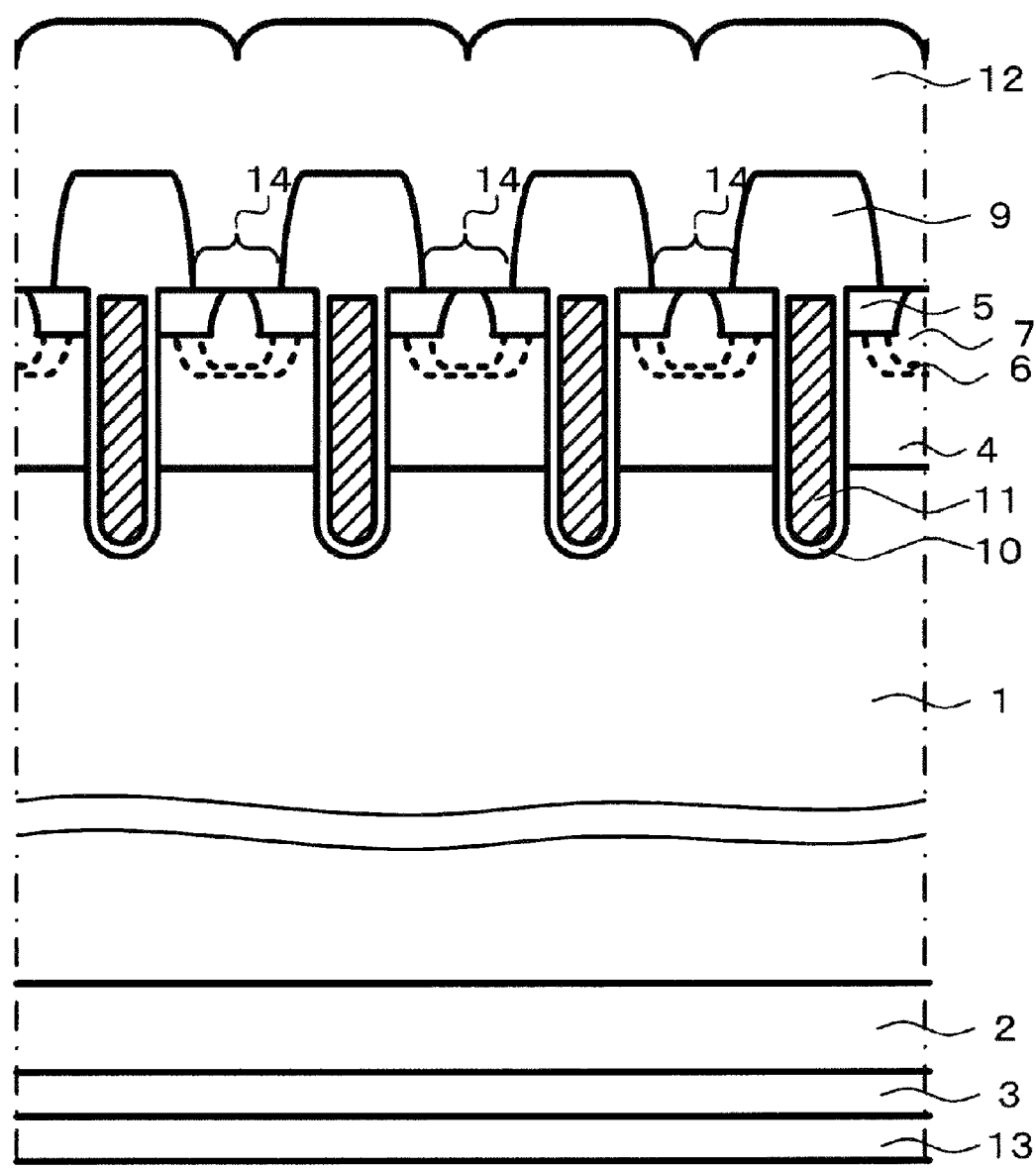
FIG. 20 is a cross-sectional view illustrating main components of a semiconductor device according to an embodiment of the present invention.

Next, a structure of an IGBT according to a ninth embodiment of the present invention will be described with reference to FIG. 20. FIG. 20 is a cross-sectional view illustrating main components of a semiconductor device according to an embodiment of the present invention. FIG. 20 illustrates a cross-sectional view of an IGBT according to the ninth embodiment of the present invention. As illustrated in FIG. 20, the feature of the ninth embodiment of the present invention is, as a different point from the eighth embodiment, that the p-type counter layer 7 is formed so as to be self-aligned with the contact opening portion 14 of the interlayer insulating film 9.

Figure 21:
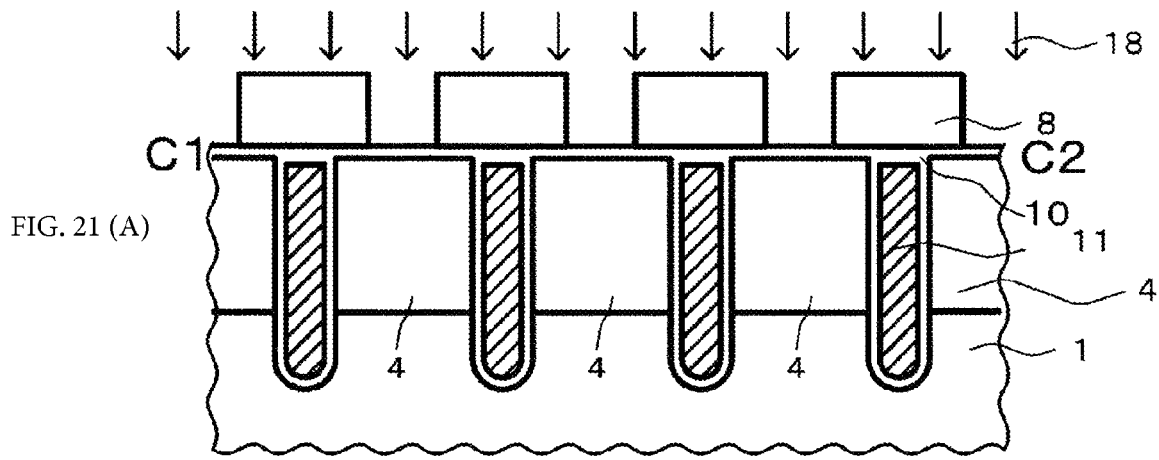
FIG. 21 (A)-FIG. 21 (C) are cross-sectional views illustrating a method of manufacturing a semiconductor device according to an embodiment of the present invention.
Figure 21:
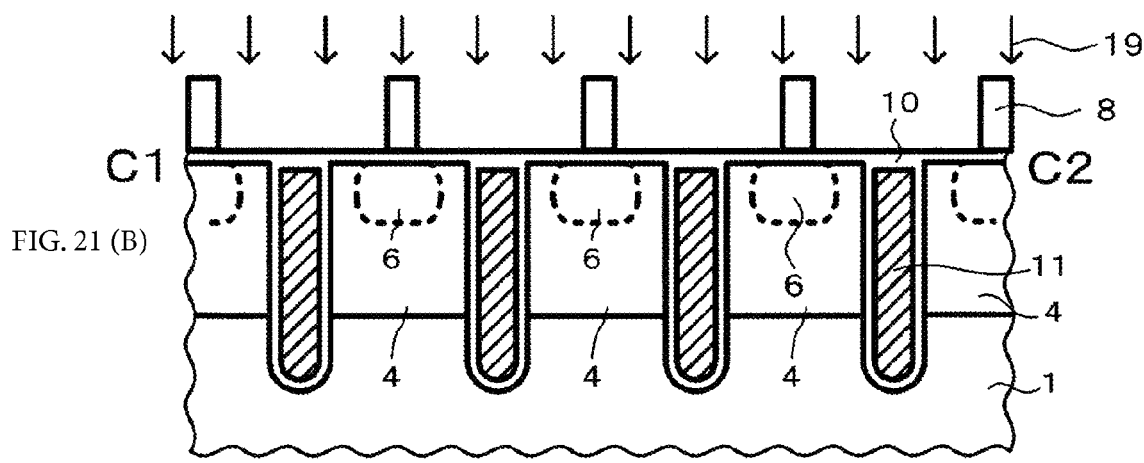
Figure 21:
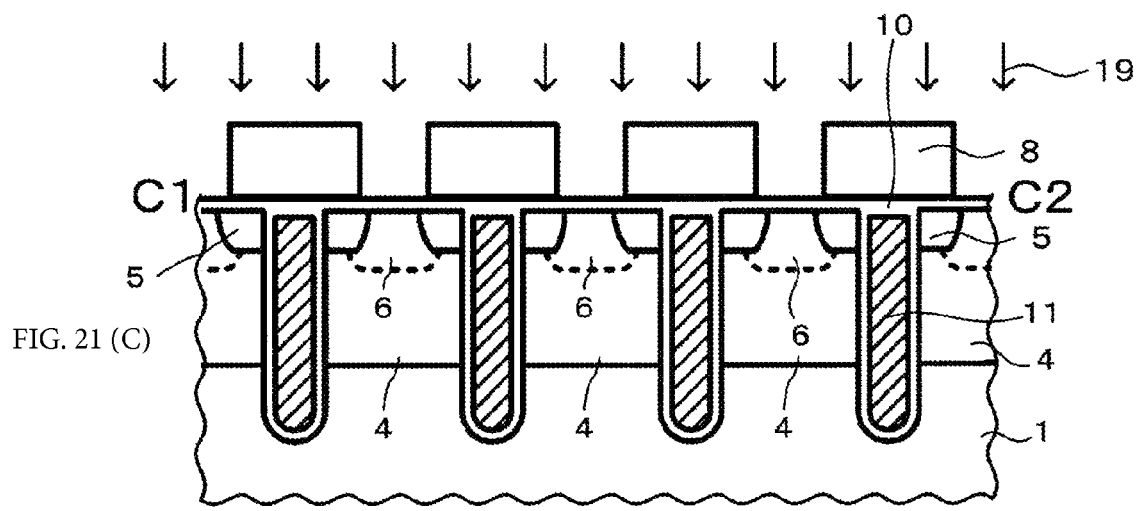
Figure 22:
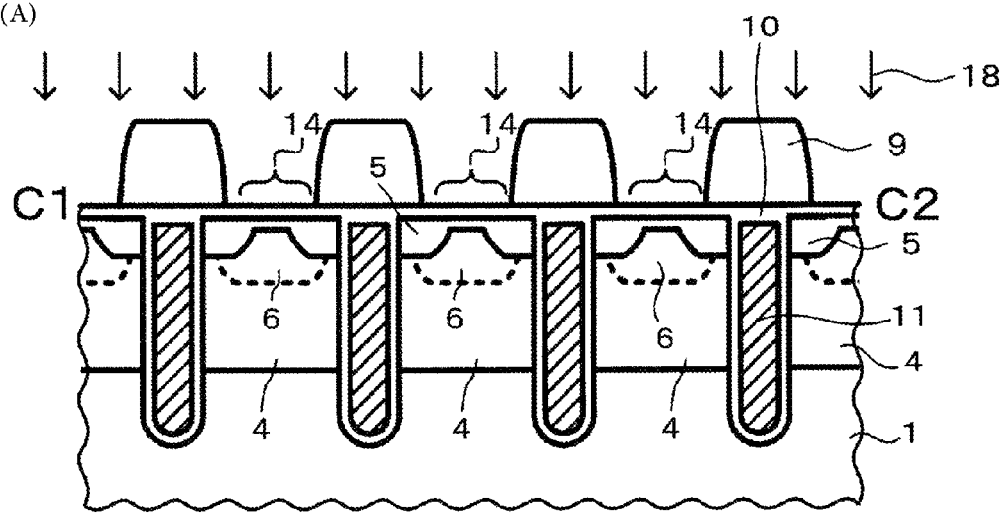
FIG. 22 (A)-FIG. 22 (B) are cross-sectional views illustrating a method of manufacturing a semiconductor device according to an embodiment of the present invention.
Figure 22:
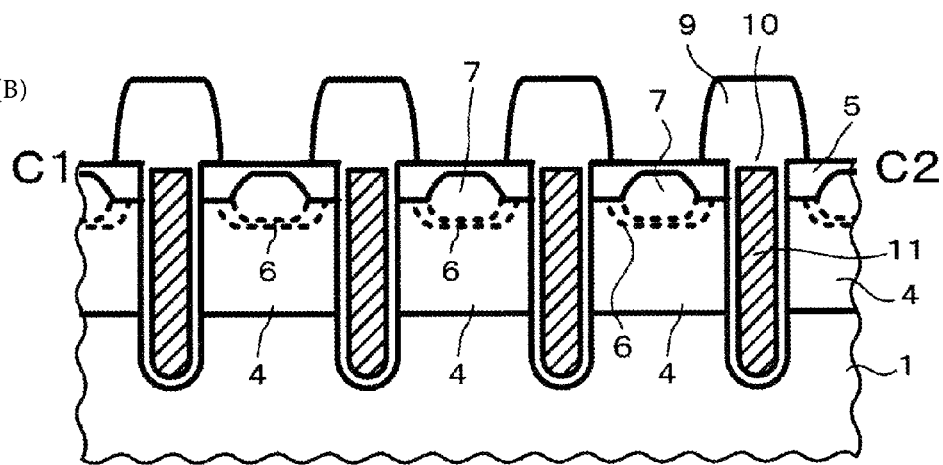

Next, a method of manufacturing the IGBT according to the fifth embodiment of the present invention will be described with reference to FIGS. 21 and 22. FIGS. 21 and 22 are cross-sectional views illustrating a method of manufacturing a semiconductor device according to an embodiment of the present invention. FIGS. 21 and 22 illustrate cross-sectional views illustrating a sequence of processes of manufacturing the IGBT according to the ninth embodiment, which are diagrams where a portion of an active region is enlarged. In addition, FIGS. 21 and 22 illustrate cross-sectional views taken along the cutting line corresponding to the line C1-C2 illustrated in (D) of FIG. 19. The processes performed in (A) to (C) of the flow diagram illustrated in FIG. 21 and (A) to (B) of the flow diagram illustrated in FIG. 22 are similar to those of (A) to (D) illustrated in FIG. 17 described above except for the different main point in that the patterned interlayer insulating film 9 not a resist mask are used as a mask of the boron ion implantation for the p-type counter layer 7.

First, in the state of FIG. 21(A), the boron ion implantation (refer to the arrow 18 in FIG. 21(A)) is performed by using the resist 8 as a mask, so that the p-type contact layer 6 is formed as illustrated in FIG. 21(B). After the resist 8 of the boron ion implantation (refer to reference numeral 18 in FIG. 21(A)) is removed, thermal treatment may be performed.

Subsequently, as illustrated in FIG. 21(B), the arsenic ion implantation (refer to the arrow 19 in FIG. 21(B)) is performed by using the resist 8 as a mask. Next, as illustrated in FIG. 21(C), a mask of the resist 8 is formed again, and the arsenic ion implantation (refer to the arrow 19 in FIG. 21(C)) is performed. At this time, the region where arsenic ions are implanted is limited to only the ladder portion (for example, the line C1-C2) of the n-type source layer 5 illustrated in FIG. 19(D) described in the eighth embodiment. Next, the resist 8 is removed, and thermal treatment is performed, so that the n-type source layer 5 is formed.

Next, as illustrated in FIG. 22(A), the interlayer insulating film 9 is formed by performing an LP-CVD method on a deposited oxide film such as PSG or BPSG, and a contact opening portion 14 is formed on the interlayer insulating film 9 by dry etching or the like using a photolithography method. The contact opening portion 14 becomes a connection region between the emitter electrode (not shown) which is to be formed later and the n-type source layer 5 and the p-type counter layer 7.

Subsequently, as illustrated in FIG. 22(A), the boron ion implantation (refer to the arrow 18 in FIG. 22(A)) is performed by using the previously-formed interlayer insulating film 9 as a mask without newly performing a photolithography method. Therefore, boron ions are implanted only in the contact opening portion 14 of the interlayer insulating film 9. Subsequently, as illustrated in FIG. 22(B), thermal treatment (for example, maintained at 950° C. for one hour) is performed, so that the p-type counter layer 7 is formed to be self-aligned with the contact opening portion 14 of the interlayer insulating film 9.

The feature of the ninth embodiment is that the embodiment is useful for design miniaturization in such a trench gate structure. As described above, the p-type counter layer needs to be formed so as to be securely in contact with the n-type source layer 5, so as to be deeper than the n-type source layer 5, and so as for at least a portion thereof to overlap the p-type contact layer 6. However, if the design is miniaturized by the trench gate structure, an allowable range of alignment error between the layers is narrowed. Therefore, the contact opening portion 14 between the p-type counter layer 7 and the emitter electrode of the interlayer insulating film 9 is misaligned, the hole current may not easily flow in the emitter electrode, and thus, the resistance component is increased and the voltage drop is increased, which leads to the occurrence of the latch-up.

Therefore, by allowing the p-type counter layer 7 to be self-aligned with the contact opening portion 14 of the interlayer insulating film 9, the p-type counter layer 7 can be securely in contact with the emitter electrode even in the design miniaturization. As a result, it is possible to further improve the effect of suppressing the latch-up.

Tenth Embodiment

Figure 23:
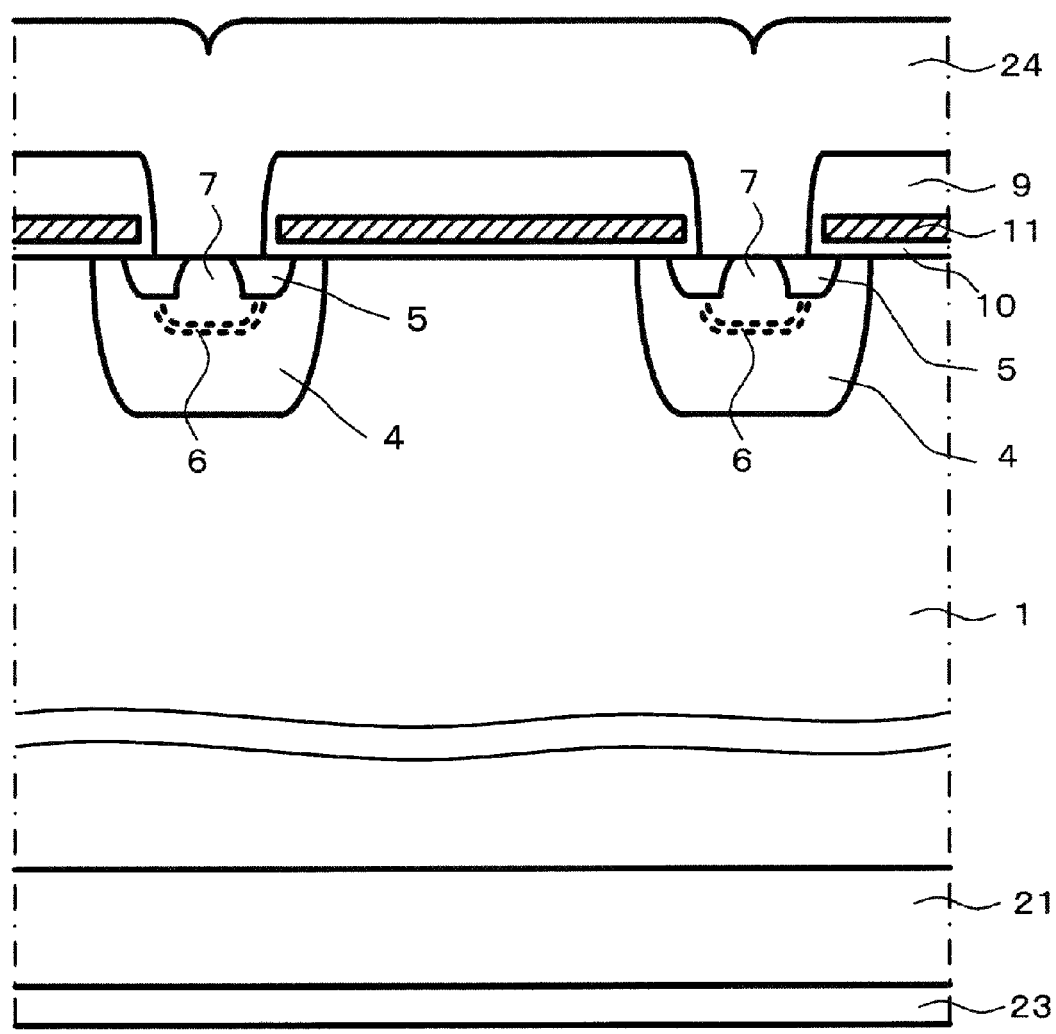
FIG. 23 is a cross-sectional view illustrating main components of a semiconductor device according to an embodiment of the present invention.

Next, a structure of a MOSFET according to a tenth embodiment of the present invention will be described with reference to FIG. 23. FIG. 23 is a cross-sectional view illustrating main components of a semiconductor device according to an embodiment of the present invention. FIG. 23 illustrates a cross-sectional view illustrating a MOSFET according to the tenth embodiment of the present invention.

The different point from the first embodiment is that a p-type layer does not exist on the rear surface and an n-type drain layer 21 is in contact with an electrode (drain electrode 23). In other words, only the electrons which are majority carriers contribute to the current. Even in the MOSFET where majority carriers constitute the current, a parasitic bipolar transistor including the n-type source layer 5, the p-type base layer 4, the n-type drift layer 1, and the n-type drain layer 21 exists. At the time of high voltage turning off, since the depletion layer is diffused in the most inner portion of the p-type base layer 4, the parasitic bipolar transistor may easily operate.

However, by introducing the p-type counter layer 7 having a high concentration, the diffusion length of the electrons in the p-type counter layer 7 is shortened. As a result, similarly to the IGBT, the efficiency of electron injection from the n-type source layer 5 into the p-type counter layer 7 can be reduced. Therefore, the occurrence of the latch-up caused by the pattern defect can be sufficiently suppressed. In addition, the present invention is not limited to the structure illustrated in FIG. 23, but the MOS gate structures according to all the embodiments described above can be applied to the MOSFET.

Eleventh Embodiment

Next, a structure of a MOS gate according to an eleventh embodiment of the present invention will be described with reference to FIG. 24. FIG. 24 is a cross-sectional view illustrating a semiconductor device according to an embodiment of the present invention and operations of the semiconductor device in the related art. FIG. 24 illustrates a cross-sectional view illustrating a MOS gate structure according to the eleventh embodiment of the present invention and a structure in the related art. FIG. 24(A) illustrates a cross-sectional view of a MOS gate structure according to the eleventh embodiment of the present invention; FIG. 24(B) illustrates an enlarged cross-sectional view of an arbitrary one of the p-type base layers 4; FIG. 24(C) illustrates an enlarged cross-sectional view of the vicinity of pn junction between the n-type source layer 5 and the p-type counter layer 7; and FIG. 24(D) illustrates a cross-sectional view of a MOS gate structure of a semiconductor device in the related art.

If the p-type counter layer 7 is installed according to the eleventh embodiment of the present invention, particularly as illustrated in the cross-sectional view in FIG. 24(C), the cross-section of the pn junction between the p-type counter layer 7 and the n-type source layer 5 has a shape to be convex to the inside of the n-type source layer 5. The reason why the pn junction is convex to the inside of the n-type source layer 5 is that a sum of the concentrations per unit area (total amounts) of the p-type counter layer 7 and the p-type contact layer 6 is increased so as to be higher than the total amount of the n-type source layer 5.

In other words, this is because the acceptor concentration of the introduction region of the p-type counter layer 7 cancels the low concentration portion of the n-type source layer 5. As illustrated in FIGS. 24(B) and 24(C), the holes introduced into the p-type base layer 4 in the turned-off or turned-on state flow into the p-type contact layer 6 and flows out through the p-type counter layer 7 to the emitter electrode (not shown) as illustrated in the hole flow 17.

At this time, since the concentration of the formation region of the p-type counter layer 7 is high to a degree that it removes the n-type source layer 5, the resistance component 16 of the path of the hole flow 17 in the p-type counter layer, particularly, the resistance component of the site along the pn junction is lowered. Therefore, since the holes flow through the site having the lowest resistance, the holes flow out through the shortest path to the emitter electrode. On the other hand, in the case of the MOS gate in the related art, only the p-type contact layer 6 exists, and the concentration thereof is lower than that of the present invention.

Therefore, as well known, the n-type source layer 5 has a shape to be convex to the inside of the p-type contact layer 6 as illustrated in FIG. 24(D). Accordingly, the hole flow 17 of the p-type contact layer 6 can be narrowed by the n-type source layers 5 on the two sides, and thus, the magnitude of the resistance component 16 is increased by the corresponding amount.

Hereinbefore, in the present invention where the p-type counter layer 7 is introduced, the voltage drop due to the hole flow 17 becomes sufficiently lower than the built-in potential of the pn junction of the n-type source layer 5 and the p-type counter layer 7, so that it is possible to suppress the occurrence of the latch-up. In addition, it is possible to prevent the aforementioned pattern defects (1) to (3).

INDUSTRIAL APPLICABILITY

In this manner, a semiconductor device and a method of manufacturing the same according to the present invention are useful as a semiconductor device where switching destruction caused by process defects is reduced and a method of manufacturing the same and is particularly suitable for a semiconductor device such as an insulated gate semiconductor device and a method of manufacturing the same.

EXPLANATIONS OF LETTERS OR NUMERALS 1, 61: N-type drift layer
2: N-type field stop layer
3: P-type collector layer
4, 64: P-type base layer
5, 65: N-type source layer
6, 66: P-type contact layer
7, 7a, 7b, 7c: P-type counter layer
8: Resist
9: Interlayer insulating film
10: Gate oxide film
11: Polysilicon electrode
12, 72: Emitter electrode
13: Collector electrode
14: Contact opening portion
16: Resistance component
17: Hole flow
18: Boron ion implantation
19: Arsenic ion implantation
21: N-type drain layer
23: Drain electrode
24: Source electrode
26: P-type well layer
28: P-type high concentration layer

The invention claimed is:

1. A method of manufacturing a semiconductor device comprising:
a first process of implanting second conductivity type impurity ions in a first principal plane of a semiconductor substrate with such a range that a contact layer is shallower than a base layer included in the semiconductor device in order to form the contact layer included in the semiconductor device;
a second process of implanting first conductivity type impurity ions in the first principal plane with such a range that a source layer is shallower than the contact layer in order to form the source layer included in the semiconductor device after the first process; and
a third process of implanting second conductivity type impurity ions in the first principal plane with such a range that a counter layer is deeper than the source layer and shallower than the base layer at a dose which is equal to or larger than 10% of a dose of the ion implantation of the first process in order to form the counter layer included in the semiconductor device after the second process, wherein the semiconductor device comprises:
a drift layer which includes a first conductivity type semiconductor substrate;
a second conductivity type base layer which is selectively formed on a surface of a first principal plane of the semiconductor substrate;
a first conductivity type source layer which is selectively formed on a surface of the base layer;
a second conductivity type contact layer which is formed to be in contact with the source layer on the first principal plane side of the base layer and which has a concentration higher than that of the base layer;
a gate electrode which is formed so as to face the drift layer, the base layer, and the source layer through an insulating film;
an emitter electrode which is formed on the first principal plane so as to be electrically connected to the source layer; and
an interlayer insulating film which is formed on the first principal plane of the semiconductor substrate to be interposed between the gate electrode and the emitter electrode so as to insulate the gate electrode and the emitter electrode,
wherein the semiconductor device further includes a second conductivity type counter layer which is formed to be in contact with the source layer and to overlap the contact layer and which is formed to be shallower than the base layer and to have a high concentration, and
wherein a total doping amount per unit area of the counter layer is larger than 10% of a total doping amount per unit area of the contact layer, and
wherein a sum of the total doping amount per unit area of the counter layer and the total doping amount per unit area of the contact layer is larger than that of the source layer.

2. The method according to claim 1, wherein the dose of ion implantation of the third process is larger than that of the first process.

3. The method according to claim 1, wherein a sum of the dose of ion implantation of the first process and the dose of ion implantation of the third process is larger than that of the second process.

4. The method according to claim 3, wherein the dose of ion implantation of the third process is larger than that of the second process.

5. The method according to claim 1, wherein the ion implantation of the third process is performed by using the interlayer insulating film, where an opening portion is selectively formed, as a mask.

6. The method according to claim 2, wherein a sum of the dose of ion implantation of the first process and the dose of ion implantation of the third process is larger than that of the second process.

7. The method according to claim 6, wherein the dose of ion implantation of the third process is larger than that of the second process.

* * * * *